US012776469B2

(12) United States Patent
Schaedler

(10) Patent No.: US 12,776,469 B2
(45) Date of Patent: Oct. 27, 2026

(54) OPERATING A PARTICLE BEAM APPARATUS

(71) Applicant: Carl Zeiss Microscopy GmbH, Jena (DE)

(72) Inventor: Sebastian Schaedler, Oberkochen (DE)

(73) Assignee: Carl Zeiss Microscopy, GmbH, Jena (DE)

( * ) Notice: Subject to any disclaimer, the term of this patent is extended or adjusted under 35 U.S.C. 154(b) by 335 days.

(21) Appl. No.: 18/509,372

(22) Filed: Nov. 15, 2023

(65) Prior Publication Data

US 2024/0274397 A1 Aug. 15, 2024

(30) Foreign Application Priority Data

Nov. 23, 2022 (DE) ..................... 10 2022 130 985.1

(51) Int. Cl.
*H01J 37/147* (2006.01)
*H01J 37/302* (2006.01)
*H01J 37/305* (2006.01)

(52) U.S. Cl.
CPC ...... *H01J 37/1474* (2013.01); *H01J 37/3023* (2013.01); *H01J 37/3053* (2013.01)

(58) Field of Classification Search
CPC . H01J 37/1474; H01J 37/3023; H01J 37/3053
See application file for complete search history.

(56) References Cited

U.S. PATENT DOCUMENTS 9,685,300 B2 6/2017 Biberger et al.
2004/0036031 A1 2/2004 Rose et al.
2006/0186336 A1 8/2006 Giannuzzi et al.
2008/0224039 A1 9/2008 Nakamura et al.
2012/0228516 A1 9/2012 Ozawa
2015/0048248 A1 2/2015 Biberger et al.
2018/0269026 A1 9/2018 Hoque et al.

FOREIGN PATENT DOCUMENTS

DE 11 2008 000 170 T5 11/2009
DE 10 2013 216 857 A1 2/2015
DE 11 2015 006 822 T5 5/2018
WO WO 02/067286 A2 8/2002

OTHER PUBLICATIONS

German Office Action for Application No. 10 2022 130 985.1, Dated Aug. 30, 2023.

*Primary Examiner* — Georgia Y Epps
*Assistant Examiner* — Hanway Chang
(74) *Attorney, Agent, or Firm* — Westborough IP Group, LLC

(57) ABSTRACT

Operating a particle beam apparatus includes processing, imaging, and/or analyzing an object. When guiding the particle beam along first dwell regions of a first scan line, the particle beam remains at each of the first dwell regions for a first dwell time. When guiding the particle beam along second dwell regions of a second scan line, the particle beam remains at each of the second dwell regions for a second dwell time. The first dwell time is shorter than the second dwell time. Alternatively, a first region of the first dwell regions has a first spacing with respect to a closest arranged adjacent second region of the first dwell regions. A first region of the second dwell regions has a second spacing with respect to a closest arranged adjacent second region of the second dwell regions. The second spacing is smaller than the first spacing.

25 Claims, 13 Drawing Sheets

OPERATING A PARTICLE BEAM APPARATUS

CROSS-REFERENCE TO RELATED APPLICATIONS

This application claims the priority of the German patent application no. 10 2022 130 985.1, filed on Nov. 23, 2022, which is incorporated herein by reference.

TECHNICAL FIELD

This application relates to operating a particle beam apparatus and more particularly to processing, imaging, and/or analyzing an object using a particle beam apparatus in an automated, partly automated, or manual fashion.

BACKGROUND

Electron beam apparatuses, in particular a scanning electron microscope (also referred to as SEM below) and/or a transmission electron microscope (also referred to as TEM below), are used to examine objects (samples) in order to gain knowledge about the properties and the behavior under certain conditions.

In an SEM, an electron beam (also referred to as primary electron beam below) is generated using a beam generator and focused on an object to be examined by way of a beam guiding system. The primary electron beam is guided in a raster manner over a surface of the object to be examined using a deflection device. In the process, the electrons of the primary electron beam interact with the object to be examined. As a consequence of the interaction, in particular, electrons are emitted by the object (so-called secondary electrons) and/or electrons of the primary electron beam are back scattered (so-called backscattered electrons). The secondary electrons and/or backscattered electrons are detected and used for image generation. An image representation of the object to be examined is thus obtained. Moreover, electrons of the primary electron beam can also be transmitted through the object and detected. Further, interaction radiation, for example x-ray radiation and cathodoluminescent light, can be generated as a consequence of the interaction. In particular, the interaction radiation is used to analyze the object.

In the case of a TEM, a primary electron beam is likewise generated using a beam generator and focused on an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged on a luminescent screen or on a detector (for example a camera) by a system consisting of an objective and a projection unit. Here, imaging can also take place in the scanning mode of a TEM. Such a TEM is usually referred to as STEM. Additionally, the use of a further detector to detect electrons backscattered at the object to be examined and/or secondary electrons emitted by the object to be examined may be provided for, in order to image an object to be examined.

Further, the prior art discloses the use of combination apparatuses for examining objects, in which both electrons and ions can be guided onto an object to be examined. By way of example, it is known to additionally equip an SEM with an ion beam column. An ion beam generator arranged in the ion beam column is used to generate ions that are used for the preparation of an object (for example ablating material of the object or applying material to the object) or else for imaging. The SEM serves here in particular for observing the preparation, but also for further examination of the prepared or unprepared object.

In a further known particle beam apparatus, material is applied to the object using the feed of a gas, for example. The known particle beam apparatus is a combination apparatus that provides both an electron beam and an ion beam. The particle beam apparatus includes an electron beam column and an ion beam column. The electron beam column provides an electron beam that is focused on an object. The object is arranged in a sample chamber kept under vacuum. The ion beam column provides an ion beam that is likewise focused on the object. By way of example, a layer of the surface of the object is removed using the ion beam. A further surface of the object is exposed once the layer has been removed. A precursor can be admitted into the sample chamber using a gas feed device. It is known to form the gas feed device with an acicular device, which can be arranged quite close to a position of the object at a distance of up to a few hundred μm, such that the precursor can be guided to the position of the object as accurately as possible and with a high concentration. A layer of a substance is deposited on the surface of the object as a result of the interaction of the ion beam with the precursor. By way of example, it is known for gaseous phenanthrene to be admitted as precursor into the sample chamber using the gas feed device. Essentially a layer of carbon or a carbon-containing layer then deposits on the surface of the object. It is also known to use a precursor that includes metal in order to deposit a metal or a metal-containing layer on the surface of the object. However, the depositions are not limited to carbon and/or metals. Rather, any desired substances can be deposited on the surface of the object, for example conductors, semiconductors, insulators or other compounds. Further, it is known for the precursor to be used for ablating material of the object upon interaction with a particle beam.

The application of material to the object and/or the ablation of material from the object is used for arranging a marking on the object, for example. In the prior art, the marking is used for example to position the electron beam and/or the ion beam.

The prior art discloses atom probe tomography, which is a quantitative analyzing method for determining the distribution of elements in an object. In atom probe tomography, an object is examined which has a tip with a tip radius of the order of 10 nm to 100 nm, for example. An electric field with a voltage whose field strength does not suffice to bring about a detachment of atoms from the tip is applied to the tip. Now a short voltage pulse is applied to the tip in addition to the aforementioned voltage to cause an increase in the field strength, the latter then being sufficient to detach individual ions at the tip by field evaporation. The use of a short laser pulse as an alternative to the short voltage pulse is also known. An atom that has been detached as an ion is steered to a position-sensitive detector by the electric field. Since the time of the voltage pulse or the laser pulse is known, the time at which the ion was detached from the tip is also known. A time of flight of the ion from the tip to the position-sensitive detector, which is to be determined, then can be used to determine the mass of the ion, more precisely the ratio of mass to charge number of the ion. The x- and y-position of the atom at the tip can be ascertained from the location of incidence of the ion on the position-sensitive detector. The z-position of the atom in the tip is ascertained using knowledge about the evaporation sequence carried out. Expressed differently, ions striking the position-sensitive detector at a later time are arranged further within the tip than ions striking the position-sensitive detector at an earlier time.

By way of example, the object with the tip may have been produced electrochemically. It is also known to produce the object with the tip using a laser apparatus and/or in a combination apparatus that includes an electron beam column and an ion beam column. In particular, the provision is made for the tip of the object to be produced by ablating material from the object using an ion beam. Imaging with the electron beam is used to observe the ablation of the material. In this case, the tip should have a region of interest which is intended to be analyzed in more detail using atom probe tomography. By way of example, the region of interest is a precipitate, a pore, an impurity phase, an interface, or a defect of a component.

When the tip of the object is produced using the ion beam, a material piece of the object is uncovered from the object using the ion beam. Then, the material piece can optionally be separated from the object using the ion beam and fastened to an object holder. The tip is produced from the material piece of the object by using the ion beam to ablate material. The production of a tip using an ion beam is very accurate. For example, it is known that, to produce the tip, the ion beam is guided around a region of interest along a plurality of substantially concentric circles. The plurality of circles are arranged around the region of interest, with the region of interest including the midpoint of the substantially concentric circles. The ion beam is successively guided along the circles from circle to circle in order to produce the tip.

A first circle of the plurality of substantially concentric circles has a first diameter. Further, a second circle has a second diameter. The first diameter is larger than the second diameter. Hence, the first circle is further away from the region of interest than the second circle. In the known method, the ion beam is guided initially along the first circle and subsequently along the second circle. Expressed differently, the known method provides for the ion beam to be guided successively over the circles, with the diameter of the circles becoming smaller as the method progresses.

The circles used in the known method have dwell regions in the form of scan points, at which the ion beam is focused. The dwell time of the ion beam on each scan point is the same. Further, a first scan point has a constant spacing from a second scan point of each circle, with the second scan point being arranged closest and directly adjacent to the first scan point.

It was found that the ion beam is faster at exposing a second circle, which has a smaller diameter than the first circle, than the first circle. The exposure of a circle becomes shorter, the closer the circle is arranged to the region of interest. As a consequence, the circle arranged closest to the region of interest is exposed faster by the ion beam than an exposure along all other circles. However, the guiding of the ion beam along the circle arranged closest to the region of interest is more or less the final preparation of the tip. Since the guiding of the ion beam along the circle arranged closest to the region of interest is provided relatively quickly, it is difficult to closely observe the last preparation step and intervene where necessary, in order to counter a possible destruction of a tip to be created by manually terminating the method and/or implement further settings of the ion beam which are possibly desired (for example, refocusing the ion beam on the region of interest).

With regard to the prior art, reference is also made to US 2006/0186336 A1 and U.S. Pat. No. 9,685,300 B2.

SUMMARY OF THE INVENTION

The system described herein provides a method for operating a particle beam apparatus and a computer program product and also a particle beam apparatus, so that close observation of a method step, in particular a last method step, is achievable, with the result that there is the option of altering and/or stopping a performed method when necessary.

The method according to the system described herein serves to operate a particle beam apparatus and is designed for example as a method for processing, imaging, and/or analyzing an object using a particle beam apparatus. By way of example, the method according to the system described herein serves to produce a tip as described above. In particular, the particle beam apparatus includes at least one beam generator for generating a particle beam that includes charged particles. The charged particles are electrons or ions, for example. The particle beam apparatus for example includes at least one objective lens for focusing the particle beam on the object. Further, the particle beam apparatus in particular includes at least one detector for detecting interaction particles and/or interaction radiation which emerge/emerges from an interaction between the particle beam and the object when the particle beam is incident on the object.

In the method according to the system described herein, a region of interest of the object arranged at or in the object is determined using a control device of the particle beam apparatus. Expressed differently, the position of the region of interest is determined (that is to say identified and/or chosen) in or at the object. By way of example, the region of interest is a precipitate in the material of the object, a pore in the material of the object, an impurity phase in the material of the object, an interface in the material of the object, or a defect in the material of the object. Examples of how the region of interest of the object is determined using the control device are explained in more detail below. The determined region of interest is also referred to herein as determined region.

The method according to the system described herein also includes a determination of a scanned region of the object using the control device of the particle beam apparatus. The scanned region includes the determined region. In other words, the scanned region includes the determined region. In particular, provision is made for the determined region to be located within the scanned region. Expressed yet again differently, the determined region is a portion of the scanned region. The particle beam of the particle beam apparatus is guidable within the scanned region and/or along the scanned region. By way of example, the particle beam is guided in a raster manner over a surface of the scanned region using a deflection device of the particle beam apparatus. For example, the deflection device is in the form of a scanning device.

The scanned region has at least one first scan line and at least one second scan line, with the first scan line forming a first geometric shape and the second scan line forming a second geometric shape. For example, each of the aforementioned scan lines can have a straight, curved, and/or bent form. However, the invention is not restricted to such a form of the aforementioned scan lines. Rather, any scan line which is suitable for the invention can be used as a scan line. For example, at least one of the scan lines can have a circular or polygonal form. The first scan line has first dwell regions for the particle beam of the particle beam apparatus. Further, the second scan line has second dwell regions for the particle beam of the particle beam apparatus. A dwell region is a region on which the particle beam of the particle beam apparatus can be focused. The geometric shape of the dwell region can be suitably chosen. For example, the dwell region is in the form of a point, a line, and/or a circle. However, the invention is not restricted thereto. Rather, each dwell region may have any geometric shape that is suitable for the invention. The system described herein further provides for each dwell region of the second dwell regions of the second scan line to be arranged closer to the determined region than each dwell region of the first dwell regions of the first scan line. In other words, the second scan line is arranged closer to the determined region than the first scan line. Expressed yet again differently, the first scan line is arranged further away from the determined region than the second scan line.

The method according to the system described herein also includes a guiding of the particle beam along the first scan line and hence along the first dwell regions using the particle beam apparatus. By way of example, the particle beam is guided along the first scan line using a deflection device, for example a scanning device. An embodiment of the method according to the system described herein provides for the particle beam to interact with the material of the object when the particle beam is guided along the first scan line, the interaction being such that first interaction particles and/or first interaction radiation arise/arises. The first interaction particles and/or the first interaction radiation are/is detected using the detector in this embodiment, for example.

The method according to the system described herein further includes a guiding of the particle beam along the second scan line and hence along the second dwell regions using the particle beam apparatus. By way of example, the particle beam is guided along the second scan line using the deflection device, for example the scanning device. An embodiment of the method according to the system described herein provides for the particle beam to interact with the material of the object when the particle beam is guided along the second scan line, the interaction being such that second interaction particles and/or second interaction radiation arise/arises. The second interaction particles and/or the second interaction radiation are/is detected using the detector in this embodiment, for example.

The object is processed using the particle beam in an embodiment of the method according to the system described herein. In particular, material is ablated from the object and/or material is applied to the object. In addition or in an alternative thereto, the object is imaged and/or analyzed using the detected first interaction particles, the detected first interaction radiation, the detected second interaction particles, and/or the detected second interaction radiation.

The method according to the system described herein provides for the particle beam to remain a first dwell time at each of the first dwell regions when the guiding of the particle beam along the first dwell regions of the first scan line is provided, and for the particle beam to remain a second dwell time at each of the second dwell regions when the guiding of the particle beam along the second dwell regions of the second scan line is provided, with the first dwell time being chosen to be shorter than the second dwell time using the control device. For example, the first dwell time can be chosen to be so much shorter than the second dwell time that the guiding of the particle beam along the first scan line and the guiding of the particle beam along the second scan line take the same time or take substantially the same time. In other words, the guiding of the particle beam along the first scan line is provided over a first time period. Further, the guiding of the particle beam along the second scan line is provided over a second time period. The first time period and the second time period are the same or substantially the same. In a further embodiment of the system described herein, the first dwell time and the second dwell time are chosen such that the first time period is shorter than the second time period. For example, the first time period being shorter than the second time period ensures that, in a final method step, the particle beam is guided along the scan line arranged closest to the region of interest at a speed which allows the method step to be observed closely and an intervention where necessary (in particular by a manual termination of the method), for example in order to avoid a possible destruction of a tip to be created and/or to implement further settings of the particle beam which are possibly desired (for example a renewed focusing of the particle beam on the region of interest).

In addition or in an alternative, the method according to the system described herein provides for a first region of the first dwell regions to be chosen when the guiding of the particle beam along the first dwell regions of the first scan line is provided, in such a way that the first region of the first dwell regions has a first spacing with respect to a closest arranged adjacent second region of the first dwell regions, and for a first region of the second dwell regions to be chosen when the guiding of the particle beam along the second dwell regions is provided, in such a way that the first region of the second dwell regions has a second spacing with respect to a closest arranged adjacent second region of the second dwell regions. The second spacing is smaller than the first spacing. This embodiment also has the aforementioned advantages. Both above and below, the spacing of a first region of a dwell region with respect to a closest arranged second region of the dwell region is understood to mean the length of the shortest straight line between a first point of the first region and a second point of the second region.

As yet a further addition or alternative, the method according to the system described herein provides that the guiding of the particle beam along the first scan line and/or the second scan line is provided only after clearance has been given by a user and/or by the control device of the particle beam apparatus. This embodiment of the system described herein provides a very good option for monitoring and/or controlling the method. This embodiment of the system described herein therefore also allows a close observation of a method step, in particular a last method step, with the result that there is the option of modifying and/or terminating the performed method when necessary.

In an embodiment of the method according to the system described herein, provision is additionally or alternatively made for the particle beam to be guided initially along the first scan line and then subsequently along the second scan line. In other words, the particle beam is guided inward from the outside, in the direction of the determined region. In addition or in an alternative thereto, provision is made for the particle beam to be guided initially along the second scan line and then subsequently along the first scan line. In other words, the particle beam is guided from the inside out in an opposite direction to the determined region (i.e., away from the determined region).

A further method according to the system described herein also serves to operate a particle beam apparatus and is designed for example as a method for processing, imaging, and/or analyzing an object using a particle beam apparatus. By way of example, the further method according to the system described herein also serves the production of a tip. In particular, the particle beam apparatus includes at least one beam generator for generating a particle beam that includes charged particles. The charged particles are electrons or ions, for example. The particle beam apparatus for example includes at least one objective lens for focusing the particle beam on the object. Further, the particle beam apparatus in particular includes at least one detector for detecting interaction particles and/or interaction radiation which emerge/emerges from an interaction between the particle beam and the object when the particle beam is incident on the object.

In the further method according to the system described herein, a region of interest of the object arranged at or in the object is determined using a control device of the particle beam apparatus. Expressed differently, the position of the region of interest is determined (that is to say identified and/or chosen) in or at the object. By way of example, the region of interest is a precipitate in the material of the object, a pore in the material of the object, an impurity phase in the material of the object, an interface in the material of the object, or a defect in the material of the object. Examples of how the region of interest of the object is determined using the control device are explained in more detail further below. The determined region of interest is also called herein the determined region.

The further method according to the system described herein also includes a determination of a scanned region of the object using the control device of the particle beam apparatus. The scanned region includes the determined region. In other words, the scanned region includes the determined region. In particular, provision is made for the determined region to be located within the scanned region. Expressed yet again differently, the determined region is a portion of the scanned region. The particle beam of the particle beam apparatus is guidable within the scanned region and/or along the scanned region. By way of example, the particle beam is guided in a raster manner over a surface of the scanned region using a deflection device of the particle beam apparatus. For example, the deflection device is in the form of a scanning device.

The scanned region has at least one first scan line, at least one second scan line, and at least one third scan line. The first scan line forms a first geometric shape. Further, the second scan line forms a second geometric shape. The third scan line forms a third geometric shape. For example, each of the aforementioned scan lines can have a straight, curved, and/or bent form. However, the invention is not restricted to such a form of the aforementioned scan lines. Rather, any scan line which is suitable for the invention can be used as a scan line. For example, at least one of the scan lines can have a circular or polygonal form. The first scan line has first dwell regions for the particle beam of the particle beam apparatus. Further, the second scan line has second dwell regions for the particle beam of the particle beam apparatus. The third scan line has third dwell regions for the particle beam of the particle beam apparatus. A dwell region is a region on which the particle beam of the particle beam apparatus can be focused. The geometric shape of the dwell region can be suitably chosen. For example, the dwell region is in the form of a point, a line, and/or a circle. However, the invention is not restricted thereto. Rather, each dwell region may have any geometric shape that is suitable for the invention. The system described herein further provides for each dwell region of the third dwell regions of the third scan line to be arranged closer to the determined region than each dwell region of the second dwell regions of the second scan line. In other words, the third scan line is arranged closer to the determined region than the second scan line. Expressed yet again differently, the second scan line is arranged further away from the determined region than the third scan line. The system described herein further provides for each dwell region of the second dwell regions of the second scan line to be arranged closer to the determined region than each dwell region of the first dwell regions of the first scan line. In other words, the second scan line is arranged closer to the determined region than the first scan line. Expressed yet again differently, the first scan line is arranged further away from the determined region than the second scan line.

The further method according to the system described herein also includes a guiding of the particle beam along the first scan line and hence along the first dwell regions using the particle beam apparatus. By way of example, the particle beam is guided along the first scan line using a deflection device, for example a scanning device. In an embodiment of the further method according to the system described herein, provision is made for the particle beam to interact with the material of the object when the guiding of the particle beam along the first scan line is provided, the interaction being such that first interaction particles and/or a first interaction radiation arise/arises. The first interaction particles and/or the first interaction radiation are/is detected using the detector in this embodiment, for example.

The further method according to the system described herein further includes a guiding of the particle beam along the second scan line and hence along the second dwell regions using the particle beam apparatus. By way of example, the particle beam is guided along the second scan line using the deflection device, for example the scanning device. In an embodiment of the further method according to the system described herein, provision is made for the particle beam to interact with the material of the object when the guiding of the particle beam along the second scan line is provided, the interaction being such that second interaction particles and/or a second interaction radiation arise/arises. The second interaction particles and/or the second interaction radiation are/is detected using the detector in this embodiment, for example.

The further method according to the system described herein also includes a guiding of the particle beam along the third scan line and hence along the third dwell regions using the particle beam apparatus. By way of example, the particle beam is guided along the third scan line using the deflection device, for example the scanning device. In an embodiment of the method according to the system described herein, provision is made for the particle beam to interact with the material of the object when the guiding of the particle beam along the third scan line is provided, the interaction being such that third interaction particles and/or a third interaction radiation arise/arises. The third interaction particles and/or the third interaction radiation are/is detected using the detector in this embodiment, for example.

In the further method according to the system described herein, the object is processed using the particle beam in one embodiment. For example, a tip is produced. In particular, material is applied to the object or material is ablated from the object. In addition or in an alternative thereto, the object is imaged and/or analyzed using the detected first interaction particles, the detected first interaction radiation, the detected second interaction particles, the detected second interaction radiation, the detected third interaction particles, and/or the detected third interaction radiation.

In the further method according to the system described herein, provision is made for the particle beam to be initially guided along the first scan line and remain a first dwell time at each of the first dwell regions. Subsequently, the particle beam is guided along the second scan line and remains a second dwell time at each of the second dwell regions. Following that, the particle beam is guided along the third scan line and remains a third dwell time at each of the third dwell regions. The first dwell time, the second dwell time, and the third dwell time are chosen to be identical, more particularly constant, using the control device. In other words, the first dwell time, the second dwell time, and the third dwell time are identical or substantially identical. The guiding of the particle beam along the second scan line is provided after or upon the elapse of a first time interval that follows the guiding of the particle beam along the first scan line, with the first time interval being specified by the control device. The guiding of the particle beam along the third scan line is provided after or upon the elapse of a second time interval that follows the guiding of the particle beam along the second scan line, with the second time interval being specified by the control device. The first time interval is shorter than the second time interval. The first time interval and/or the second time interval lie/lies for example in the range from 1 ns to 5 s, in particular in the range between 500 ns and 1 s. The range limits are contained in the aforementioned ranges. The system described herein ensures that a waiting time (i.e., one of the aforementioned time intervals) between the guiding of the particle beam along one of the scan lines and the guiding of the particle beam along a further one of the scan lines increases in the direction of the determined region. By way of example, this case also ensures that a final method step is closely observable. Hence there is the option of intervening when necessary (for example by manually terminating the method), in order for example to avoid a possible destruction of a tip to be created and/or implement further settings of the particle beam which are possibly desired (for example a renewed focusing of the particle beam on the region of interest). By way of example, provision is made for the particle beam to be guided away from the object during at least one of the aforementioned time intervals. In other words, the particle beam is deflected in such a way that the particle beam no longer strikes the object. For example, the particle beam is guided to a beam stop unit. In addition or in an alternative thereto, provision is made for the particle beam to be guided during at least one of the aforementioned time intervals to a certain position of the object, which is used as a park position for the particle beam. In addition or in an alternative thereto, provision is made for the particle beam to be guided during at least one of the aforementioned time intervals along the scan line along which the particle beam was guided last.

In the further method according to the system described herein, provision is additionally or alternatively made for the particle beam to be initially guided along the third scan line and remain a third dwell time at each of the third dwell regions. Subsequently, the particle beam is guided along the second scan line and remains a second dwell time at each of the second dwell regions. Following that, the particle beam is guided along the first scan line and remains a first dwell time at each of the first dwell regions. The first dwell time, the second dwell time, and the third dwell time are chosen to be identical, more particularly constant, 25 using the control device. In other words, the first dwell time, the second dwell time, and the third dwell time are identical or substantially identical. The guiding of the particle beam along the second scan line is provided after or upon the elapse of a first time interval that follows the guiding of the particle beam along the third scan line, with the first time interval being specified by the control device. The guiding of the particle beam along the first scan line is provided after or upon the elapse of a second time interval that follows the guiding of the particle beam along the second scan line, with the second time interval being specified by the control device. The first time interval is longer than the second time interval. The first time interval and/or the second time interval lie/lies for example in the range from 1 ns to 5 s, in particular in the range between 500 ns and 1 s. The range limits are contained in the aforementioned ranges, which ensures that a waiting time (i.e., one of the aforementioned time intervals) between the guiding of the particle beam along one of the scan lines and the guiding of the particle beam along a further one of the scan lines decreases in an opposite direction to the determined region. By way of example, this case also ensures that a final method step is closely observable. Hence there is the option of intervening when necessary (for example by manually terminating the method), in order for example to avoid a possible destruction of a tip to be created and/or implement further settings of the particle beam which are possibly desired (for example a renewed focusing of the particle beam on the region of interest). By way of example, provision is made for the particle beam to be guided away from the object during at least one of the aforementioned time intervals. In other words, the particle beam is deflected in such a way that the particle beam no longer strikes the object. For example, the particle beam is guided on a beam stop unit. In addition or in an alternative thereto, provision is made for the particle beam to be guided during at least one of the aforementioned time intervals to a certain position of the object, which is used as a park position for the particle beam. In addition or in an alternative thereto, provision is made for the particle beam to be guided during at least one of the aforementioned time intervals along the scan line along which the particle beam was guided last.

In addition or in an alternative thereto, provision is made for the particle beam to be guided initially along the first scan line. Subsequently, the particle beam is guided along the second scan line, where following that the particle beam is guided along the third scan line. A first region of the first dwell regions is chosen such that the first region of the first dwell regions has a first spacing with respect to a closest arranged adjacent second region of the first dwell regions. A first region of the second dwell regions is chosen such that the first region of the second dwell regions has a second spacing with respect to a closest arranged adjacent second region of the second dwell regions. Further, a first region of the third dwell regions is chosen such that the first region of the third dwell regions has a third spacing with respect to a closest arranged adjacent second region of the third dwell regions. The first spacing, the second spacing, and the third spacing are chosen to be identical, more particularly constant, using the control device. In other words, the first spacing, the second spacing, and the third spacing are identical or substantially identical. With regard to the determination of the aforementioned spacings, reference is made to the explanations elsewhere herein, which also apply here. The guiding of the particle beam along the second scan line is provided after or upon the elapse of a first time interval that follows the guiding of the particle beam along the first scan line, with the first time interval being specified by the control device. The guiding of the particle beam along the third scan line is provided after or upon the elapse of a second time interval that follows the guiding of the particle beam along the second scan line, with the second time interval being specified by the control device. The first time interval is shorter than the second time interval. The first time interval and/or the second time interval lie/lies for example in the range from 1 ns to 5 s, in particular in the range between 500 ns and 1 s. The range limits are contained in the aforementioned ranges. The system described herein ensures that a waiting time (i.e., one of the aforementioned time intervals) between the guiding of the particle beam along one of the scan lines and the guiding of the particle beam along a further one of the scan lines increases in the direction of the determined region. By way of example, this case also ensures that a final method step is closely observable. Hence there is the option of intervening when necessary (for example by manually terminating the method), in order for example to avoid a possible destruction of a tip to be created and/or implement further settings of the particle beam which are possibly desired (for example a renewed focusing of the particle beam on the region of interest). By way of example, provision is made for the particle beam to be guided away from the object during at least one of the aforementioned time intervals. In other words, the particle beam is deflected in such a way that the particle beam no longer strikes the object. For example, the particle beam is guided on a beam stop unit. In addition or in an alternative thereto, provision is made for the particle beam to be guided during at least one of the aforementioned time intervals to a certain position of the object, which is used as a park position for the particle beam. In addition or in an alternative thereto, provision is made for the particle beam to be guided during at least one of the aforementioned time intervals along the scan line along which the particle beam was guided last.

In addition or in an alternative thereto, provision is made for the particle beam to be guided initially along the third scan line. Subsequently, the particle beam is guided along the second scan line, where following that the particle beam is guided along the first scan line. A first region of the first dwell regions is chosen such that the first region of the first dwell regions has a first spacing with respect to a closest arranged adjacent second region of the first dwell regions. A first region of the second dwell regions is chosen such that the first region of the second dwell regions has a second spacing with respect to a closest arranged adjacent second region of the second dwell regions. Further, a first region of the third dwell regions is chosen such that the first region of the third dwell regions has a third spacing with respect to a closest arranged adjacent second region of the third dwell regions. The first spacing, the second spacing, and the third spacing are chosen to be identical, more particularly constant, using the control device. In other words, the first spacing, the second spacing, and the third spacing are identical or substantially identical. With regard to the determination of the aforementioned spacings, reference is made to the explanations further hereinabove, which also apply here. The guiding of the particle beam along the second scan line is provided after or upon the elapse of a first time interval that follows the guiding of the particle beam along the third scan line, with the first time interval being specified by the control device. The guiding of the particle beam along the first scan line is provided after or upon the elapse of a second time interval that follows the guiding of the particle beam along the second scan line, with the second time interval being specified by the control device. The first time interval is longer than the second time interval. The first time interval and/or the second time interval lie/lies for example in the range from 1 ns to 5 s, in particular in the range between 500 ns and 1 s. The range limits are contained in the aforementioned ranges. The system described herein ensures that a waiting time (i.e., one of the aforementioned time intervals) between the guiding of the particle beam along one of the scan lines and the guiding of the particle beam along a further one of the scan lines decreases in an opposite direction to the determined region. By way of example, this case also ensures that a final method step is closely observable. Hence there is the option of intervening when necessary (for example by manually terminating the method), in order for example to avoid a possible destruction of a tip to be created and/or implement further settings of the particle beam which are possibly desired (for example a renewed focusing of the particle beam on the region of interest). By way of example, provision is made for the particle beam to be guided away from the object during at least one of the aforementioned time intervals. In other words, the particle beam is deflected in such a way that the particle beam no longer strikes the object. For example, the particle beam is guided on a beam stop unit. In addition or in an alternative thereto, provision is made for the particle beam to be guided during at least one of the aforementioned time intervals to a certain position of the object, which is used as a park position for the particle beam. In addition or in an alternative thereto, provision is made for the particle beam to be guided during at least one of the aforementioned time intervals along the scan line along which the particle beam was guided last.

In an embodiment of the methods according to the system described herein, provision is additionally or alternatively made that the guiding of the particle beam along the first scan line, the second scan line, and/or the third scan line is provided only after clearance has been given by a user and/or by the control device of the particle beam apparatus. In other words, the guiding of the particle beam along one of the scan lines is provided only once the guidance has been initiated by the user and/or the control device.

As mentioned above, a further embodiment of the methods according to the system described herein additionally or alternatively provides for the particle beam to be guided initially along the first scan line and then subsequently along the second scan line. In addition or in an alternative thereto, provision is made for the particle beam to be guided initially along the second scan line and then subsequently along the first scan line.

In yet a further embodiment of the methods according to the system described herein, provision is additionally or alternatively made for a center of the scanned region to be determined as the region of interest. In addition or in an alternative thereto, provision is made for a centroid of the scanned region to be determined as the region of interest. By way of example, the center of the scanned region simultaneously is a centroid of the scanned region. In particular, the centroid is a centroid of area. In addition or in an alternative thereto, provision is made for a midpoint of the scanned region to be determined as the region of interest.

In an embodiment of the methods according to the system described herein, provision is additionally or alternatively made for the region of interest to be determined using the control device of the particle beam apparatus by using specified data about the object and/or by using data of a model of the object. For example, this embodiment of the methods according to the system described herein is used if the structural build of the object is known or is approximately known. Then it is for example possible to accurately ascertain or approximately ascertain the position of the region of interest in or at the object. For example, the ascertained or suspected position of the region of interest is input into the control device.

In a further embodiment of the methods according to the system described herein, provision is additionally or alternatively made for the region of interest to be determined using the control device using a non-destructive examination. For example, the region of interest is determined using the control device by using an x-ray device, an ultrasound device, and/or a lock-in thermography device. In other words, the position of the region of interest in or at the object is determined.

In yet a further embodiment of the methods according to the system described herein, provision is additionally or alternatively made for a scan line forming a first circle to be used as the first scan line. In addition or in an alternative thereto, provision is made for a scan line forming a second circle to be used as the second scan line. For example, the first circle and the second circle are formed as concentric circles which have a common midpoint. In particular, the midpoint is the centroid of area of the scanned region. As yet a further addition or alternative thereto, provision is made for a scan line forming a first polygon to be used as the first scan line. Further, provision is additionally or alternatively thereto made for a scan line forming a second polygon to be used as the second scan line. For example, the first polygon and the second polygon have the same centroid of area, formed in particular by the centroid of area of the scanned region. In yet a further embodiment of the methods according to the system described herein, provision is additionally or alternatively made for a scan line forming a third circle, for example formed as a further concentric circle, to be used as the third scan line. Further, provision is additionally or alternatively made for a scan line forming a third polygon, for example having the same centroid of area as the first polygon and/or the second polygon, to be used as the third scan line. Explicit reference is made to the fact that each of the aforementioned scan lines is not restricted to the aforementioned geometric shapes. Rather, any geometric shape suitable for the invention can be used for at least one of the aforementioned scan lines.

In an embodiment of the methods according to the system described herein, provision is additionally or alternatively made for dwell regions in the form of a point, circle, or polygon to be used as the first dwell regions. In addition or in an alternative thereto, provision is made for dwell regions in the form of a point, circle, or polygon to be used as the second dwell regions. In a yet further addition or alternative thereto, provision is made for dwell regions in the form of a point, circle, or polygon to be used as the third dwell regions. Explicit reference is made to the fact that each of the aforementioned dwell regions is not restricted to the aforementioned geometric shapes. Rather, any geometric shape suitable for the invention can be used for at least one of the aforementioned dwell regions.

In a further embodiment of the methods according to the system described herein, provision is additionally or alternatively made for the first dwell regions to include dwell regions having a first region spacing from the determined region. In particular, all dwell regions of the first dwell regions have the first region spacing from the determined region. Further, the second dwell regions include dwell regions having a second region spacing from the determined region. In particular, all dwell regions of the second dwell regions have the second region spacing from the determined region. In addition or in an alternative thereto, provision is made for the third dwell regions to include dwell regions having a third region spacing from the determined region. In particular, all dwell regions of the third dwell regions have the third region spacing from the determined region. Further, provision is made for the first region spacing and the second region spacing to be chosen such that the first region spacing is greater than the second region spacing. In addition or in an alternative, provision is made for the third region spacing to be chosen such that the second region spacing is greater than the third region spacing. For example, if the first scan line is formed as a circle, provision is made for the first region spacing to be chosen such that the first region spacing forms the radius of the circle. Further, if the second scan line is formed as a circle, provision is for example made for the second region spacing to be chosen such that the second region spacing forms the radius of the circle. In addition or in an alternative thereto, if the third scan line is formed as a circle, provision is made for the third region spacing to be chosen such that the third region spacing forms the radius of the circle. In this context, both above and below, a region spacing is understood to mean for example a spacing of a dwell region from a centroid of area of the determined region.

In yet a further embodiment of the methods according to the system described herein, provision is additionally or alternatively made for an analysis regarding the object and/or an image of the object to be displayed on a display unit of the particle beam apparatus.

In yet a further embodiment of the methods according to the system described herein, provision is additionally or alternatively made for a dwell time, which lies in a range from 1 ns to 5 s, to be used as the first dwell time. In addition or in an alternative thereto, a dwell time, which lies in a range from 1 ns to 5 s, is used as the second dwell time. As yet a further addition or alternative thereto, a dwell time, which lies in a range from 1 ns to 5 s, is used as the third dwell time.

In an embodiment of the methods according to the system described herein, provision is additionally or alternatively made for a dwell time to be used as the second dwell time at each dwell region of the second dwell regions, to which the following applies:

$$t_2 = \frac{d_1}{d_2} \cdot t_1$$

where $t_1$ denotes the first dwell time at each dwell region of the first dwell regions, $t_2$ denotes the second dwell time at each dwell region of the second dwell regions, $d_1$ denotes a first diameter of the first geometric shape formed by the first scan line, and $d_2$ denotes a second diameter of the second geometric shape formed by the second scan line. In other words, a dwell time at each dwell region of any desired scan line can be determined as follows:

$$t_{n+1} = \frac{d_n}{d_{n+1}} \cdot t_n$$

where $t_n$ denotes the dwell time at each dwell region of the n-th scan line, $t_{n+1}$ denotes the dwell time at each dwell region of the (n+1)-th scan line, $d_n$ denotes a diameter of the geometric shape formed by the n-th scan line, and $d_{n+1}$ denotes a diameter of the geometric shape formed by the (n+1)-th scan line. Using the aforementioned formula, it is possible to determine the dwell times at the respective dwell regions of the respective scan lines such that the particle beam remains the same time in each scan line.

In a further embodiment of the methods according to the system described herein, provision is additionally or alternatively made for a dwell time to be used as the second dwell time at each dwell region of the second dwell regions, to which the following applies:

$$t_2 = \frac{IA_1}{IA_2} \cdot t_1$$

where $t_1$ denotes the first dwell time at each dwell region of the first dwell regions, $t_2$ denotes the second dwell time at each dwell region of the second dwell regions, $IA_1$ denotes a first internal spacing between two opposite sides of the first geometric shape formed by the first scan line, and $IA_2$ denotes a second internal spacing between two opposite sides of the second geometric shape formed by the second scan line. In other words, a dwell time at each dwell region of any desired scan line can be determined as follows:

$$t_{n+1} = \frac{IA_n}{IA_{n+1}} \cdot t_n$$

where $t_n$ denotes the dwell time at each dwell region of the n-th scan line, $t_{n+1}$ denotes the dwell time at each dwell region of the (n+1)-th scan line, $IA_n$ denotes an internal spacing between two opposite sides of the first geometric shape formed by the n-th scan line, and $IA_{n+1}$ denotes an internal spacing between two opposite sides of the geometric shape formed by the (n+1)-th scan line. Using the aforementioned formula, it is also possible to determine the dwell times at the respective dwell regions of the respective scan lines such that the particle beam remains the same time in each scan line.

In an embodiment of the method according to the system described herein, provision is additionally or alternatively made for a dwell time to be used as the second dwell time at each dwell region of the second dwell regions, to which the following applies:

$$t_2 = \frac{L_1}{L_2} \cdot t_1$$

where $t_1$ denotes the first dwell time at each dwell region of the first dwell regions, $t_2$ denotes the second dwell time at each dwell region of the second dwell regions, $L_1$ denotes a first length of the first geometric shape formed by the first scan line, and $L_2$ denotes a second length of the second geometric shape formed by the second scan line. In other words, a dwell time at each dwell region of any desired scan line can be determined as follows:

$$t_{n+1} = \frac{L_n}{L_{n+1}} \cdot t_n$$

where $t_n$ denotes the dwell time at each dwell region of the n-th scan line, $t_{n+1}$ denotes the dwell time at each dwell region of the (n+1)-th scan line, $L_n$ denotes a length of the geometric shape formed by the n-th scan line, and $L_{n+1}$ denotes a diameter of the geometric shape formed by the (n+1)-th scan line. Using the aforementioned formula, it is also possible to determine the dwell times at the respective dwell regions of the respective scan lines such that the particle beam remains the same time in each scan line.

In yet a further embodiment of the methods according to the system described herein, provision is additionally or alternatively made for a spacing to be used as the first spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is additionally or alternatively made for a spacing to be used as the second spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is made in a further addition or alternative for a spacing to be used as the third spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm.

In yet a further embodiment of the methods according to the system described herein, provision is additionally or alternatively made for the particle beam to be guided along the first scan line until the clearance for the guiding of the particle beam along the second scan line is given by the user and/or by the control device. In addition or in an alternative thereto, provision is made for the particle beam to be guided along the second scan line until the clearance for the guiding of the particle beam along the third scan line is given by the user and/or by the control device. As yet a further addition or alternative thereto, provision is made for the particle beam to be guided along the third scan line until the clearance for the guiding of the particle beam along the second scan line is given by the user and/or by the control device. As yet a further addition or alternative thereto, provision is made for the particle beam to be guided along the second scan line until the clearance for the guiding of the particle beam along the first scan line is given by the user and/or by the control device.

In an embodiment of the methods according to the system described herein, provision is additionally or alternatively made for the particle beam to be guided to a beam stop unit until the clearance for the guiding of the particle beam along the second scan line is given by the user and/or by the control device. In addition or in an alternative thereto, provision is made for the particle beam to be guided to a beam stop unit until the clearance for the guiding of the particle beam along the third scan line is given by the user and/or by the control device. As yet a further addition or alternative thereto, provision is made for the particle beam to be guided to a beam stop unit until the clearance for the guiding of the particle beam along the first scan line is given by the user and/or by the control device.

In a further embodiment of the methods according to the system described herein, provision is additionally or alternatively made for the second scan line to be defined with respect to the second geometric shape formed by the second scan line before the clearance for the guiding of the particle beam along the second scan line is given by the user and/or by the control device. In other words, the second geometric shape of the second scan line is defined. In addition or in an alternative thereto, provision is made for the first scan line to be defined with respect to the first geometric shape formed by the first scan line before the clearance for the guiding of the particle beam along the first scan line is given by the user and/or by the control device. In other words, the first geometric shape of the first scan line is defined. As yet a further addition or alternative thereto, provision is made for the third scan line to be defined with respect to the third geometric shape formed by the third scan line before the clearance for the guiding of the particle beam along the third scan line is given by the user and/or by the control device. In other words, the third geometric shape of the third scan line is defined.

In yet a further embodiment of the methods according to the system described herein, provision is additionally or alternatively made for the second scan line to be defined with respect to the diameter of the second geometric shape formed by the second scan line before the clearance for the guiding of the particle beam along the second scan line is given by the user and/or by the control device. In other words, the diameter of the second geometric shape of the second scan line is defined. In addition or in an alternative thereto, provision is made for the first scan line to be defined with respect to the diameter of the first geometric shape formed by the first scan line before the clearance for the guiding of the particle beam along the first scan line is given by the user and/or by the control device. In other words, the diameter of the first geometric shape of the first scan line is defined. As yet a further addition or alternative thereto, provision is made for the third scan line to be defined with respect to the diameter of the third geometric shape formed by the third scan line before the clearance for the guiding of the particle beam along the third scan line is given by the user and/or by the control device. In other words, the diameter of the third geometric shape of the third scan line is defined.

In yet a further embodiment of the methods according to the system described herein, provision is additionally or alternatively made for the second scan line to be defined with respect to the internal spacing between two sides of the second geometric shape formed by the second scan line before the clearance for the guiding of the particle beam along the second scan line is given by the user and/or by the control device. In other words, the internal spacing between two sides of the second geometric shape formed by the second scan line is defined. In addition or in an alternative thereto, provision is made for the first scan line to be defined with respect to the internal spacing between two sides of the first geometric shape formed by the first scan line before the clearance for the guiding of the particle beam along the first scan line is given by the user and/or by the control device. In other words, the internal spacing between two sides of the first geometric shape formed by the first scan line is defined. As yet a further addition or alternative thereto, provision is made for the third scan line to be defined with respect to the internal spacing between two sides of the third geometric shape formed by the third scan line before the clearance for the guiding of the particle beam along the third scan line is given by the user and/or by the control device. In other words, the internal spacing between two sides of the third geometric shape formed by the third scan line is defined.

In an embodiment of the methods according to the system described herein, provision is additionally or alternatively made for the second scan line to be defined with respect to the second spacing before the clearance for the guiding of the particle beam along the second scan line is given by the user and/or by the control device. In other words, the second spacing of a first region of the second dwell regions with respect to a closest arranged adjacent second region of the second dwell regions is defined. In addition or in an alternative thereto, provision is made for the first scan line to be defined with respect to the first spacing before the clearance for the guiding of the particle beam along the first scan line is given by the user and/or by the control device. In other words, the first spacing of a first region of the first dwell regions with respect to a closest arranged adjacent second region of the first dwell regions is defined. As yet a further addition or alternative thereto, provision is made for the third scan line to be defined with respect to the third spacing before the clearance for the guiding of the particle beam along the third scan line is given by the user and/or by the control device. In other words, the third spacing of a first region of the third dwell regions with respect to a closest arranged adjacent second region of the third dwell regions is defined.

In an embodiment of the methods according to the system described herein, provision is additionally or alternatively made for the particle beam apparatus to include an ion beam apparatus and for an ion beam of the ion beam apparatus to be used to ablate the material from the object and/or to apply material to the object and/or to analyze the object and/or to image the object. In addition or in an alternative thereto, provision is made for the particle beam apparatus to include an electron beam apparatus and for an electron beam of the electron beam apparatus to be used to ablate the material from the object and/or to analyze the object and/or to image the object.

Explicit reference is made to the fact that the invention is not restricted to the described sequence of the aforementioned method steps or method steps mentioned below. Rather, the method steps of the invention can be carried out in any suitable sequence and/or also in parallel with one another.

The system described herein also relates to a computer program product having a program code which is loadable or is loaded into a processor, in particular a processor of a particle beam apparatus, where the program code, when executed in the processor, controls a particle beam apparatus in such a way that a method having at least one of the aforementioned or following features or having a combination of at least two of the aforementioned or following features is carried out.

The system described herein also relates to a particle beam apparatus, designed in particular to process, observe, and/or analyze an object. The particle beam apparatus according to the system described herein is designed to carry out the methods according to the system described herein. Further, the particle beam apparatus according to the system described herein includes at least one control device for determining a region of interest of the object. In other words, the control device serves to determine the position of the region of interest in or at the object. By way of example, the region of interest is a precipitate in the material of the object, a pore in the material of the object, an impurity phase in the material of the object, an interface in the material of the object, or a defect in the material of the object. Moreover, the particle beam apparatus according to the system described herein includes at least one beam generator for generating a particle beam that includes charged particles. The charged particles are electrons or ions, for example. Further, the particle beam apparatus according to the system described herein includes at least one objective lens for focusing the particle beam on the object, at least one scanning device for scanning the particle beam over the object, in particular at least one detector for detecting interaction particles and/or interaction radiation arising from an interaction of the particle beam with the object, and in particular at least one display device for displaying an image and/or an analysis of the object. By way of example, as a consequence of the interaction, in particular, particles are emitted by the object (so-called secondary particles, in particular secondary electrons) and particles of the particle beam are backscattered (so-called backscattered particles, in particular backscattered electrons). The secondary particles and backscattered particles are for example detected and used for image generation. An image representation of the object to be examined is thus obtained. Further, interaction radiation, for example x-ray radiation and cathodoluminescent light, is generated as a consequence of the interaction. In particular, the interaction radiation is used to analyze the object.

The particle beam apparatus according to the system described herein also includes at least one processor in which a computer program product having at least one of the aforementioned or following features or having a combination of at least two of the aforementioned or following features is loaded.

In a further embodiment of the particle beam apparatus according to the system described herein, provision is additionally or alternatively made for the beam generator of the particle beam apparatus to be embodied as a first beam generator and for the particle beam to be in the form of a first particle beam that includes first charged particles. Further, the objective lens of the particle beam apparatus according to the system described herein is designed as a first objective lens for focusing the first particle beam on the object. Moreover, the particle beam apparatus according to the system described herein includes at least one second beam generator for generating a second particle beam that includes second charged particles. The second charged particles are ions or electrons, for example. Further, the particle beam apparatus according to the system described herein includes at least one second objective lens for focusing the second particle beam on the object.

In particular, provision is made for the particle beam apparatus according to the system described herein to be in the form of an electron beam apparatus and/or in the form of an ion beam apparatus.

BRIEF DESCRIPTION OF DRAWINGS

Further suitable or practical embodiments and advantages of the system described herein are described below in association with the drawings, in which.

DETAILED DESCRIPTION OF VARIOUS EMBODIMENTS

The system described herein is now explained in more detail using particle beam apparatuses in the form of an SEM and in the form of a combination apparatus that includes an electron beam column and an ion beam column. Express reference is made to the fact that the invention can be used in any particle beam apparatus, in particular in any electron beam apparatus and/or any ion beam apparatus.

Figure 1:
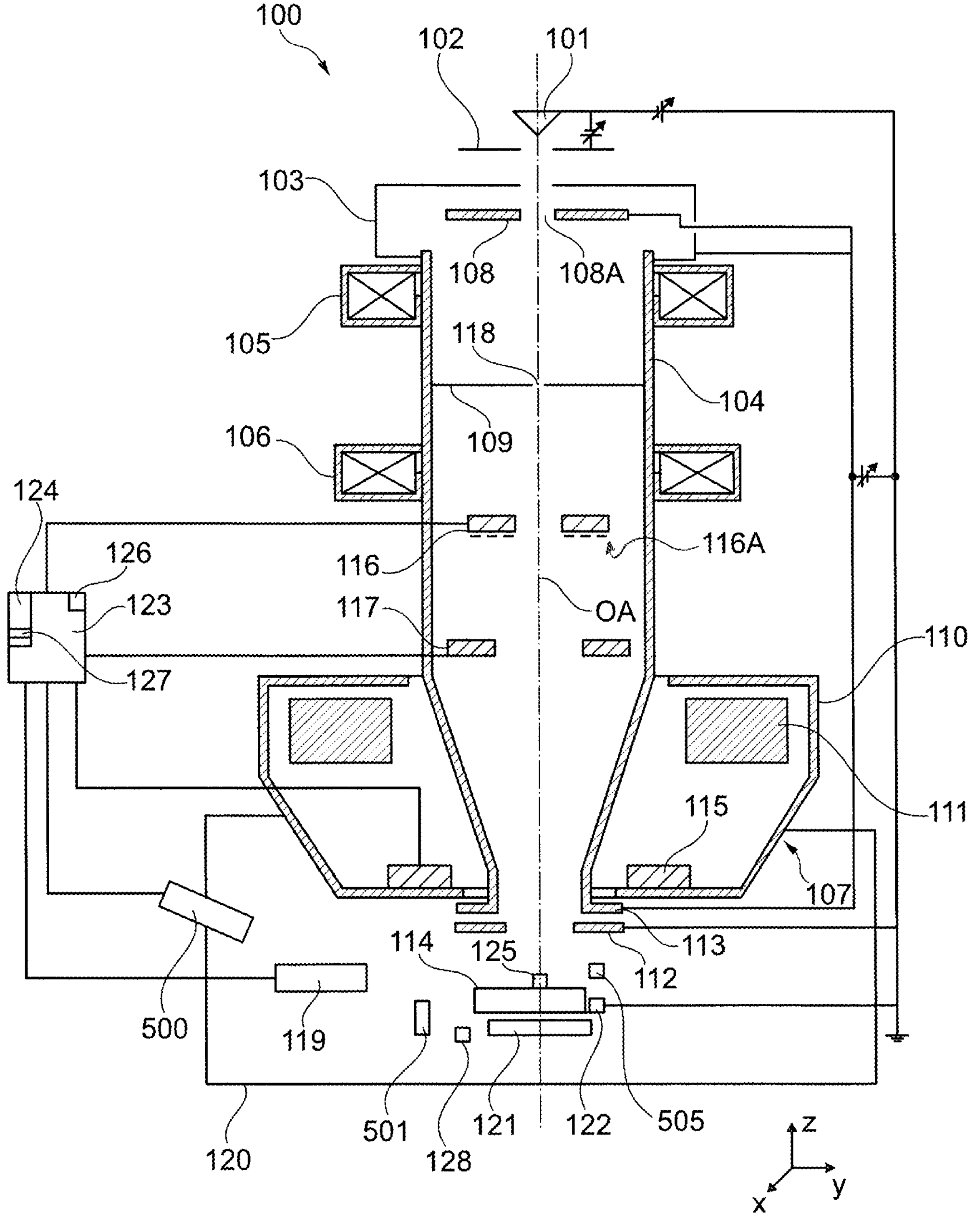
FIG. 1 shows a first embodiment of a particle beam apparatus according to the system described herein.

FIG. 1 shows a schematic illustration of an SEM 100. The SEM 100 includes a first beam generator in the form of an electron source 101, which is in the form of a cathode. The SEM 100 is also provided with an extraction electrode 102 and with an anode 103, which is arranged on one end of a beam guiding tube 104 of the SEM 100. For example, the electron source 101 is in the form of a thermal field emitter. However, the invention is not restricted to such an electron source 101. Rather, any electron source can be used.

Electrons emerging from the electron source 101 form a primary electron beam. The electrons are accelerated to anode potential due to a potential difference between the electron source 101 and the anode 103. In the embodiment presented in FIG. 1, the anode potential is 100 V to 35 kV, for example 5 kV to 15 kV, in particular 8 kV, relative to a ground potential of a housing of a sample chamber 120. However, alternatively the anode potential could also be at ground potential.

Two condenser lenses, namely a first condenser lens 105 and a second condenser lens 106, are arranged at the beam guiding tube 104. Here, proceeding from the electron source 101 as viewed in the direction of a first objective lens 107, the first condenser lens 105 comes first, followed by the second condenser lens 106. Reference is explicitly made to the fact that further embodiments of the SEM 100 may have only a single condenser lens. A first aperture unit 108 is arranged between the anode 103 and the first condenser lens 105. Together with the anode 103 and the beam guiding tube 104, the first aperture unit 108 is at a high-voltage potential, namely the potential of the anode 103, or connected to ground. The first aperture unit 108 has numerous first apertures 108A, one of which is depicted in FIG. 1. For example, two first apertures 108A are present. Each one of the numerous first apertures 108A has a different aperture diameter. Using an adjustment mechanism (not illustrated), it is possible to set a desired first aperture 108A onto an optical axis OA of the SEM 100. Reference is explicitly made to the fact that, in further embodiments, the first aperture unit 108 may be provided with only a single aperture 108A. An adjustment mechanism may not be provided in the embodiment of FIG. 1. The first aperture unit 108 then is of stationary design. A stationary second aperture unit 109 is arranged between the first condenser lens 105 and the second condenser lens 106. In an alternative thereto, provision is made for the second aperture unit 109 to be of movable design.

The first objective lens 107 has pole pieces 110, in which a drilled hole is formed. The beam guiding tube 104 is guided through the drilled hole. A coil 111 is arranged in the pole pieces 110.

An electrostatic retardation device is arranged in a lower region of the beam guiding tube 104. The electrostatic retardation device includes a single electrode 112 and a tube electrode 113. The tube electrode 113 is arranged at an end of the beam guiding tube 104 that faces an object 125 that is arranged at a movably designed object holder 114.

Together with the beam guiding tube 104, the tube electrode 113 is at the potential of the anode 103, while the single electrode 112 and the object 125 are at a lower potential than the potential of the anode 103. In the present case, the potential of the anode 103 is the ground potential of the housing of the sample chamber 120 so that the electrons of the primary electron beam can be decelerated to a desired energy which is required for examining the object 125.

The primary electron beam can be deflected and scanned over the object 125 using a scanning device 115 of the SEM 100 so that the electrons of the primary electron beam interact with the object 125. The interaction results in interaction particles, which are detected. In particular, electrons are emitted from the surface of the object 125—so-called secondary electrons—or electrons of the primary electron beam are backscattered—so-called backscattered electrons—as interaction particles.

The object 125 and the single electrode 112 can also be at different potentials and potentials that differ from ground to make it possible to set the location of the retardation of the primary electron beam in relation to the object 125. For example, if the retardation is carried out quite close to the object 125, imaging aberrations become smaller.

A detector arrangement that includes a first detector 116 and a second detector 117 is arranged in the beam guiding tube 104 to detect the secondary electrons and/or the backscattered electrons. Here, the first detector 116 is arranged at the source side along the optical axis OA, while the second detector 117 is arranged at the object side along the optical axis OA in the beam guiding tube 104. The first detector 116 and the second detector 117 are arranged offset from one another in the direction of the optical axis OA of the SEM 100. Both the first detector 116 and the second detector 117 have a respective passage opening, through which the primary electron beam can pass. The first detector 116 and the second detector 117 are approximately at the potential of the anode 103 and of the beam guiding tube 104. The optical axis OA of the SEM 100 runs through the respective passage openings.

The second detector 117 serves mainly for detection of secondary electrons. Upon emerging from the object 125, the secondary electrons initially have a low kinetic energy and random directions of movement. Using the strong extraction field emanating from the tube electrode 113, the secondary electrons are accelerated in the direction of the first objective lens 107. The secondary electrons enter the first objective lens 107 approximately in parallel. The beam diameter of the beam of the secondary electrons remains small even in the first objective lens 107. The first objective lens 107 then has a strong effect on the secondary electrons and generates a comparatively short focus of the secondary electrons with sufficiently steep angles with respect to the optical axis OA, with the result that the secondary electrons diverge far apart from one another downstream of the focus and strike the active area of the second detector 117. By contrast, only a small proportion of electrons that are backscattered at the object 125—that is to say backscattered electrons which have a relatively high kinetic energy in comparison with the secondary electrons upon emerging from the object 125—are detected by the second detector 117. The high kinetic energy and the angles of the backscattered electrons with respect to the optical axis OA upon emerging from the object 125 have the effect that a beam waist, which is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 can be additionally formed with an opposing field grid 116A. The opposing field grid 116A is arranged at the side of the first detector 116 directed toward the object 125. With respect to the potential of the beam guiding tube 104, the opposing field grid 116A has a negative potential such that only backscattered electrons with high energy pass through the opposing field grid 116A to the first detector 116. In addition or in an alternative, the second detector 117 includes a further opposing field grid, which is designed analogously to the aforementioned opposing field grid 116A of the first detector 116 and has a similar function.

The detection signals generated by the first detector 116 and the second detector 117 are used to produce an image or images of the surface of the object 125.

Express reference is made to the fact that the apertures of the first aperture unit 108 and the second aperture unit 109, as well as the passage openings of the first detector 116 and of the second detector 117, are illustrated in exaggerated fashion. The passage openings of the first detector 116 and the second detector 117 have an extent perpendicular to the optical axis OA ranging from 0.5 mm to 5 mm. For example, the passage openings are of circular design and have a diameter ranging from 1 mm to 3 mm perpendicular to the optical axis OA.

The second aperture unit 109 is configured as a pinhole stop in the embodiment illustrated in FIG. 1 and is provided with a second aperture 118 for the passage of the primary electron beam, which has an extent ranging from 5 μm to 500 μm, for example 35 μm. In an alternative thereto, a further embodiment provides for the second aperture unit 109 to be provided with a plurality of apertures, which can be displaced mechanically with respect to the primary electron beam or which can be reached by the primary electron beam using electrical and/or magnetic deflection elements. The second aperture unit 109 is in the form of a pressure stage stop, separating a first region, in which the electron source 101 is arranged and in which there is an ultra-high vacuum ($10^{-7}$ hPa to $10^{-12}$ hPa), from a second region, which has a high vacuum ($10^{-3}$ hPa to $10^{-7}$ hPa). The second region is the intermediate pressure region of the beam guiding tube 104, which leads to the sample chamber 120.

The sample chamber 120 is under vacuum. To generate the vacuum, a pump (not depicted) is arranged at the sample chamber 120. In the embodiment depicted in FIG. 1, the sample chamber 120 is operated in a first pressure range or in a second pressure range. The first pressure range includes only pressures less than or equal to $10^{-3}$ hPa, and the second pressure range includes only pressures greater than $10^{-3}$ hPa. To ensure the first and second pressure ranges, the sample chamber 120 is vacuum-sealed.

The object holder 114 is arranged at an object stage 122. The object stage 122 is designed to be movable in three directions arranged perpendicular to one another, namely in an x-direction (first stage axis), in a y-direction (second stage axis), and in a z-direction (third stage axis). Moreover, the object stage 122 can be rotated about two rotation axes arranged perpendicular to one another (stage rotation axes). The invention is not restricted to the aforementioned object stage 122. Rather, the object stage 122 may have further translational movement axes and rotation axes, along which or about which the object stage 122 can move.

The SEM 100 also includes a third detector 121, which is arranged in the sample chamber 120. More precisely, the third detector 121 is arranged downstream of the object stage 122, as viewed from the electron source 101 along the optical axis OA. The object stage 122, and hence the object holder 114, can be rotated in such a way that the primary electron beam can radiate through the object 125 arranged at the object holder 114. When the primary electron beam passes through the object 125 to be examined, the electrons of the primary electron beam interact with the material of the object 125 to be examined. The electrons passing through the object 125 to be examined are detected by the third detector 121.

A radiation detector 119 used to detect interaction radiation, for example x-ray radiation and/or cathodoluminescent light, is arranged in the sample chamber 120. The radiation detector 119, the first detector 116, and the second detector 117 are connected to a control device 123 that includes a monitor 124 and a processor 127. The third detector 121 is also connected to the control device 123, which is not depicted for reasons of clarity. In addition or in an alternative, a further detector in the form of a chamber detector 500, in particular for detecting secondary electrons, can be arranged in the sample chamber 120. The further detector is also connected to the control device 123. The control device 123 processes detection signals generated by the first detector 116, the second detector 117, the third detector 121, the radiation detector 119, and/or the chamber detector 500 and displays the detection signals in the form of images and/or analyses on the monitor 124.

The control device 123 also includes a database 126, in which data are stored and from which data are read out. Further, provision is made of a beam stop unit 505, to which the electron beam is guidable so that the electron beam is no longer steered onto the object 125.

A first heating and/or cooling device 128, which is used to cool and/or heat the object holder 114 and hence the object 125 in the object holder 114, is arranged at the object holder 114. For example, the object holder 114 is cooled to a temperature of −140° ° C. or less than −140° C. using liquid nitrogen or liquid helium. A temperature measuring unit (not depicted) is arranged in the sample chamber 120 for the purpose of determining a temperature of the object 125. For example, the temperature measuring unit is in the form of infrared measuring equipment or a semiconductor temperature sensor. However, the invention is not restricted to the use of such temperature measuring units. Rather, any temperature measuring unit which is suitable for the invention can be used as temperature measuring unit.

The SEM 100 also includes a mobile manipulator 501, which is only depicted schematically in FIG. 1. The manipulator 501 is designed to hold and/or move the object 125 or a part of the object 125.

Figure 2:
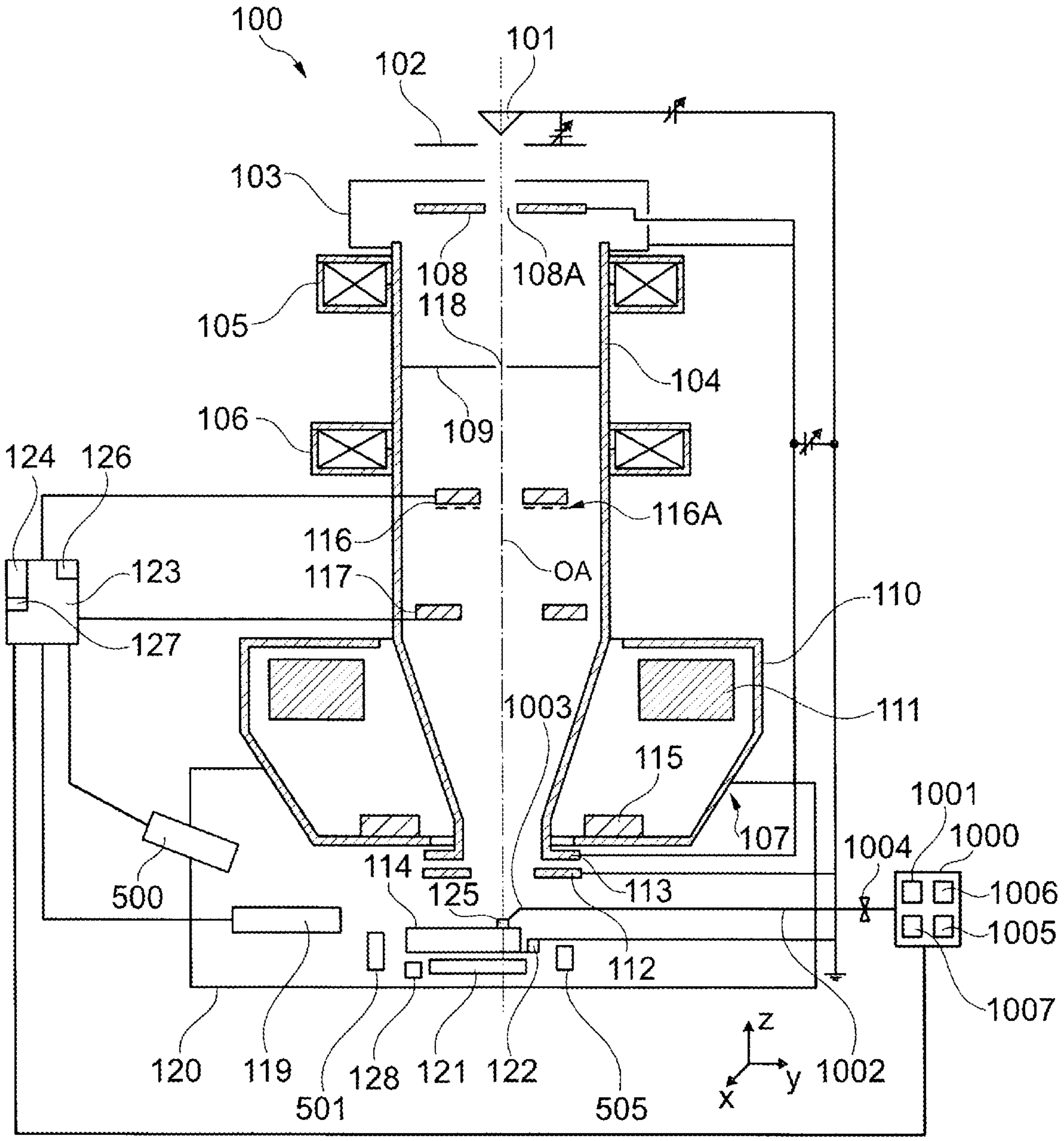
FIG. 2 shows a second embodiment of a particle beam apparatus according to the system described herein.

FIG. 2 shows a schematic illustration of a further SEM 100. The embodiment of FIG. 2 is based on the embodiment of FIG. 1. Identical components are provided with identical reference signs. In contrast to the embodiment of the SEM 100 according to FIG. 1, the SEM 100 according to FIG. 2 includes a gas feed device 1000. The gas feed device 1000 serves to feed a gaseous precursor to a specific position on the surface of the object 125. The gas feed device 1000 includes a precursor reservoir 1001. For example, the precursor is stored as a solid or liquid substance in the precursor reservoir 1001. To bring the precursor into the gaseous state, the precursor is evaporated or sublimated within the precursor reservoir 1001. For example, evaporating or sublimating the precursor within the precursor reservoir 1001 can be influenced by controlling the temperature of the precursor reservoir 1001 and/or the precursor. In an alternative thereto, the precursor is stored in the precursor reservoir 1001 as a gaseous substance. For example, a precursor that includes metal is used as precursor in order to deposit a metal or a metal-containing layer on the surface of the object 125. For example, an insulating material, in particular $SiO_2$, may also be deposited on the surface of the object 125. Further, provision is also made for the precursor to be used for removing material from the object 125 upon interaction with a particle beam.

The gas feed device 1000 is provided with a feed line 1002. In the direction of the object 125, the feed line 1002 includes an acicular and/or capillary device, for example in the form of a hollow tube 1003, which in particular can be brought into the vicinity of the surface of the object 125, for example to a distance of 10 μm to 1 mm from the surface of the object 125. The hollow tube 1003 has a feed opening, the diameter of which for example lies in the range from 10 μm to 1000 μm, in particular in the range from 100 μm to 600 μm. The feed line 1002 includes a valve 1004 for regulating the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125. When the valve 1004 is closed, the inflow of the gaseous precursor onto the surface of the object 125 is stopped.

The gas feed device 1000 is further provided with an adjusting unit 1005, which enables an adjustment of the position of the hollow tube 1003 in all 3 spatial directions—namely an x-direction, a y-direction, and a z-direction—and an adjustment of the orientation of the hollow tube 1003 using a rotation and/or a tilt. The gas feed device 1000 and hence also the adjustment unit 1005 are connected to the control device 123 of the SEM 100.

In further embodiments, the precursor reservoir 1001 is not arranged directly at the gas feed device 1000. Rather, in the further embodiments, provision is made for the precursor reservoir 1001 to be arranged for example on a wall of a room in which the SEM 100 is situated. As an alternative thereto, provision is made for the precursor reservoir 1001 to be arranged in a first room and for the SEM 100 to be arranged in a second room separate from the first room. In yet a further alternative thereto, provision is made for the precursor reservoir 1001 to be arranged in a cabinet device.

The gas feed device 1000 includes a temperature measuring unit 1006. For example, a resistance measuring device, a thermocouple, and/or a semiconductor temperature sensor are/is used as temperature measuring unit 1006. However, the invention is not restricted to the use of such temperature measuring units. Rather, any suitable temperature measuring unit which is suitable for the invention can be used as temperature measuring unit. In particular, provision can be made for the temperature measuring unit not to be arranged at the gas feed device 1000, but rather to be arranged for example at a distance from the gas feed device 1000.

The gas feed device 1000 further includes a temperature setting unit 1007. For example, the temperature setting unit 1007 is a heating device, in particular a conventional infrared heating device, a heating wire and/or a Peltier element. In an alternative thereto, the temperature setting unit 1007 is in the form of a heating and/or cooling device which includes a heating wire, for example. However, the invention is not restricted to the use of such a temperature setting unit 1007. Rather, any suitable temperature setting unit can be used for the invention.

Figure 3:
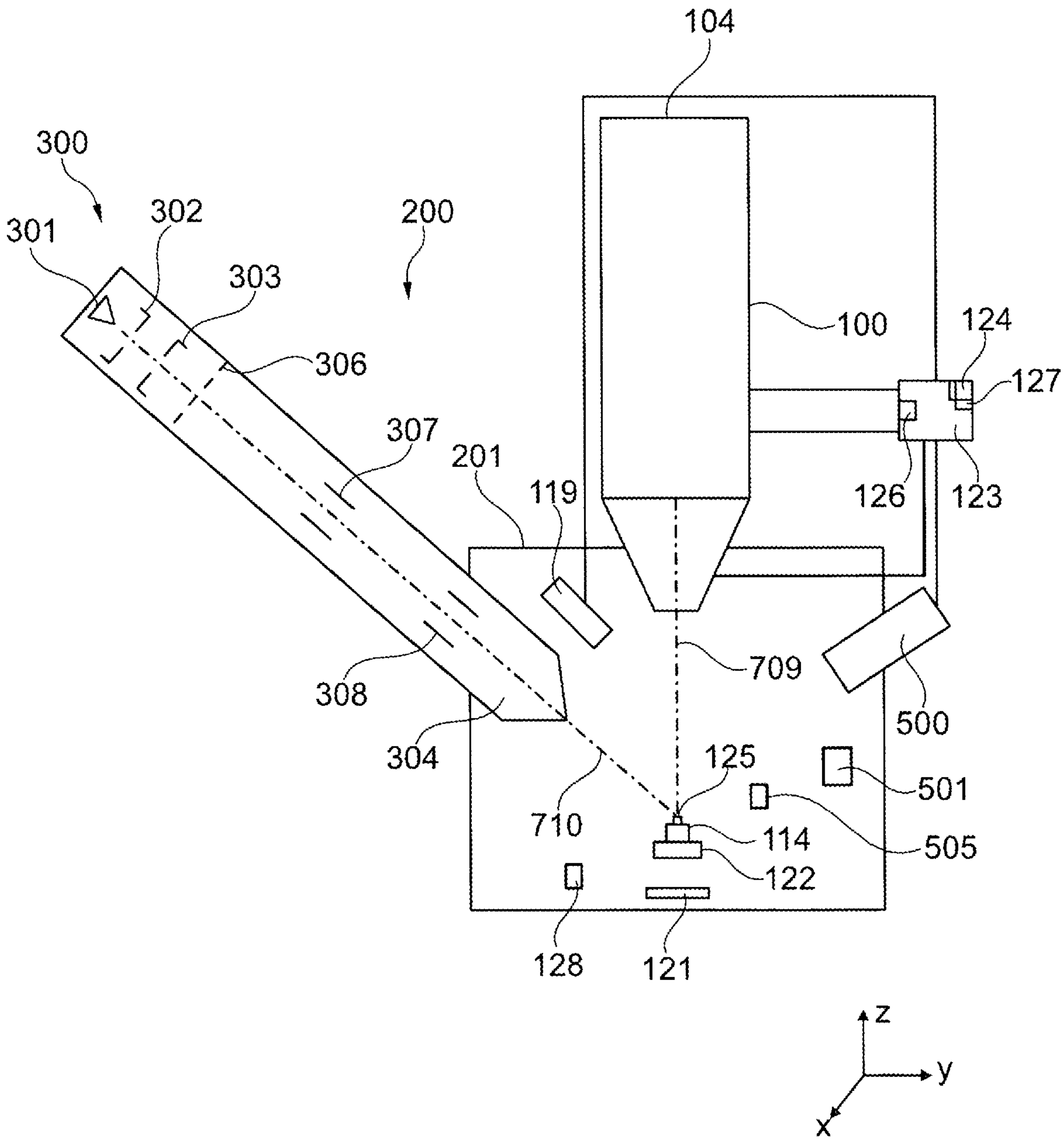
FIG. 3 shows a third embodiment of a particle beam apparatus according to the system described herein.

FIG. 3 shows a particle beam apparatus in the form of a combination apparatus 200. The combination apparatus 200 includes two particle beam columns. Firstly, the combination apparatus 200 is provided with the SEM 100, as depicted in FIG. 1, but without the sample chamber 120. Rather, the SEM 100 is arranged at a sample chamber 201. The sample chamber 201 is under vacuum. To generate the vacuum, a pump (not depicted) is arranged at the sample chamber 201. In the embodiment depicted in FIG. 3, the sample chamber 201 is operated in a first pressure range or in a second pressure range. The first pressure range includes only pressures less than or equal to $10^{-3}$ hPa, and the second pressure range includes only pressures greater than $10^{-3}$ hPa. To ensure the first and second pressure ranges, the sample chamber 201 is vacuum-sealed.

The third detector 121 is arranged in the sample chamber 201.

The SEM 100 serves to generate a first particle beam, namely the primary electron beam described above, and has the aforementioned optical axis, which is provided with reference sign 709 in FIG. 3 and is also referred to as first beam axis below. Secondly, the combination apparatus 200 is provided with an ion beam apparatus 300, which is likewise arranged at the sample chamber 201. The ion beam apparatus 300 also has an optical axis, which is provided with reference sign 710 in FIG. 3 and is also referred to as second beam axis below.

The SEM 100 is arranged vertically in relation to the sample chamber 201. By contrast, the ion beam apparatus 300 is arranged in a manner inclined by an angle of approximately 0° to 90° in relation to the SEM 100. For example, an arrangement of approximately 50° is depicted in FIG. 3. The ion beam apparatus 300 includes a second beam generator in the form of an ion beam generator 301. Ions, which form a second particle beam in the form of an ion beam, are generated by the ion beam generator 301. The ions are accelerated using an extraction electrode 302 at a predefinable potential. The second particle beam then passes through an ion optical unit of the ion beam apparatus 300, the ion optical unit including a condenser lens 303 and a second objective lens 304. The second objective lens 304 ultimately generates an ion probe, which is focused on the object 125 arranged at an object holder 114. The object holder 114 is arranged at an object stage 122.

A settable or selectable stop 306, a first electrode arrangement 307, and a second electrode arrangement 308 are arranged above the second objective lens 304 (i.e., in the direction of the ion beam generator 301), with the first electrode arrangement 307 and the second electrode arrangement 308 being in the form of scanning electrodes. The second particle beam is scanned over the surface of the object 125 using the first electrode arrangement 307 and the second electrode arrangement 308, with the first electrode arrangement 307 acting in a first direction and the second electrode arrangement 308 acting in a second direction opposite to the first direction. Hence, the scanning is carried out for example in a first direction. The scanning in a second direction perpendicular thereto is brought about by further electrodes (not depicted) rotated through 90° at the first electrode arrangement 307 and at the second electrode arrangement 308.

As explained above, the object holder 114 is arranged at the object stage 122. In the embodiment shown in FIG. 3, too, the object stage 122 is embodied to be movable in three directions arranged perpendicular to one another, namely in an x-direction (first stage axis), in a y-direction (second stage axis), and in a z-direction (third stage axis). Moreover, the object stage 122 can be rotated about two rotation axes arranged perpendicular to one another (stage rotation axes).

The distances depicted in FIG. 3 between the individual units of the combination apparatus 200 are presented in exaggerated fashion in order to better illustrate the individual units of the combination apparatus 200.

A radiation detector 119 used to detect interaction radiation, for example x-ray radiation and/or cathodoluminescent light, is arranged in the sample chamber 201. The radiation detector 119 is connected to a control device 123 that includes a monitor 124 and a processor 127. In addition or in an alternative, a further detector in the form of a chamber detector 500, in particular for detecting secondary electrons, can be arranged in the sample chamber 201. The further detector is also connected to the control device 123.

The control device 123 processes detection signals generated by the first detector 116, the second detector 117 (not illustrated in FIG. 3), the third detector 121, the radiation detector 119, and/or the chamber detector 500 and displays the detection signals in the form of images and/or analyses on the monitor 124.

The control device 123 also includes a database 126, in which data are stored and from which data are read out. Further, provision is made of a beam stop unit 505, to which the electron beam and/or the ion beam is guidable so that the electron beam and/or the ion beam are/is no longer steered onto the object 125.

A first heating and/or cooling device 128, which is used to cool and/or heat the object holder 114 and hence the object 125, is arranged at the object holder 114. For example, the object holder 114 is cooled to a temperature of −140° C. or less than −140° C. using liquid nitrogen or liquid helium. A temperature measuring unit (not depicted) is arranged in the sample chamber 201 for the purpose of determining a temperature of the object 125. For example, the temperature measuring unit is in the form of infrared measuring equipment or a semiconductor temperature sensor. However, the invention is not restricted to the use of such temperature measuring units. Rather, any temperature measuring unit which is suitable for the invention can be used as temperature measuring unit.

The combination apparatus 200 also includes a mobile manipulator 501, which is only depicted schematically in FIG. 3. The manipulator 501 is designed to hold and/or move the object 125 or a part of the object 125.

Figure 4:
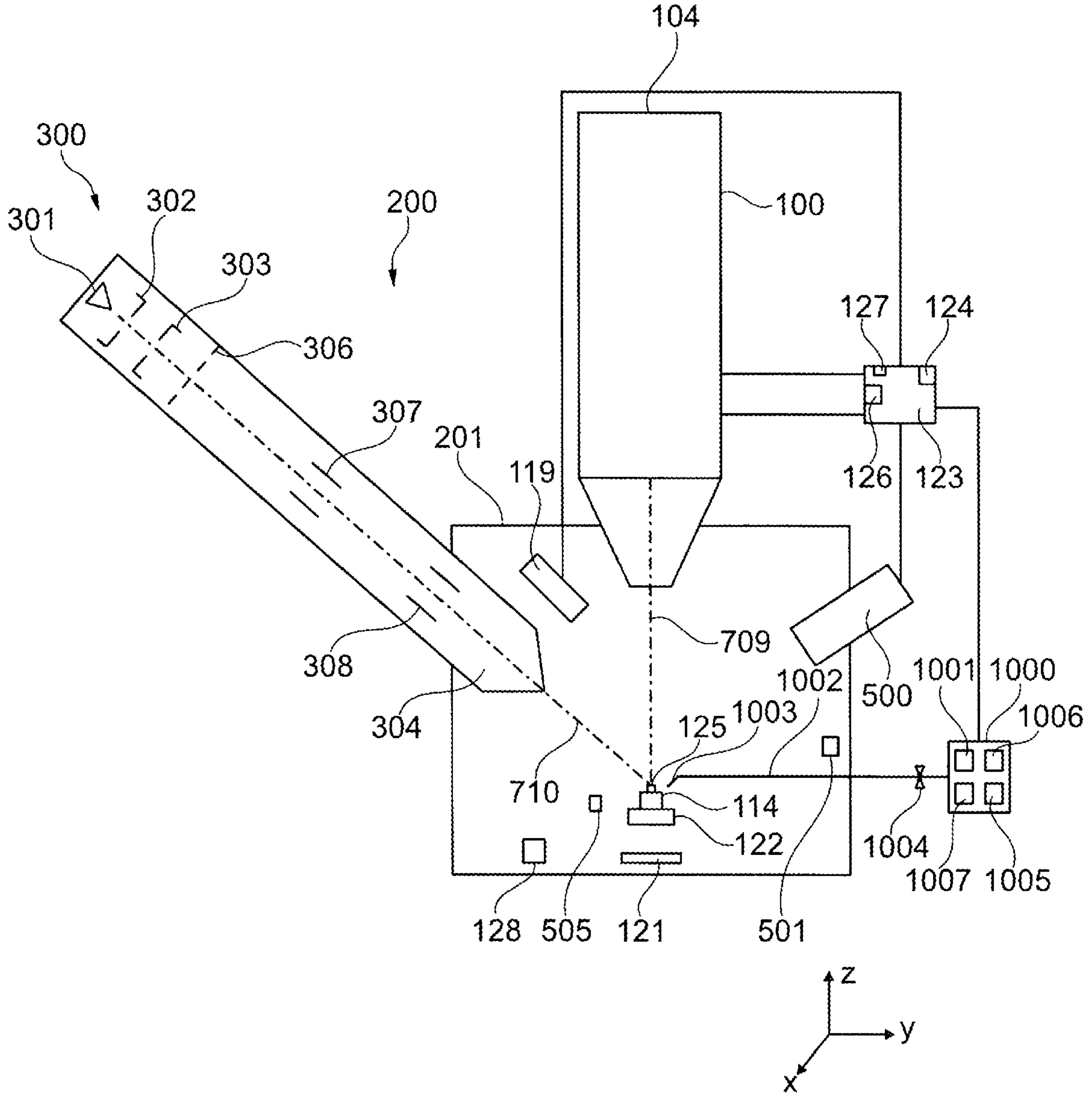
FIG. 4 shows a fourth embodiment of a particle beam apparatus according to the system described herein.

FIG. 4 shows a schematic illustration of a further combination apparatus 200. The embodiment of FIG. 4 is based on the embodiment of FIG. 3. Identical components are provided with identical reference signs. In contrast to the embodiment of the combination apparatus 200 according to FIG. 3, the combination apparatus 200 according to FIG. 4 has a gas feed device 1000. The gas feed device 1000 serves to feed a gaseous precursor to a specific position on the surface of the object 125 or of a unit of the combination apparatus 200 explained further below. The gas feed device 1000 includes a precursor reservoir 1001. For example, the precursor is stored as a solid or liquid substance in the precursor reservoir 1001. To bring the precursor into the gaseous state, the precursor is evaporated or sublimated within the precursor reservoir 1001. For example, evaporating or sublimating the precursor within the precursor reservoir 1001 can be influenced by controlling the temperature of the precursor reservoir 1001 and/or the precursor. In an alternative thereto, the precursor is stored in the precursor reservoir 1001 as a gaseous substance. For example, a precursor that includes metal is used as precursor in order to deposit a metal or a metal-containing layer on the surface of the object 125. For example, an insulating material, in particular $SiO_2$, may also be deposited on the surface of the object 125. Further, provision is also made for the precursor to be used for removing material from the object 125 upon interaction with the particle beam.

The gas feed device 1000 is provided with a feed line 1002. In the direction of the object 125, the feed line 1002 includes an acicular and/or capillary device, for example in the form of a hollow tube 1003, which in particular can be brought into the vicinity of the surface of the object 125, for example to a distance of 10 μm to 1 mm from the surface of the object 125. The hollow tube 1003 has a feed opening, the diameter of which for example lies in the range from 10 μm to 1000 μm, in particular in the range from 100 μm to 600 μm. The feed line 1002 includes a valve 1004 for regulating the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125. When the valve 1004 is closed, the inflow of the gaseous precursor onto the surface of the object 125 is stopped.

The gas feed device 1000 is further provided with an adjusting unit 1005, which enables an adjustment of the position of the hollow tube 1003 in all 3 spatial directions—namely an x-direction, a y-direction, and a z-direction—and an adjustment of the orientation of the hollow tube 1003 using a rotation and/or a tilt. The gas feed device 1000 and hence also the adjustment unit 1005 are connected to the control device 123 of the SEM 100.

In further embodiments, the precursor reservoir 1001 is not arranged directly at the gas feed device 1000. Rather, in the further embodiments, provision is made for the precursor reservoir 1001 to be arranged for example on a wall of a room in which the combination apparatus 200 is situated. As an alternative thereto, provision is made for the precursor reservoir 1001 to be arranged in a first room and for the combination apparatus 200 to be arranged in a second room separate from the first room. In yet a further alternative thereto, provision is made for the precursor reservoir to be arranged in a cabinet device.

The gas feed device 1000 includes a temperature measuring unit 1006. For example, a resistance measuring device, a thermocouple, and/or a semiconductor temperature sensor are/is used as the temperature measuring unit 1006. However, the invention is not restricted to the use of such temperature measuring units. Rather, any temperature measuring unit which is suitable for the invention can be used as temperature measuring unit. In particular, provision can be made for the temperature measuring unit not to be arranged at the gas feed device 1000, but rather to be arranged for example at a distance from the gas feed device 1000.

The gas feed device 1000 further includes a temperature setting unit 1007. For example, the temperature setting unit 1007 is a heating device, in particular a conventional infrared heating device, a heating wire and/or a Peltier element. In an alternative thereto, the temperature setting unit 1007 is in the form of a heating and/or cooling device which includes a heating wire, for example. However, the invention is not restricted to the use of such a temperature setting unit 1007. Rather, any suitable temperature setting unit can be used for the invention.

Figure 5:
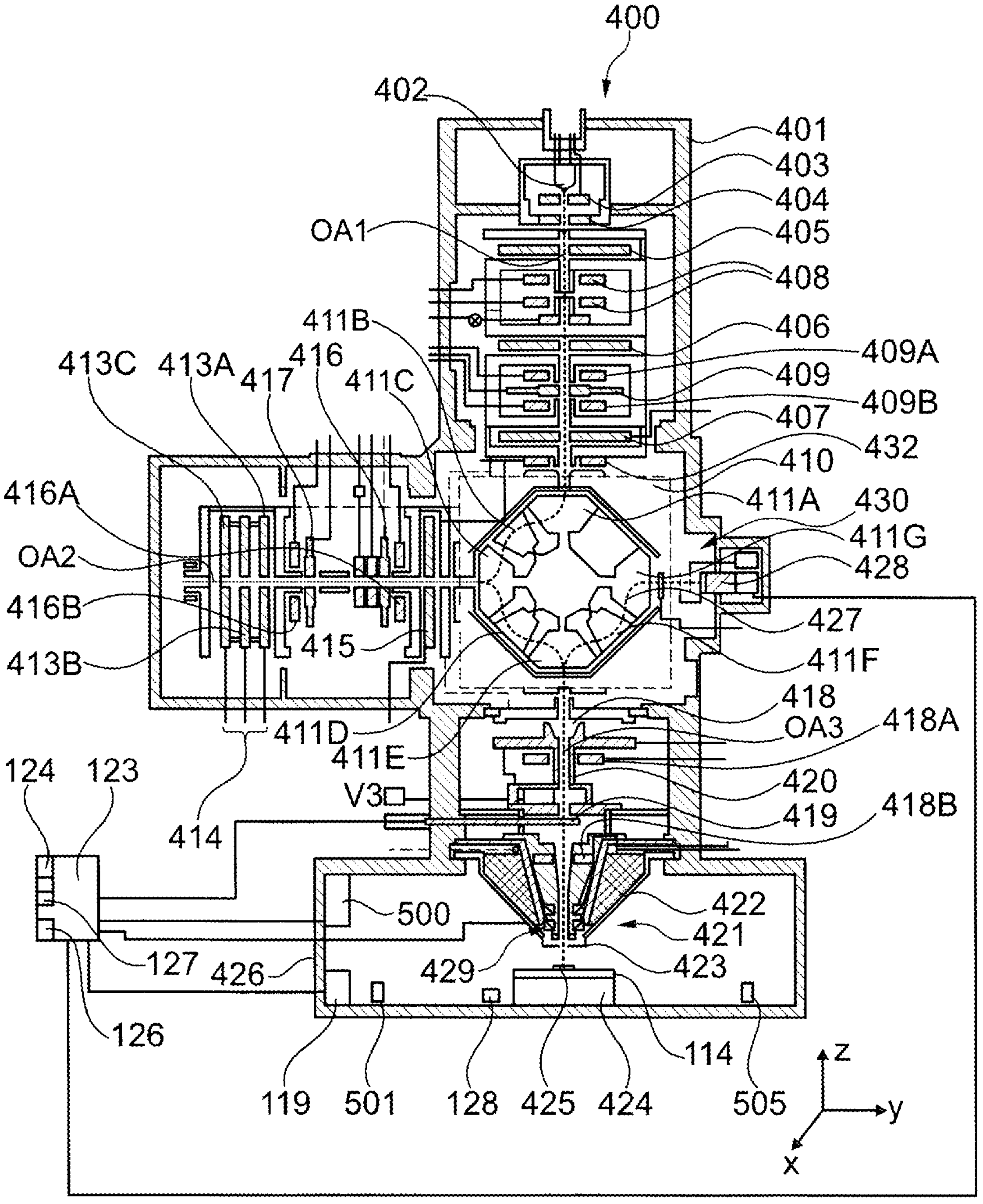
FIG. 5 shows a fifth embodiment of a particle beam apparatus according to the system described herein.

FIG. 5 is a schematic illustration of another embodiment of a particle beam apparatus according to the system described herein. The embodiment shown in FIG. 5 of the particle beam apparatus is provided with a reference sign 400 and includes a mirror corrector for correcting chromatic and/or spherical aberrations, for example. The particle beam apparatus 400 includes a particle beam column 401 which is in the form of an electron beam column and substantially corresponds to an electron beam column of a corrected SEM. However, the particle beam apparatus 400 is not restricted to an SEM with a mirror corrector. Rather, the particle beam apparatus can include any type of corrector units.

The particle beam column 401 includes a particle beam generator in the form of an electron source 402 (cathode), an extraction electrode 403, and an anode 404. For example, the electron source 402 is in the form of a thermal field emitter. Electrons emerging from the electron source 402 are accelerated to the anode 404 due to a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used for the guiding of the particle beam.

Further, the particle beam is set along the beam path using a beam guiding device. The beam guiding device in the embodiment of FIG. 5 includes a source setting unit with two magnetic deflection units 408 arranged along the first optical axis OA1. Moreover, the particle beam apparatus 400 includes electrostatic beam deflection units. A first electrostatic beam deflection unit 409, which is also embodied as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are set for the purposes of setting the particle beam with respect to the axis of the third electrostatic lens 407 and the entrance window of a beam deflection device 410. The first electrostatic beam deflection unit 409, the first multi-pole unit 409A, and the second multi-pole unit 409B can interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 includes a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and is deflected by the beam deflection device 410 in the direction of a second optical axis OA2. The beam deflection is performed using the first magnetic sector 411A, using the second magnetic sector 411B, and using the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the embodiment in FIG. 5, the deflection with respect to the second optical axis OA2 and with respect to the third optical axis OA3 is provided by deflection of the particle beam at an angle of 90°. Hence, the third optical axis OA3 runs coaxially with respect to the first optical axis OA1. However, reference is made to the fact that the particle beam apparatus 400 according to the invention described here is not restricted to deflection angles of 90°. Rather, any suitable deflection angle can be chosen by the beam deflection device 410, for example 70° or 110°, with the result that the first optical axis OA1 does not run coaxially with respect to the third optical axis OA3. With respect to further details of the beam deflection device 410, reference is made to WO 2002/067286 A2.

After the particle beam has been deflected by the first magnetic sector 411A, the second magnetic sector 411B, and the third magnetic sector 411C, the particle beam is guided along the second optical axis OA2. The particle beam is guided to an electrostatic mirror 414 and travels on a path of the particle beam to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 includes a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, the electrons are deflected to the third optical axis OA3 by the third magnetic sector 411C, the fourth magnetic sector 411D, and the fifth magnetic sector 411E.

The electrons of the particle beam emerge from the beam deflection device 410 and are guided along the third optical axis OA3 to an object 425 that is intended to be examined and is arranged in an object holder 114. On the path to the object 425, the particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam guiding tube 420.

Using the objective lens 421, the particle beam is focused on a focal plane in which the object 425 is arranged. The object holder 114 is arranged at a mobile object stage 424. The movable object stage 424 is arranged in a sample chamber 426 of the particle beam apparatus 400. The object stage 424 is embodied to be movable in three directions arranged perpendicular to one another, namely in an x-direction (first stage axis), in a y-direction (second stage axis), and in a z-direction (third stage axis). Moreover, the object stage 424 can be rotated about two rotation axes arranged perpendicular to one another (stage rotation axes).

The sample chamber 426 is under vacuum. To generate the vacuum, a pump (not depicted) is arranged at the sample chamber 426. In the embodiment depicted in FIG. 5, the sample chamber 426 is operated in a first pressure range or in a second pressure range. The first pressure range includes only pressures less than or equal to $10^{-3}$ hPa, and the second pressure range includes only pressures greater than $10^{-3}$ hPa. To ensure the first and second pressure ranges, the sample chamber 426 is vacuum-sealed.

The objective lens 421 may be in the form of a combination of a magnetic lens 422 and a sixth electrostatic lens 423. The end of the beam guiding tube 420 may also be an electrode of an electrostatic lens. After emerging from the beam guiding tube 420, particles of the particle beam are decelerated to a potential of the object 425. The objective lens 421 is not restricted to a combination of the magnetic lens 422 and the sixth electrostatic lens 423. Rather, the objective lens 421 can take on any suitable form. For example, the objective lens 421 can also be in the form of a purely magnetic lens or a purely electrostatic lens.

The particle beam which is focused on the object 425 interacts with the object 425. Interaction particles are generated. In particular, secondary electrons are emitted from the object 425 or backscattered electrons are backscattered at the object 425. The secondary electrons or the backscattered electrons are accelerated again and guided into the beam guiding tube 420 along the third optical axis OA3. In particular, the trajectories of the secondary electrons and of the backscattered electrons travel on the route of the beam path of the particle beam in the opposite direction to the particle beam.

The particle beam apparatus 400 includes a first analysis detector 419, which is arranged between the beam deflection device 410 and the objective lens 421 along the beam path. Secondary electrons travelling in directions oriented at a large angle with respect to the third optical axis OA3 are detected by the first analysis detector 419. Backscattered electrons and secondary electrons at a small axial distance from the third optical axis OA3 at the location of the first analysis detector 419—i.e., backscattered electrons and secondary electrons at a small distance from the third optical axis OA3 at the location of the first analysis detector 419—enter the beam deflection device 410 and are deflected along a detection beam path 427 to a second analysis detector 428 by the fifth magnetic sector 411E, the sixth magnetic sector 411F, and the seventh magnetic sector 411G. For example, the deflection angle is 90° or 110°.

The first analysis detector 419 generates detection signals which are largely generated by emitted secondary electrons. The detection signals which are generated by the first analysis detector 419 are passed to a control device 123 and are used to obtain information about the properties of the interaction region of the focused particle beam with the object 425. In particular, the focused particle beam is scanned over the object 425 using a scanning device 429. Using the detection signals generated by the first analysis detector 419, an image of the scanned region of the object 425 can then be generated and displayed on a display unit. For example, the display unit is a monitor 124 arranged at the control device 123. The control device 123 also includes a processor 127.

The second analysis detector 428 is also connected to the control device 123. Detection signals from the second analysis detector 428 are passed to the control device 123 and used to generate an image of the scanned region of the object 425 and display the scanned image on a display unit. For example, the display unit is the monitor 124 arranged at the control device 123.

Arranged at the sample chamber 426 is a radiation detector 119 used to detect interaction radiation, for example x-ray radiation and/or cathodoluminescent light. The radiation detector 119 is connected to the control device 123 that includes the monitor 124. The control device 123 processes detection signals from the radiation detector 119 and displays the detection signals in the form of analyses on the monitor 124.

The control device 123 also includes a database 126, in which data are stored and from which data are read out. Further, provision is made of a beam stop unit 505, to which the electron beam is guidable so that the electron beam is no longer steered onto the object 425.

Moreover, the particle beam apparatus 400 includes a chamber detector 500 connected to the control device 123.

A first heating and/or cooling device 128, which is used to cool and/or heat the object holder 114 and hence the object 425, is arranged at the object holder 114. For example, the object holder 114 is cooled to a temperature of −140° C. or less than −140° C. using liquid nitrogen or liquid helium. A temperature measuring unit (not depicted) is arranged in the sample chamber 426 for the purpose of determining a temperature of the object 425. For example, the temperature measuring unit is in the form of infrared measuring equipment or a semiconductor temperature sensor. However, the invention is not restricted to the use of such temperature measuring units. Rather, any temperature measuring unit which is suitable for the invention can be used as temperature measuring unit.

The particle beam apparatus 400 also includes a mobile manipulator 501, which is only depicted schematically in FIG. 5. The manipulator 501 is designed to hold and/or move the object 425 or a part of the object 425.

Figure 6:
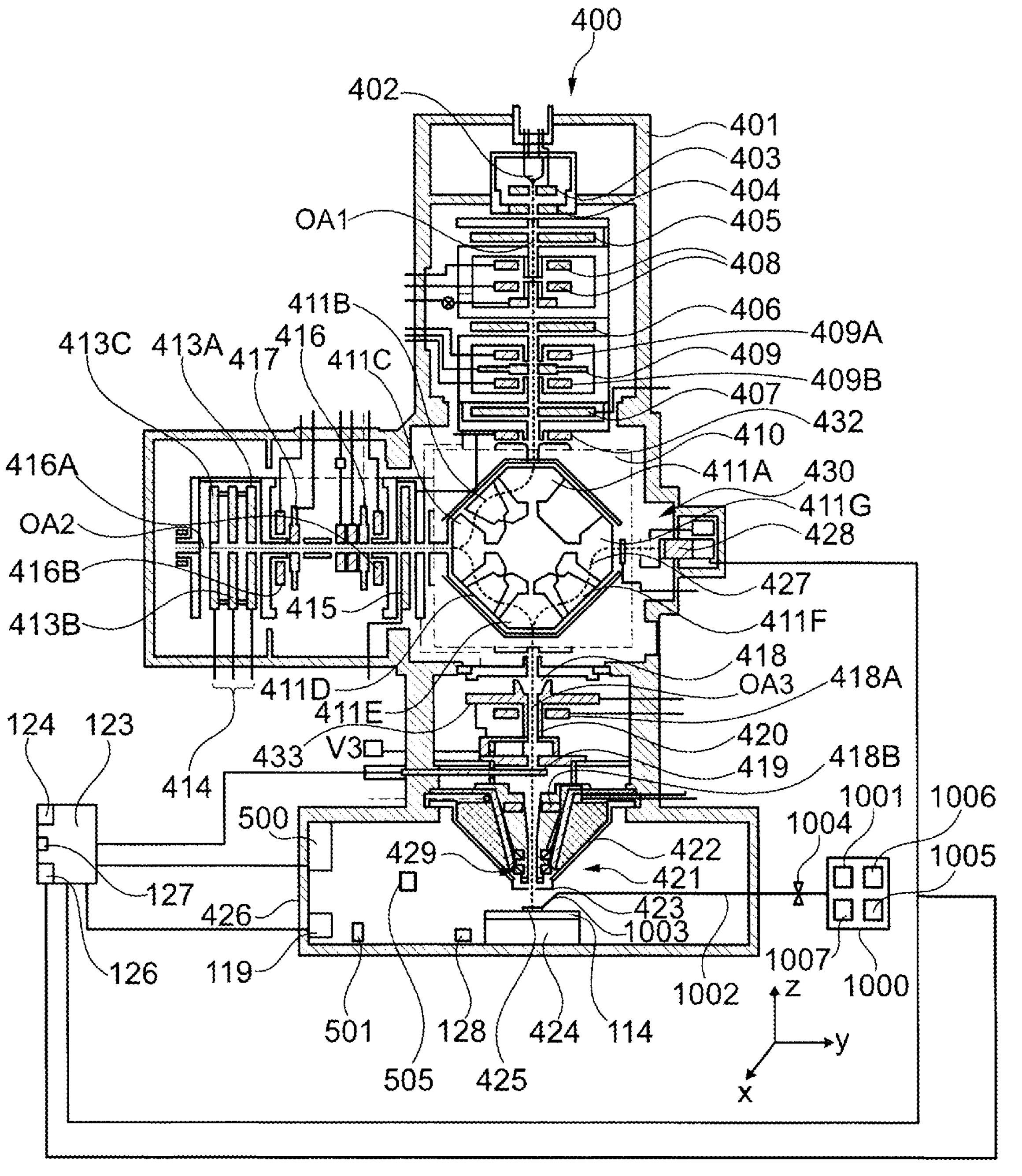
FIG. 6 shows a sixth embodiment of a particle beam apparatus according to the system described herein.

FIG. 6 shows a schematic illustration of a further particle beam apparatus 400. The embodiment of FIG. 6 is based on the embodiment of FIG. 5. Identical components are provided with identical reference signs. In contrast to the embodiment of the particle beam apparatus 400 according to FIG. 5, the combination apparatus according to FIG. 6 has a gas feed device 1000. The gas feed device 1000 serves to feed a gaseous precursor to a specific position on the surface of the object 425 or of a unit of the particle beam apparatus 400 explained further below. The gas feed device 1000 includes a precursor reservoir 1001. For example, the precursor is stored as a solid or liquid substance in the precursor reservoir 1001. To bring the precursor into the gaseous state, the precursor is evaporated or sublimated within the precursor reservoir 1001. For example, evaporating or sublimating the precursor within the precursor reservoir 1001 can be influenced by controlling the temperature of the precursor reservoir 1001 and/or the precursor. In an alternative thereto, the precursor is stored in the precursor reservoir 1001 as a gaseous substance. For example, a precursor that includes metal is used as precursor in order to deposit a metal or a metal-containing layer on the surface of the object 425. For example, an insulating material, in particular $SiO_2$, may also be deposited on the surface of the object 425. Further, provision is also made for the precursor to be used for removing material from the object 425 upon interaction with the particle beam.

The gas feed device 1000 is provided with a feed line 1002. In the direction of the object 425, the feed line 1002 includes an acicular and/or capillary device, for example in the form of a hollow tube 1003, which in particular can be brought into the vicinity of the surface of the object 425, for example to a distance of 10 μm to 1 mm from the surface of the object 425. The hollow tube 1003 has a feed opening, the diameter of which for example lies in the range from 10 μm to 1000 μm, in particular in the range from 100 μm to 600 μm. The feed line 1002 includes a valve 1004 for regulating the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 425. When the valve 1004 is closed, the inflow of the gaseous precursor onto the surface of the object 425 is stopped.

The gas feed device 1000 is further provided with an adjusting unit 1005, which enables an adjustment of the position of the hollow tube 1003 in all 3 spatial directions—namely an x-direction, a y-direction, and a z-direction—and an adjustment of the orientation of the hollow tube 1003 using a rotation and/or a tilt. The gas feed device 1000 and hence also the adjustment unit 1005 are connected to the control device 123 of the particle beam apparatus 400.

In further embodiments, the precursor reservoir 1001 is not arranged directly at the gas feed device 1000. Rather, in the further embodiments, provision is made for the precursor reservoir 1001 to be arranged for example on a wall of a room in which the particle beam apparatus 400 is situated. As an alternative thereto, provision is made for the precursor reservoir 1001 to be arranged in a first room and for the particle beam apparatus 400 to be arranged in a second room separate from the first room. In yet a further alternative thereto, provision is made for the precursor reservoir 1001 to be arranged in a cabinet device.

The gas feed device 1000 includes a temperature measuring unit 1006. For example, a resistance measuring device, a thermocouple, and/or a semiconductor temperature sensor are/is used as temperature measuring unit 1006. However, the invention is not restricted to the use of such temperature measuring units. Rather, any temperature measuring unit which is suitable for the invention can be used as temperature measuring unit. In particular, provision can be made for the temperature measuring unit not to be arranged at the gas feed device 1000, but rather to be arranged for example at a distance from the gas feed device 1000.

The gas feed device 1000 further includes a temperature setting unit 1007. For example, the temperature setting unit 1007 is a heating device, in particular a conventional infrared heating device, a heating wire and/or a Peltier element. In an alternative thereto, the temperature setting unit 1007 is in the form of a heating and/or cooling device which includes a heating wire, for example. However, the invention is not restricted to the use of such a temperature setting unit 1007. Rather, any suitable temperature setting unit can be used for the invention.

The control device 123 of the SEM 100 according to FIG. 1 or 2, of the combination apparatus 200 according to FIG. 3 or 4, and/or of the particle beam apparatus 400 according to FIG. 5 or 6 includes the processor 127. Loaded into the processor 127 is a computer program product having a program code which, upon execution, carries out a method for operating the SEM 100 according to FIG. 1 or 2, the combination apparatus 200 according to FIG. 3 or 4, and/or the particle beam apparatus 400 according to FIG. 5 or 6. Embodiments of the method according to the system described herein are explained hereinbelow in relation to the combination apparatus 200 according to FIG. 3 or 4. Corresponding statements apply with regard to the SEM 100 according to FIG. 1 or 2 and the particle beam apparatus 400 according to FIG. 5 or 6.

Figure 7:
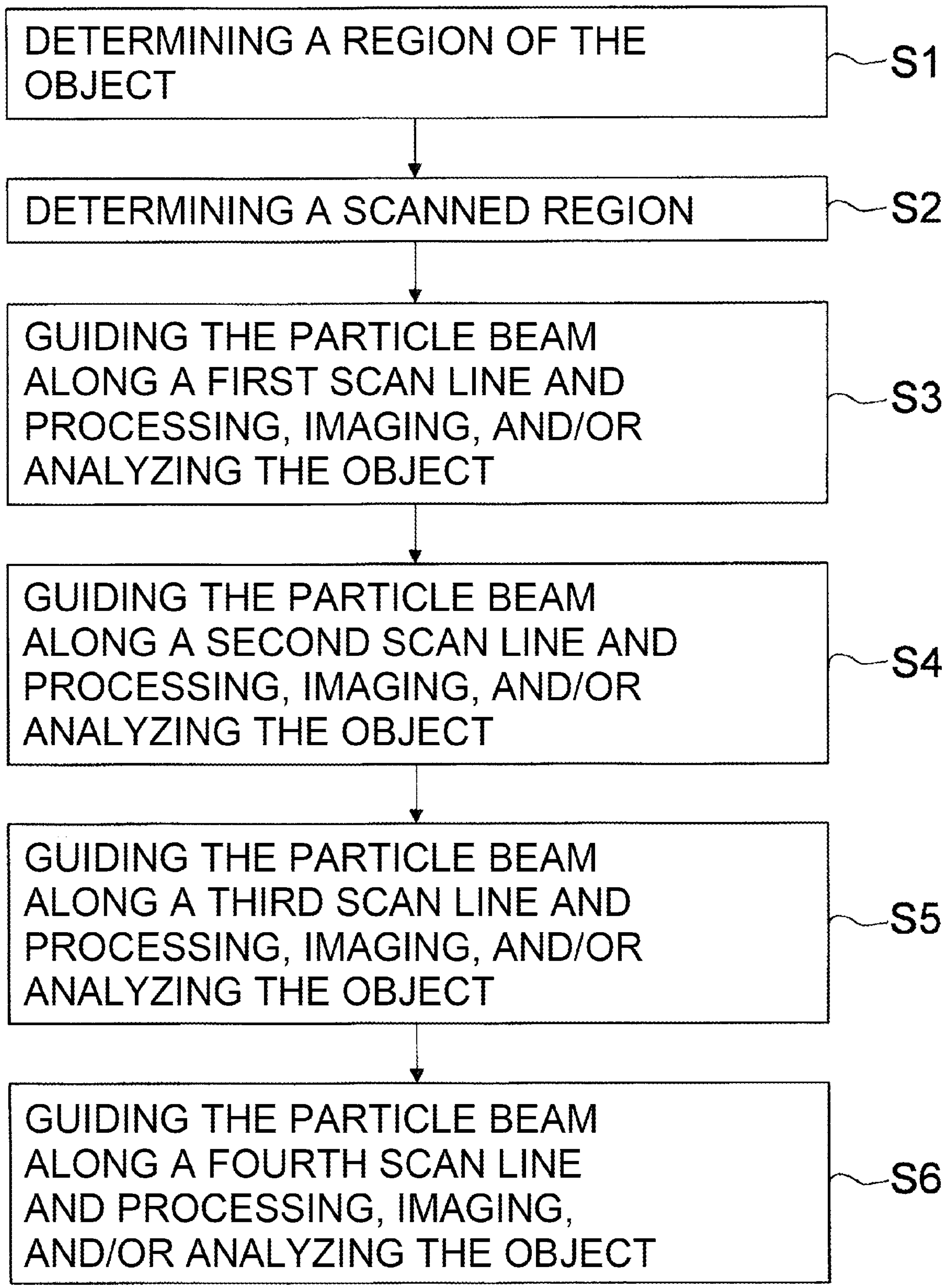
FIG. 7 shows a schematic illustration of a procedure of a first embodiment of a method according to the system described herein.

FIG. 7 shows an embodiment of the method according to the system described herein. In a method step S1, a region of interest of the object 125 arranged at or in the object 125 is determined using the control device 123 of the combination apparatus 200. In other words, the position of the region of interest is determined (that is to say identified and/or chosen) in or at the object 125. By way of example, the region of interest is a precipitate in the material of the object 125, a pore in the material of the object 125, an impurity phase in the material of the object 125, an interface in the material of the object 125, or a defect in the material of the object 125. Elsewhere herein, the determined region of interest is also referred to as determined region. In an embodiment, provision is made for the region of interest to be determined using the control device 123 of the combination apparatus 200 by using specified data about the object 125 and/or by using data of a model of the object 125, for example, if the structural build of the object 125 is known or is approximately known. Then it is for example possible to accurately determine or approximately determine the position of the region of interest in or at the object 125. For example, the ascertained or suspected position of the region of interest is input into the control device 123. A further embodiment additionally or alternatively provides for the region of interest to be determined using the control device 123 using a non-destructive examination. For example, the region of interest is determined using the control device 123 by using an x-ray device, an ultrasound device, and/or a lock-in thermography device. Expressed differently, the position of the region of interest in or at the object 125 is determined.

Figure 8:
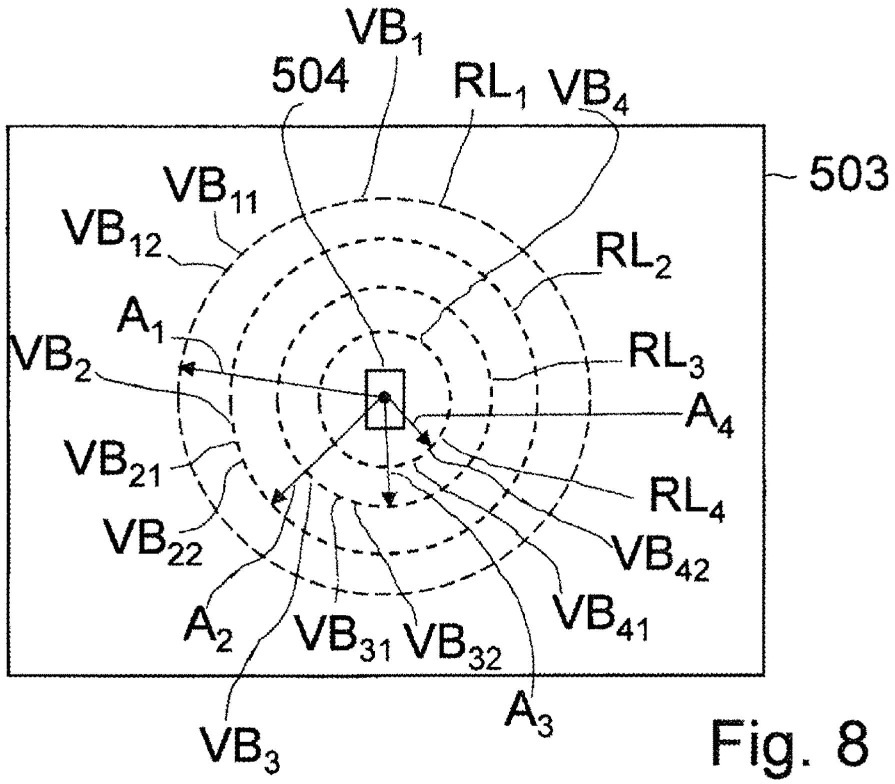
FIG. 8 shows a schematic illustration of a scanned region and a region of interest.

A method step S2 also includes a determination of a scanned region of the object 125 using the control device 123 of the combination apparatus 200. FIG. 8 shows a schematic illustration of a specific scanned region 503. The scanned region 503 includes the determined region 504. In other words, the scanned region 503 includes the determined region 504. In particular, provision is made for the determined region 504 to be located within the scanned region 503. Expressed yet again differently, the determined region 504 (i.e., the region of interest) is a portion of the scanned region 503. The electron beam and/or the ion beam are/is guidable within the scanned region 503 and/or along the scanned region 503.

In yet a further embodiment, provision is additionally or alternatively made for a center of the scanned region 503 to be determined as the region of interest 504. In addition or in an alternative thereto, provision is made for a centroid of the scanned region 503 to be determined as the region of interest 504. By way of example, the center of the scanned region 503 simultaneously is a centroid of the scanned region 503. In particular, the centroid is a centroid of area. In addition or in an alternative thereto, provision is made for a midpoint of the scanned region 503 to be determined as the region of interest 504.

The scanned region 503 has at least one first scan line and at least one second scan line, with the first scan line forming a first geometric shape and with the second scan line forming a second geometric shape. By way of example, FIG. 8 shows an embodiment in which four scan lines are provided, namely a first scan line $RL_1$, a second scan line $RL_2$, a third scan line $RL_3$, and a fourth scan line $RL_4$. Explicit reference is made to the fact that the invention is not restricted to the use of four scan lines. Rather, any number of scan lines suitable for the invention can be used. For example, n scan lines $RL_1$ to $RL_n$ are used, where n is an integer and $n \geq 2$.

For example, each of the aforementioned scan lines, in particular the scan lines $RL_1$ to $RL_4$, can have a straight, curved, and/or bent form. In FIG. 8, the aforementioned scan lines $RL_1$ to $RL_4$ are in the form of concentric circles. The circles are arranged around the region of interest 504, with the region of interest 504 including the midpoint of the concentric circles.

Figure 9:
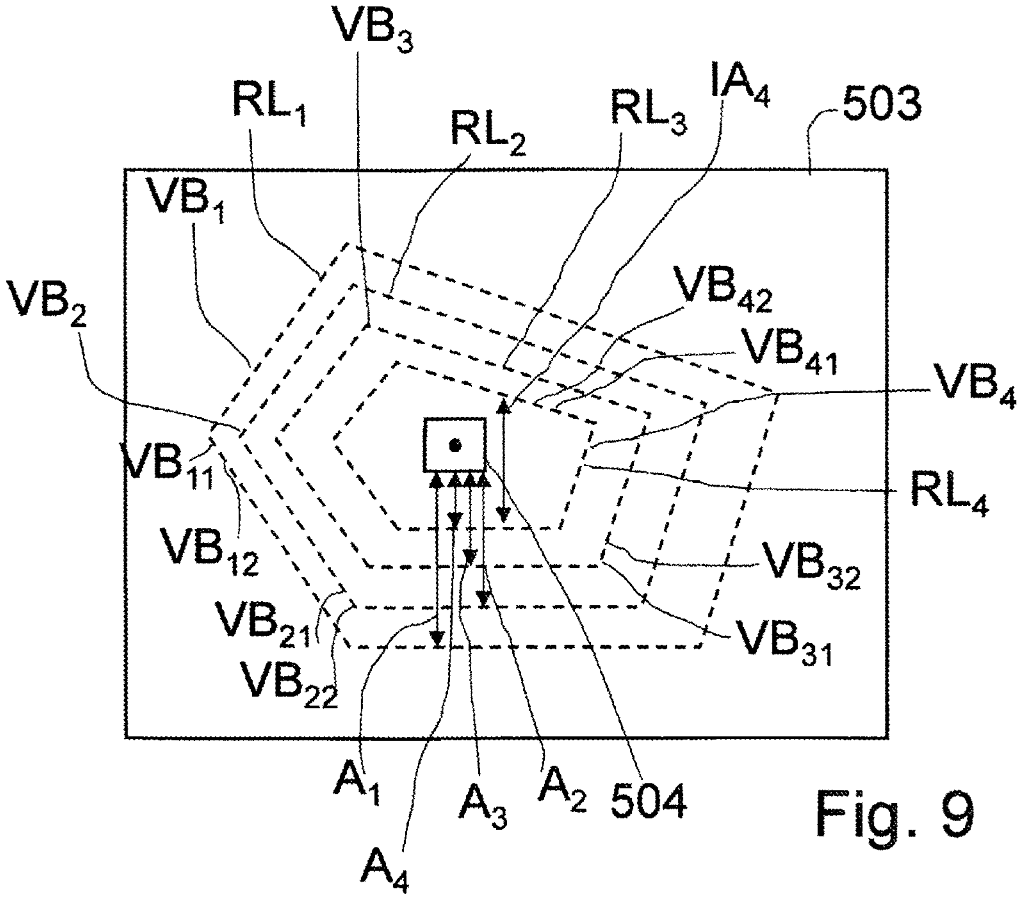
FIG. 9 shows a further schematic illustration of a scanned region and a region of interest.

By way of example, FIG. 9 shows an embodiment based on the embodiment according to FIG. 8. Identical components are provided with identical reference signs. Reference is therefore initially made to the comments further above, which also apply here. In contrast to FIG. 8, the scan lines $RL_1$ to $RL_4$ of FIG. 9 are in the form of a polygon.

However, the invention is not restricted to the form of the aforementioned scan lines $RL_1$ to $RL_4$ described here. Rather, any scan line which is suitable for the invention can be used as a scan line.

As evident from FIG. 8 or FIG. 9, the first scan line $RL_1$ has first dwell regions $VB_1$, two dwell regions of which have been identified using reference signs $VB_{11}$ and $VB_{12}$. Further, the second scan line $RL_2$ has second dwell regions $VB_2$, two dwell regions of which have been identified using reference signs $VB_{21}$ and $VB_{22}$. Moreover, the third scan line $RL_3$ has third dwell regions $VB_3$, two dwell regions of which have been identified using reference signs $VB_{31}$ and $VB_{32}$. The fourth scan line $RL_4$ also has dwell regions, namely fourth dwell regions $VB_4$, two dwell regions of which have been identified using reference signs $VB_{41}$ and $VB_{42}$.

A dwell region is a region on which the electron beam and/or the ion beam of the combination apparatus 200 can be focused. The geometric shape of each individual dwell region can be suitably chosen. For example, the dwell region is in the form of a point, a line, and/or a circle. However, the invention is not restricted thereto. Rather, each dwell region may have any geometric shape that is suitable for the invention.

Each dwell region of the second dwell regions $VB_2$ of the second scan line $RL_2$ (i.e., the dwell regions $VB_{21}$ and $VB_{22}$ in particular) is arranged closer to the determined region 504 than each dwell region of the first dwell regions $VB_1$ of the first scan line $RL_1$ (i.e., the dwell regions $VB_{11}$ and $VB_{12}$ in particular). Further, each dwell region of the third dwell regions $VB_3$ of the third scan line $RL_3$ (i.e., the dwell regions $VB_{31}$ and $VB_{32}$ in particular) is arranged closer to the determined region 504 than each dwell region of the second dwell regions $VB_2$ of the second scan line $RL_2$ (i.e., the dwell regions $VB_{21}$ and $VB_{22}$ in particular). Moreover, each dwell region of the fourth dwell regions $VB_4$ of the fourth scan line $RL_4$ (i.e., the dwell regions $VB_{41}$ and $VB_{42}$ in particular) is arranged closer to the determined region 504 than each dwell region of the third dwell regions $VB_3$ of the third scan line $RL_3$ (i.e., the dwell regions $VB_{31}$ and $VB_{32}$ in particular). In other words, the first scan line $RL_1$ is arranged further away from the determined region 504 than the second scan line $RL_2$. Further, the second scan line $RL_2$ is arranged further away from the determined region 504 than the third scan line $RL_3$. Moreover, the third scan line $RL_3$ is arranged further away from the determined region 504 than the fourth scan line $RL_4$. Hence the fourth scan line $RL_4$ is arranged closest to the determined region 504. The first scan line $RL_1$ is arranged furthest away from the determined region 504. The second scan line $RL_2$ is arranged between the first scan line $RL_1$ and the third scan line $RL_3$. Further, the third scan line $RL_3$ is arranged between the second scan line $RL_2$ and the fourth scan line $RL_4$.

In method step S3, a guiding of the ion beam and/or the electron beam along the first scan line $RL_1$ and hence along the first dwell regions $VB_1$, in particular the dwell regions $VB_{11}$ and $VB_{12}$, is provided. For example, the electron beam is guided along the first scan line $RL_1$ using the scanning device 115. For example, the ion beam is guided along the first scan line $RL_1$ using the first electrode arrangement 307 and the second electrode arrangement 308. While the guiding of the electron beam and/or the ion beam along the first scan line $RL_1$ is provided, the electron beam and/or the ion beam interact/interacts with the material of the object 125, in such a way that first interaction particles and/or a first interaction radiation arise/arises. The first interaction particles are detected using the first detector 116, the second detector 117, the third detector 121, and/or the chamber detector 500. The first interaction radiation is detected by the radiation detector 119. The object is imaged and/or analyzed using the detected first interaction particles and/or the detected first interaction radiation. The image representation and/or the analysis performed are/is displayed on the monitor 124 of the control device 123, for example. In addition or in an alternative thereto, provision is made for the object 125 to be processed by the electron beam and/or the ion beam. By way of example, material of the object 125 is removed by the ion beam. In addition or in an alternative thereto, provision is made for material to be applied to the object 125 using the ion beam and a supplied gas.

In method step S4, a guiding of the ion beam and/or the electron beam along the second scan line $RL_2$ and hence along the second dwell regions $VB_2$, in particular the dwell regions $VB_{21}$ and $VB_{22}$, is provided. For example, the electron beam is guided along the second scan line $RL_2$ using the scanning device 115. For example, the ion beam is guided along the second scan line $RL_2$ using the first electrode arrangement 307 and the second electrode arrangement 308. While the guiding of the electron beam and/or the ion beam along the second scan line $RL_2$ is provided, the electron beam and/or the ion beam interact/interacts with the material of the object 125, in such a way that second interaction particles and/or a second interaction radiation arise/arises. The second interaction particles are detected using the first detector 116, the second detector 117, the third detector 121, and/or the chamber detector 500. The second interaction radiation is detected by the radiation detector 119. The object 125 is imaged and/or analyzed using the detected second interaction particles and/or the detected second interaction radiation. The image representation and/or the analysis performed are/is displayed on the monitor 124 of the control device 123, for example. In addition or in an alternative thereto, provision is made for the object 125 to be processed by the electron beam and/or the ion beam. By way of example, material of the object 125 is removed by the ion beam. In addition or in an alternative thereto, provision is made for material to be applied to the object 125 using the ion beam and a supplied gas.

In method step S5, a guiding of the ion beam and/or the electron beam along the third scan line $RL_3$ and hence along the third dwell regions $VB_3$, in particular the dwell regions $VB_{31}$ and $VB_{32}$, is provided. For example, the electron beam is guided along the third scan line $RL_3$ using the scanning device 115. For example, the ion beam is guided along the third scan line $RL_3$ using the first electrode arrangement 307 and the second electrode arrangement 308. While the guiding of the electron beam and/or the ion beam along the third scan line $RL_3$ is provided, the electron beam and/or the ion beam interact/interacts with the material of the object 125, in such a way that third interaction particles and/or a third interaction radiation arise/arises. The third interaction particles are detected using the first detector 116, the second detector 117, the third detector 121, and/or the chamber detector 500. The third interaction radiation is detected by the radiation detector 119. The object 125 is imaged and/or analyzed using the detected third interaction particles and/or the detected third interaction radiation. The image representation and/or the analysis performed are/is displayed on the monitor 124 of the control device 123, for example. In addition or in an alternative thereto, provision is made for the object 125 to be processed by the electron beam and/or the ion beam. By way of example, material of the object 125 is removed by the ion beam. In addition or in an alternative thereto, provision is made for material to be applied to the object 125 using the ion beam and a supplied gas.

In method step S6, a guiding of the ion beam and/or the electron beam along the fourth scan line $RL_4$ and hence along the fourth dwell regions $VB_4$, in particular the dwell regions $VB_{41}$ and $VB_{42}$, is provided. For example, the electron beam is guided along the fourth scan line $RL_4$ using the scanning device 115. For example, the ion beam is guided along the fourth scan line $RL_4$ using the first electrode arrangement 307 and the second electrode arrangement 308. While the guiding of the electron beam and/or the ion beam along the fourth scan line $RL_4$ is provided, the electron beam and/or the ion beam interact/interacts with the material of the object 125, in such a way that fourth interaction particles and/or a fourth interaction radiation arise/arises. The fourth interaction particles are detected using the first detector 116, the second detector 117, the third detector 121, and/or the chamber detector 500. The fourth interaction radiation is detected by the radiation detector 119. The object 125 is imaged and/or analyzed using the detected fourth interaction particles and/or the detected fourth interaction radiation. The image representation obtained and/or the analysis performed are/is displayed on the monitor 124 of the control device 123, for example. In addition or in an alternative thereto, provision is made for the object 125 to be processed by the electron beam and/or the ion beam. By way of example, material of the object 125 is removed by the ion beam. In addition or in an alternative thereto, provision is made for material to be applied to the object 125 using the ion beam and a supplied gas.

Now, the method for example provides for the electron beam and/or the ion beam to remain at each of the first dwell regions $VB_1$ for a first dwell time when the guiding of the electron beam and/or the ion beam along the first dwell regions $VB_1$ of the first scan line $RL_1$ is provided. Further, the electron beam and/or the ion beam remain/remains at each of the second dwell regions $VB_2$ for a second dwell time when the guiding of the electron beam and/or the ion beam along the second dwell regions $VB_2$ of the second scan line $RL_2$ is provided. Moreover, the electron beam and/or the ion beam remain/remains at each of the third dwell regions $VB_3$ for a third dwell time when the guiding of the electron beam and/or the ion beam along the third dwell regions $VB_3$ of the third scan line $RL_3$ is provided. Also, the electron beam and/or the ion beam remain/remains at each of the fourth dwell regions $VB_4$ for a fourth dwell time when the guiding of the electron beam and/or the ion beam along the fourth dwell regions $VB_4$ of the fourth scan line $RL_4$ is provided.

The first dwell time and the second dwell time are chosen using the control device 123, in such a way that the first dwell time is shorter than the second dwell time. Moreover, the third dwell time is chosen using the control device 123, in such a way that the second dwell time is shorter than the third dwell time. Further, the fourth dwell time is chosen using the control device 123, in such a way that the third dwell time is shorter than the fourth dwell time. The closer the region of interest 504 is to the scan line, the longer the dwell time becomes. For example, the first dwell time can be chosen to be so much shorter than the second dwell time that the guiding of the electron beam and/or the ion beam along the first scan line $RL_1$ and the guiding of the electron beam and/or the ion beam along the second scan line $RL_2$ take the same time or take substantially the same time. In other words, the guiding of the electron beam and/or the ion beam along the first scan line $RL_1$ is provided over a first time period. Further, the guiding of the electron beam and/or the ion beam along the second scan line $RL_2$ is provided over a second time period. The first time period and the second time period are the same or substantially the same. In a further embodiment, the first dwell time and the second dwell time are chosen such that the first time period is shorter than the second time period. The aforementioned properties regarding the first scan line $RL_1$ in relation to the second scan line $RL_2$ also apply accordingly to the second scan line $RL_2$ in relation to the third scan line $RL_3$, and/or also to the third scan line $RL_3$ in relation to the fourth scan line $RL_4$.

In an embodiment, provision is additionally or alternatively made for a dwell time, which lies in a range from 1 ns to 5 s, to be used as the first dwell time. In addition or in an alternative thereto, a dwell time, which lies in a range from 1 ns to 5 s, is used as the second dwell time. As yet a further addition or alternative thereto, a dwell time, which lies in a range from 1 ns to 5 s, is used as the third dwell time. Further, in addition or in an alternative thereto, a dwell time, which lies in a range from 1 ns to 5 s, is used as the fourth dwell time.

A further embodiment additionally or alternatively provides for a dwell time to be used as the second dwell time at each dwell region of the second dwell regions, to which the following applies:

$$t_2 = \frac{d_1}{d_2} \cdot t_1$$

where $t_1$ denotes the first dwell time at each dwell region of the first dwell regions, $t_2$ denotes the second dwell time at each dwell region of the second dwell regions, $d_1$ denotes a first diameter of the circle formed by the first scan line $RL_1$, and $d_2$ denotes a second diameter of the second circle formed by the second scan line $RL_2$. FIG. 8 shows the radii $A_1$ to $A_4$ (also referred to as region spacings further below) of the corresponding circles, with the diameters emerging from the radii $A_1$ to $A_4$. This is discussed in more detail further below. The aforementioned ratio of the first dwell time to the second dwell time also applies accordingly to the ratio of the second dwell time to the third dwell time, and/or to the ratio of the third dwell time to the fourth dwell time. In other words, a dwell time at a dwell region of any desired scan line of the scan lines $RL_1$ to $RL_4$ can be determined as follows:

$$t_{n+1} = \frac{d_n}{d_{n+1}} \cdot t_n$$

where n is an integer, to which the following applies: $1 \le n \le 4$, where $t_n$ denotes the dwell time at each dwell region of the n-th scan line, $t_{n+1}$ denotes the dwell time at each dwell region of the (n+1)-th scan line, $d_n$ denotes a diameter of the circle formed by the n-th scan line, and $d_{n+1}$ denotes a diameter of the circle formed by the (n+1)-th scan line.

A further embodiment additionally or alternatively provides for a dwell time to be used as the second dwell time at each dwell region of the second dwell regions, to which the following applies:

$$t_2 = \frac{IA_1}{IA_2} \cdot t_1$$

where $t_1$ denotes the first dwell time at each dwell region of the first dwell regions, $t_2$ denotes the second dwell time at each dwell region of the second dwell regions, $IA_1$ denotes a first internal spacing between two opposite sides of the first geometric shape formed by the first scan line $RL_1$, and $IA_2$ denotes a second internal spacing between two opposite sides of the second geometric shape formed by the second scan line $RL_2$. The aforementioned ratio of the first dwell time to the second dwell time also applies accordingly to the ratio of the second dwell time to the third dwell time, and/or to the ratio of the third dwell time to the fourth dwell time. In other words, a dwell time at a dwell region of any desired scan line of the scan lines $RL_1$ to $RL_4$ can be determined as follows:

$$t_{n+1} = \frac{IA_n}{IA_{n+1}} \cdot t_n$$

where n is an integer, to which the following applies: $1 \le n \le 4$, where $t_n$ denotes the dwell time at each dwell region of the n-th scan line, $t_{n+1}$ denotes the dwell time at each dwell region of the (n+1)-th scan line, $IA_n$ denotes an internal spacing between two opposite sides of the geometric shape formed by the n-th scan line, and $IA_{n+1}$ denotes an internal spacing between two opposite sides of the geometric shape formed by the (n+1)-th scan line. By way of example, FIG. 9 plots the internal spacing $IA_4$ of the fourth scan line $RL_4$. Corresponding statements apply to the further scan lines $RL_1$ to $RL_3$.

In an embodiment of the method according to the system described herein, provision is additionally or alternatively made for a dwell time to be used as the second dwell time at each dwell region of the second dwell regions, to which the following applies:

$$t_2 = \frac{L_1}{L_2} \cdot t_1$$

where $t_1$ denotes the first dwell time at each dwell region of the first dwell regions, $t_2$ denotes the second dwell time at each dwell region of the second dwell regions, $L_1$ denotes a first length of the first geometric shape formed by the first scan line, and $L_2$ denotes a second length of the second geometric shape formed by the second scan line. In other words, a dwell time at each dwell region of any desired scan line can be determined as follows:

$$t_{n+1} = \frac{L_n}{L_{n+1}} \cdot t_n$$

where $t_n$ denotes the dwell time at each dwell region of the n-th scan line, $t_{n+1}$ denotes the dwell time at each dwell region of the (n+1)-th scan line, $L_n$ denotes a length of the geometric shape formed by the n-th scan line, and $L_{n+1}$ denotes a diameter of the geometric shape formed by the (n+1)-th scan line. Using the aforementioned formula, it is also possible to determine the dwell times at the respective dwell regions of the respective scan lines such that the particle beam remains the same time in each scan line.

For example, the above-described embodiments ensure that, in a final method step (for example, when the guiding of the electron beam and/or the ion beam along the fourth scan line $RL_4$ is provided), the electron beam and/or the ion beam is guided along the scan line arranged closest to the region of interest 504 (for example, the fourth scan line $RL_4$) at a speed which allows the method step to be observed closely and an intervention where necessary (in particular by a manual termination of the method), in order for example to avoid a possible destruction of a tip to be created and/or to implement further settings of the electron beam and/or the ion beam which are possibly desired (for example a renewed focusing of the electron beam and/or the ion beam on the region of interest 504).

Figure 8A:
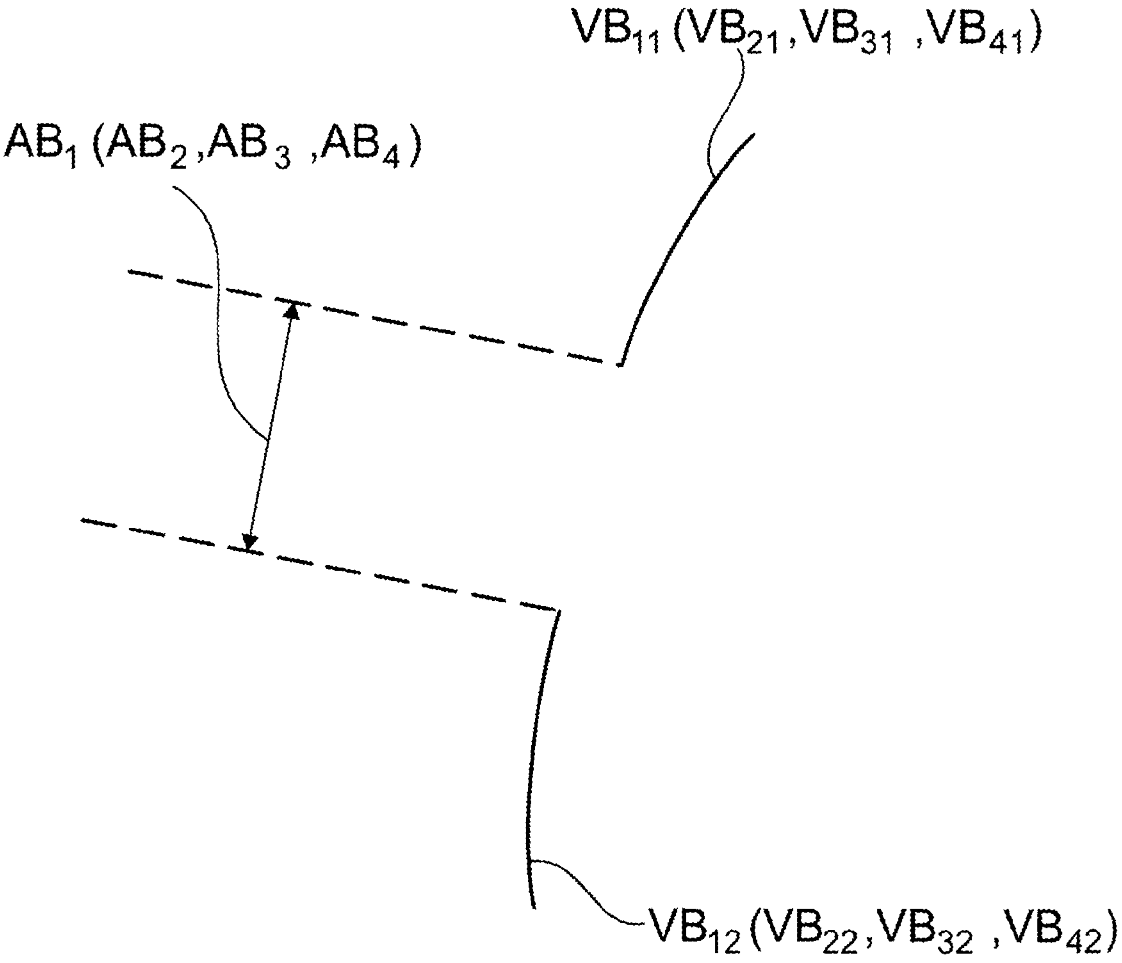
FIG. 8A shows a schematic illustration of two dwell regions.

In addition or in an alternative, the method provides for a first region (for example the dwell region $VB_{11}$) of the first dwell regions $VB_1$ to be chosen when the guiding of the electron beam and/or the ion beam along the first dwell regions $VB_1$ of the first scan line $RL_1$ is provided, in such a way that the first region (for example the dwell region $VB_{11}$) of the first dwell regions $VB_1$ has a first spacing $AB_1$ with respect to a closest arranged adjacent second region (for example the dwell region $VB_{12}$) of the first dwell regions $VB_1$ (cf. FIG. 8A). Further, a first region (for example the dwell region $VB_{21}$) of the second dwell regions $VB_2$ is chosen when the guiding of the electron beam and/or the ion beam along the second dwell regions $VB_2$ of the second scan line $RL_2$ is provided, in such a way that the first region (for example the dwell region $VB_{21}$) of the second dwell regions $VB_2$ has a second spacing $AB_2$ with respect to a closest arranged adjacent second region (for example the dwell region $VB_{22}$) of the second dwell regions $VB_2$ (cf. FIG. 8A). Moreover, a first region (for example the dwell region $VB_{31}$) of the third dwell regions $VB_3$ is chosen when the guiding of the electron beam and/or the ion beam along the third dwell regions $VB_3$ of the third scan line $RL_3$ is provided, in such a way that the first region (for example the dwell region $VB_{31}$) of the third dwell regions $VB_3$ has a third spacing $AB_3$ with respect to a closest arranged adjacent second region (for example the dwell region $VB_{32}$) of the third dwell regions $VB_3$ (cf. FIG. 8A). Also, a first region (for example the dwell region $VB_{41}$) of the fourth dwell regions $VB_4$ is chosen when the guiding of the electron beam and/or the ion beam along the fourth dwell regions $VB_4$ of the fourth scan line $RL_4$ is provided, in such a way that the first region (for example the dwell region $VB_{41}$) of the fourth dwell regions $VB_4$ has a fourth spacing $AB_4$ with respect to a closest arranged adjacent second region (for example the dwell region $VB_{42}$) of the fourth dwell regions $VB_4$ (cf. FIG. 8A). The spacing of a first region of the dwell regions with respect to a closest arranged adjacent second region of the dwell regions is for example the length of the shortest straight line interconnecting a first point of the first region and a second point of the second region. The second spacing is smaller than the first spacing. Further, the third spacing is smaller than the second spacing. Moreover, the fourth spacing is smaller than the third spacing. The closer the scan line is arranged to the region of interest 504, the smaller is the spacing of a first region of the respective dwell regions of the scan line with respect to a closest arranged adjacent second region of the respective dwell regions of the scan line. This embodiment also has the aforementioned advantages.

In yet a further embodiment, provision is additionally or alternatively made for a spacing to be used as the first spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is additionally or alternatively made for a spacing to be used as the second spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is made in a further addition or alternative for a spacing to be used as the third spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Further, provision is additionally or alternatively made for a spacing to be used as the fourth spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm.

As yet a further addition or alternative, provision is made that the guiding of the electron beam and/or the ion beam along the first scan line $RL_1$, the second scan line $RL_2$, the third scan line $RL_3$, and/or the fourth scan line $RL_4$ is provided only after clearance has been given by a user and/or by the control device 123 of the combination apparatus 200. This embodiment provides a very good option for monitoring and/or controlling the method. This embodiment therefore also allows a close observation of a method step, in particular a last method step, with the result that there is the option of modifying and/or terminating the performed method when necessary.

Figure 7A:
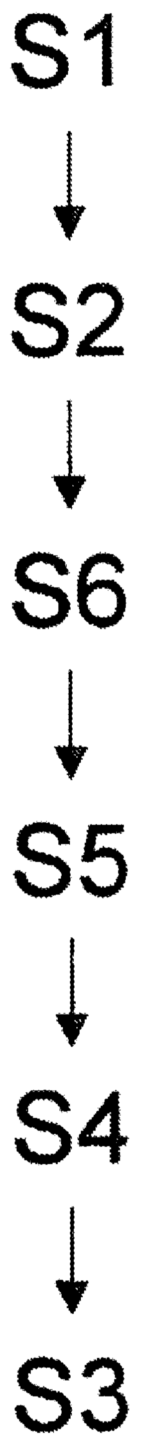
FIG. 7A shows a schematic illustration of a procedure of a second embodiment of a method according to the system described herein.

Explicit reference is made to the fact that the invention is not restricted to the sequence of the method steps S1 to S6 depicted in FIG. 7. Rather, any sequence of the method steps S1 to S6 suitable for the invention can be chosen. Additionally, at least two of the method steps S1 to S6 can be carried out in parallel with one another. Additionally, provision is for example made for the electron beam and/or the ion beam to be initially guided along the first scan line $RL_1$, then subsequently along the second scan line $RL_2$, then subsequently along the third scan line $RL_3$, and then subsequently along the fourth scan line $RL_4$ in the aforementioned embodiments. In an alternative thereto, provision is made for the electron beam and/or the ion beam to be initially guided along the fourth scan line $RL_4$, then subsequently along the third scan line $RL_3$, then subsequently along the second scan line $RL_2$, and then subsequently along the first scan line $RL_1$ in the aforementioned embodiments (cf. FIG. 7A). In other words, the electron beam and/or the ion beam can be guided along the scan lines $RL_1$ to $RL_4$ in the direction of the region of interest 504 or in an opposite direction to the region of interest 504.

In an embodiment, provision is alternatively made for the electron beam and/or the ion beam to remain at each of the first dwell regions $VB_1$ for a first dwell time when the guiding of the electron beam and/or the ion beam along the first dwell regions $VB_1$ of the first scan line $RL_1$ is provided. Further, the electron beam and/or the ion beam remain/remains at each of the second dwell regions $VB_2$ for a second dwell time when the guiding of the electron beam and/or the ion beam along the second dwell regions $VB_2$ of the second scan line $RL_2$ is provided. Moreover, the electron beam and/or the ion beam remain/remains at each of the third dwell regions $VB_3$ for a third dwell time when the guiding of the electron beam and/or the ion beam along the third dwell regions $VB_3$ of the third scan line $RL_3$ is provided. Also, the electron beam and/or the ion beam remain/remains at each of the fourth dwell regions $VB_4$ for a fourth dwell time when the guiding of the electron beam and/or the ion beam along the fourth dwell regions $VB_4$ of the fourth scan line $RL_4$ is provided. The first dwell time, the second dwell time, the third dwell time, and the fourth dwell time are chosen to be identical, more particularly constant, using the control device 123. In other words, the first dwell time, the second dwell time, the third dwell time, and the fourth dwell time are identical or substantially identical. For example, the first dwell time, the second dwell time, the third dwell time, and/or the fourth dwell time are/is chosen such that at least one of the aforementioned dwell times lies in a range from 1 ns to 5 s. The guiding of the electron beam and/or the ion beam is provided according to the following sequence: The electron beam and/or the ion beam are/is guided along the first scan line $RL_1$, then subsequently along the second scan line $RL_2$, then subsequently along the third scan line $RL_3$, and then subsequently along the fourth scan line $RL_4$. The guiding of the electron beam and/or the ion beam along the second scan line $RL_2$ is provided after or upon the elapse of a first time interval that follows the guiding of the electron beam and/or the ion beam along the first scan line $RL_1$, with the first time interval being specified by the control device 123. The guiding of the electron beam and/or the ion beam along the third scan line $RL_3$ is provided after or upon the elapse of a second time interval that follows the guiding of the particle beam along the second scan line $RL_2$, with the second time interval being specified by the control device 123. Further, the guiding of the electron beam and/or the ion beam along the fourth scan line $RL_4$ is provided after or upon the elapse of a third time interval that follows the guiding of the particle beam along the third scan line $RL_3$, with the third time interval being specified by the control device 123. The first time interval is shorter than the second time interval. Further, the second time interval is shorter than the third time interval. By way of example, each of the aforementioned time intervals lies in a range between 50 μs and 1 s. However, the invention is not restricted to this range. Rather, any range suitable for the invention can be used. Further, provision is for example made that the guiding of the electron beam and/or the ion beam along the first scan line $RL_1$, along the second scan line $RL_2$, along the third scan line $RL_3$, and/or along the fourth scan line $RL_4$ is provided only after clearance has been given by a user and/or by the control device 123 of the combination apparatus 200.

The above-described embodiment ensures that a waiting time (i.e., one of the aforementioned time intervals) between the guiding of the electron beam and/or the ion beam along one of the scan lines $RL_1$ to $RL_4$ and the guiding of the electron beam and/or the ion beam along a further one of the scan lines $RL_1$ to $RL_4$ increases in the direction of the determined region 504. By way of example, this case also ensures that a final method step is closely observable. Hence there is the option of intervening when necessary (for example by manually terminating the method), in order for example to avoid a possible destruction of a tip to be created and/or implement further settings of the electron beam and/or the ion beam which are possibly desired. By way of example, provision is made for the electron beam and/or the ion beam to be guided away from the object 125 during at least one of the aforementioned time intervals. In other words, the electron beam and/or the ion beam are/is deflected in such a way that they/it no longer strike/strikes the object 125. By way of example, the electron beam and/or the ion beam are/is guided to the beam stop unit 505. In addition or in an alternative thereto, provision is made for the electron beam and/or the ion beam to be guided during at least one of the aforementioned time intervals to a certain position of the object 125, which is used as a park position for the electron beam and/or the ion beam. In addition or in an alternative thereto, provision is made for the electron beam and/or the ion beam to be guided during at least one of the aforementioned time intervals along the scan line of the scan lines $RL_1$ to $RL_4$ along which the electron beam and/or the ion beam were/was guided last.

In an embodiment, provision is alternatively made for the guiding of the electron beam and/or the ion beam to be provided in the following sequence: The electron beam and/or the ion beam are/is guided along the fourth scan line $RL_4$, then subsequently along the third scan line $RL_3$, then subsequently along the second scan line $RL_2$, and then subsequently along the first scan line $RL_1$. The electron beam and/or the ion beam remain/remains at each of the fourth dwell regions $VB_4$ for a fourth dwell time when the guiding of the electron beam and/or the ion beam along the fourth dwell regions $VB_4$ of the fourth scan line $RL_4$ is provided. Further, the electron beam and/or the ion beam remain/remains at each of the third dwell regions $VB_3$ for a third dwell time when the guiding of the electron beam and/or the ion beam along the third dwell regions $VB_3$ of the third scan line $RL_3$ is provided. Moreover, the electron beam and/or the ion beam remain/remains at each of the second dwell regions $VB_2$ for a second dwell time when the guiding of the electron beam and/or the ion beam along the second dwell regions $VB_2$ of the second scan line $RL_2$ is provided. Also, the electron beam and/or the ion beam remain/remains at each of the first dwell regions $VB_1$ for a first dwell time when the guiding of the electron beam and/or the ion beam along the first dwell regions $VB_1$ of the first scan line $RL_1$ is provided. The first dwell time, the second dwell time, the third dwell time, and the fourth dwell time are chosen to be identical, more particularly constant, using the control device 123. In other words, the first dwell time, the second dwell time, the third dwell time, and the fourth dwell time are identical or substantially identical. For example, the first dwell time, the second dwell time, the third dwell time, and/or the fourth dwell time are/is chosen such that at least one of the aforementioned dwell times lies in a range from 1 ns to 5 s. The guiding of the electron beam and/or the ion beam along the third scan line $RL_3$ is provided after or upon the elapse of a first time interval that follows the guiding of the electron beam and/or the ion beam along the fourth scan line $RL_4$, with the first time interval being specified by the control device 123. The guiding of the electron beam and/or the ion beam along the second scan line $RL_2$ is provided after or upon the elapse of a second time interval that follows the guiding of the particle beam along the third scan line $RL_3$, with the second time interval being specified by the control device 123. Further, the guiding of the electron beam and/or the ion beam along the first scan line $RL_1$ is provided after or upon the elapse of a third time interval that follows the guiding of the particle beam along the second scan line $RL_2$, with the third time interval being specified by the control device 123. The first time interval is longer than the second time interval. Further, the second time interval is longer than the third time interval. By way of example, each of the aforementioned time intervals lies in a range between 50 μs and 1 s. However, the invention is not restricted to this range. Rather, any range suitable for the invention can be used. Further, provision is for example made that the guiding of the electron beam and/or the ion beam along the first scan line $RL_1$, along the second scan line $RL_2$, along the third scan line $RL_3$, and/or along the fourth scan line $RL_4$ is provided only after clearance has been given by a user and/or by the control device 123 of the combination apparatus 200.

The above-described embodiment also ensures that a waiting time (i.e., one of the aforementioned time intervals) between the guiding of the electron beam and/or the ion beam along one of the scan lines $RL_1$ to $RL_4$ and the guiding of the electron beam and/or the ion beam along a further one of the scan lines $RL_1$ to $RL_4$ decreases in an opposite direction to the determined region 504. By way of example, this case also ensures that a final method step is closely observable. Hence there is the option of intervening when necessary (for example by manually terminating the method), in order for example to avoid a possible destruction of a tip to be created and/or implement further settings of the electron beam and/or the ion beam which are possibly desired. By way of example, provision is made for the electron beam and/or the ion beam to be guided away from the object 125 during at least one of the aforementioned time intervals. In other words, the electron beam and/or the ion beam are/is deflected in such a way that they/it no longer strike/strikes the object 125. By way of example, the electron beam and/or the ion beam are/is guided to the beam stop unit 505. In addition or in an alternative thereto, provision is made for the electron beam and/or the ion beam to be guided during at least one of the aforementioned time intervals to a certain position of the object 125, which is used as a park position for the electron beam and/or the ion beam. In addition or in an alternative thereto, provision is made for the electron beam and/or the ion beam to be guided during at least one of the aforementioned time intervals along the scan line of the scan lines $RL_1$ to $RL_4$ along which the electron beam and/or the ion beam were/was guided last.

In a further embodiment, provision is made for the guiding of the electron beam and/or the ion beam to be provided in the following sequence: The electron beam and/or the ion beam are/is guided along the first scan line $RL_1$, then subsequently along the second scan line $RL_2$, then subsequently along the third scan line $RL_3$, and then subsequently along the fourth scan line $RL_4$. A first region of the first dwell regions $VB_1$ is chosen when the guiding of the electron beam and/or the ion beam along the first dwell regions $VB_1$ of the first scan line $RL_1$ is provided, in such a way that the first region of the first dwell regions $VB_1$ has a first spacing with respect to a closest arranged adjacent second region of the first dwell regions $VB_1$. Further, a first region of the second dwell regions $VB_2$ is chosen when the guiding of the electron beam and/or the ion beam along the second dwell regions $VB_2$ of the second scan line $RL_2$ is provided, in such a way that the first region of the second dwell regions $VB_2$ has a second spacing with respect to a closest arranged adjacent second region of the second dwell regions $VB_2$. Moreover, a first region of the third dwell regions $VB_3$ is chosen when the guiding of the electron beam and/or the ion beam along the third dwell regions $VB_3$ of the third scan line $RL_3$ is provided, in such a way that the first region of the third dwell regions $VB_3$ has a third spacing with respect to a closest arranged adjacent second region of the third dwell regions $VB_3$. Also, a first region of the fourth dwell regions $VB_4$ is chosen when the guiding of the electron beam and/or the ion beam along the fourth dwell regions $VB_4$ of the fourth scan line $RL_4$ is provided, in such a way that the first region of the fourth dwell regions $VB_4$ has a fourth spacing with respect to a closest arranged adjacent second region of the fourth dwell regions $VB_4$. The spacing of a first region of the dwell regions with respect to a closest arranged adjacent second region of the dwell regions is for example the length of the shortest straight line interconnecting a first point in the aforementioned first region and a second point in the aforementioned second region. The first spacing, the second spacing, the third spacing and the fourth spacing are chosen to be identical, more particularly constant, using the control device 123. In other words, the first spacing, the second spacing, the third spacing, and the fourth spacing are identical or substantially identical. For example, provision is made for a spacing to be used as the first spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is additionally or alternatively made for a spacing to be used as the second spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is made in a further addition or alternative for a spacing to be used as the third spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Further, provision is additionally or alternatively made for a spacing to be used as the fourth spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. The guiding of the electron beam and/or the ion beam along the second scan line $RL_2$ is provided after or upon the elapse of a first time interval that follows the guiding of the electron beam and/or the ion beam along the first scan line $RL_1$, with the first time interval being specified by the control device 123. The guiding of the electron beam and/or the ion beam along the third scan line $RL_3$ is provided after or upon the elapse of a second time interval that follows the guiding of the electron beam and/or the ion beam along the second scan line $RL_2$, with the second time interval being specified by the control device 123. Further, the guiding of the electron beam and/or the ion beam along the fourth scan line $RL_4$ is provided after or upon the elapse of a third time interval that follows the guiding of the electron beam and/or the ion beam along the third scan line $RL_3$, with the third time interval being specified by the control device 123. The first time interval is shorter than the second time interval. Further, the second time interval is shorter than the third time interval. By way of example, each of the aforementioned time intervals lies in a range between 50 μs and 1 s. However, the invention is not restricted to this range. Rather, any range suitable for the invention can be used. Further, provision is for example made that the guiding of the electron beam and/or the ion beam along the first scan line $RL_1$, along the second scan line $RL_2$, along the third scan line $RL_3$, and/or along the fourth scan line $RL_4$ is provided only after clearance has been given by a user and/or by the control device 123 of the combination apparatus 200.

The above-described embodiment also ensures that a waiting time (i.e., one of the aforementioned time intervals) between the guiding of the electron beam and/or the ion beam along one of the scan lines $RL_1$ to $RL_4$ and the guiding of the electron beam and/or the ion beam along a further one of the scan lines $RL_1$ to $RL_4$ increases in the direction of the determined region 504. By way of example, this case also ensures that a final method step is closely observable. Hence there is the option of intervening when necessary (for example by manually terminating the method), in order for example to avoid a possible destruction of a tip to be created and/or implement further settings of the electron beam and/or the ion beam which are possibly desired. By way of example, provision is made for the electron beam and/or the ion beam to be guided away from the object 125 during at least one of the aforementioned time intervals. In other words, the electron beam and/or the ion beam are/is deflected in such a way that the electron beam and/or the ion beam no longer strike/strikes the object 125. By way of example, the electron beam and/or the ion beam are/is guided to the beam stop unit 505. In addition or in an alternative thereto, provision is made for the electron beam and/or the ion beam to be guided during at least one of the aforementioned time intervals to a certain position of the object 125, which is used as a park position for the electron beam and/or the ion beam. In addition or in an alternative thereto, provision is made for the electron beam and/or the ion beam to be guided during at least one of the aforementioned time intervals along the scan line of the scan lines $RL_1$ to $RL_4$ along which the electron beam and/or the ion beam were/was guided last.

In yet a further embodiment, provision is made for the guiding of the electron beam and/or the ion beam to be provided in the following sequence: The electron beam and/or the ion beam are/is guided along the fourth scan line $RL_4$, then subsequently along the third scan line $RL_3$, then subsequently along the second scan line $RL_2$, and then subsequently along the first scan line $RL_1$. A first region of the first dwell regions $VB_1$ is chosen when the guiding of the electron beam and/or the ion beam along the first dwell regions $VB_1$ of the first scan line $RL_1$ is provided, in such a way that the first region of the first dwell regions $VB_1$ has a first spacing with respect to a closest arranged adjacent second region of the first dwell regions $VB_1$. Further, a first region of the second dwell regions $VB_2$ is chosen when the guiding of the electron beam and/or the ion beam along the second dwell regions $VB_2$ of the second scan line $RL_2$ is provided, in such a way that the first region of the second dwell regions $VB_2$ has a second spacing with respect to a closest arranged adjacent second region of the second dwell regions $VB_2$. Moreover, a first region of the third dwell regions $VB_3$ is chosen when the guiding of the electron beam and/or the ion beam along the third dwell regions $VB_3$ of the third scan line $RL_3$ is provided, in such a way that the first region of the third dwell regions $VB_3$ has a third spacing with respect to a closest arranged adjacent second region of the third dwell regions $VB_3$. Also, a first region of the fourth dwell regions $VB_4$ is chosen when the guiding of the electron beam and/or the ion beam along the fourth dwell regions $VB_4$ of the fourth scan line $RL_4$ is provided in such a way that the first region of the fourth dwell regions $VB_4$ has a fourth spacing with respect to a closest arranged adjacent second region of the fourth dwell regions $VB_4$. The spacing of a first region of the dwell regions with respect to a closest arranged adjacent second region of the dwell regions is for example the length of the shortest straight line interconnecting a first point in the aforementioned first region and a second point in the second region. The first spacing, the second spacing, the third spacing and the fourth spacing are chosen to be identical, more particularly constant, using the control device 123. In other words, the first spacing, the second spacing, the third spacing, and the fourth spacing are identical or substantially identical. For example, provision is made for a spacing to be used as the first spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is additionally or alternatively made for a spacing to be used as the second spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Provision is made in a further addition or alternative for a spacing to be used as the third spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. Further, provision is additionally or alternatively made for a spacing to be used as the fourth spacing, which is less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm. The guiding of the electron beam and/or the ion beam along the third scan line $RL_3$ is provided after or upon the elapse of a first time interval that follows the guiding of the electron beam and/or the ion beam along the fourth scan line $RL_4$, with the first time interval being specified by the control device 123. The guiding of the electron beam and/or the ion beam along the second scan line $RL_2$ is provided after or upon the elapse of a second time interval that follows the guiding of the electron beam and/or the ion beam along the third scan line $RL_3$, with the second time interval being specified by the control device 123. Further, the guiding of the electron beam and/or the ion beam along the first scan line $RL_1$ is provided after or upon the elapse of a third time interval that follows the guiding of the electron beam and/or the ion beam along the second scan line $RL_2$, with the third time interval being specified by the control device 123. The first time interval is longer than the second time interval. Further, the second time interval is longer than the third time interval. By way of example, each of the aforementioned time intervals lies in a range between 50 μs and 1 s. However, the invention is not restricted to this range. Rather, any range suitable for the invention can be used. Further, provision is for example made that the guiding of the electron beam and/or the ion beam along the first scan line $RL_1$, along the second scan line $RL_2$, along the third scan line $RL_3$, and/or along the fourth scan line $RL_4$ is provided only after clearance has been given by a user and/or by the control device 123 of the combination apparatus 200.

The above-described embodiment also ensures that a waiting time (i.e., one of the aforementioned time intervals) between the guiding of the electron beam and/or the ion beam along one of the scan lines $RL_1$ to $RL_4$ and the guiding of the electron beam and/or the ion beam along a further one of the scan lines $RL_1$ to $RL_4$ decreases in an opposite direction to the determined region 504. By way of example, this case also ensures that a final method step is closely observable. Hence there is the option of intervening when necessary (for example by manually terminating the method), in order for example to avoid a possible destruction of a tip to be created and/or implement further settings of the electron beam and/or the ion beam which are possibly desired. By way of example, provision is made for the electron beam and/or the ion beam to be guided away from the object 125 during at least one of the aforementioned time intervals. In other words, the electron beam and/or the ion beam are/is deflected in such a way that the electron beam and/or the ion beam no longer strike/strikes the object 125. By way of example, the electron beam and/or the ion beam are/is guided to the beam stop unit 505. In addition or in an alternative thereto, provision is made for the electron beam and/or the ion beam to be guided during at least one of the aforementioned time intervals to a certain position of the object 125, which is used as a park position for the electron beam and/or the ion beam. In addition or in an alternative thereto, provision is made for the electron beam and/or the ion beam to be guided during at least one of the aforementioned time intervals along the scan line of the scan lines $RL_1$ to $RL_4$ along which the electron beam and/or the ion beam were/was guided last.

As evident from FIG. 8, one embodiment provides for the first dwell regions $VB_1$ to have a first region spacing $A_1$ from the determined region 504. Further, the second dwell regions $VB_2$ have a second region spacing $A_2$ from the determined region 504. Moreover, the third dwell regions $VB_3$ have a third region spacing $A_3$ from the determined region 504. Further, the fourth dwell regions $VB_4$ have a fourth region spacing $A_4$ from the determined region 504. The first region spacing $A_1$ and the second region spacing $A_2$ are chosen such that the first region spacing $A_1$ is greater than the second region spacing $A_2$. Further, the third region spacing $A_3$ is chosen such that the second region spacing $A_2$ is greater than the third region spacing $A_3$. Moreover, the fourth region spacing $A_4$ is chosen such that the third region spacing $A_3$ is greater than the fourth region spacing $A_4$. In the embodiment depicted in FIG. 8, the scan lines $RL_1$ to $RL_4$ are in the form of concentric circles. The radii of the scan lines $RL_1$ to $RL_4$ form the associated corresponding region spacings $A_1$ to $A_4$ of the dwell regions $VB_1$ to $VB_4$ of the scan lines $RL_1$ to $RL_4$.

Also in the embodiment shown in FIG. 9, provision is made for a region of the first dwell regions $VB_1$ to have a first region spacing $A_1$ from the determined region 504. Further, a region of the second dwell regions $VB_2$ has a second region spacing $A_2$ from the determined region 504. Moreover, a region of the third dwell regions $VB_3$ has a third region spacing $A_3$ from the determined region 504. Further, a region of the fourth dwell regions $VB_4$ has a fourth region spacing $A_4$ from the determined region 504. For example, an aforementioned region spacing for a specific region of a dwell region of the aforementioned dwell regions $VB_1$ to $VB_4$ is the shortest distance of all distances of the regions of the specific dwell region from the determined region 504. In the embodiment depicted in FIG. 9, too, the first region spacing $A_1$ and the second region spacing $A_2$ are chosen such that the first region spacing $A_1$ is greater than the second region spacing $A_2$. Further, the third region spacing $A_3$ is chosen such that the second region spacing $A_2$ is greater than the third region spacing $A_3$. Moreover, the fourth region spacing $A_4$ is chosen such that the third region spacing $A_3$ is greater than the fourth region spacing $A_4$.

Figure 10:
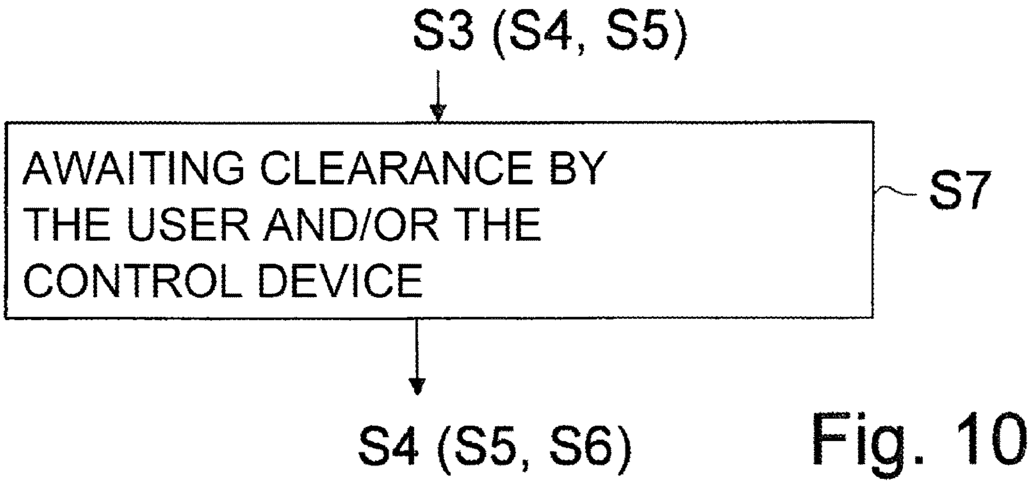
FIG. 10 shows a schematic illustration of a procedure of a third embodiment of a method according to the system described herein.

As explained above, an embodiment of the system described herein, in which the electron beam and/or the ion beam are/is initially guided along the first scan line $RL_1$, then along the second scan line $RL_2$, then along the third scan line $RL_3$, and then along the fourth scan line $RL_4$, can provide for a guiding of the electron beam and/or the ion beam from one scan line of the aforementioned scan lines $RL_1$ to $RL_4$ to a next scan line of the scan lines $RL_1$ to $RL_4$ to be provided only once clearance has been given by the user and/or the control device 123. This is illustrated in FIG. 10, for example. In particular, provision is thus made that the guiding of the electron beam and/or the ion beam along the first scan line $RL_1$ (method step S3) is provided until the clearance for the guiding of the electron beam and/or the ion beam along the second scan line $RL_2$ is given by the user and/or by the control device 123 (method step S7). Only then are/is the electron beam and/or the ion beam guided along the second scan line $RL_2$ (method step S4). The same also applies to the further scan lines. The electron beam and/or the ion beam are/is guided along the second scan line $RL_2$ until the clearance for the guiding of the electron beam and/or the ion beam along the third scan line $RL_3$ is given by the user and/or by the control device 123 (method step S7). Only then are/is the electron beam and/or the ion beam guided along the third scan line $RL_3$ (method step S5). The electron beam and/or the ion beam are/is guided along the third scan line $RL_3$ (method step S5) until the clearance for the guiding of the electron beam and/or the ion beam along the fourth scan line $RL_4$ is given by the user and/or by the control device 123 (method step S7). Only then are/is the electron beam and/or the ion beam guided along the fourth scan line $RL_4$ (method step S6).

Figure 11:
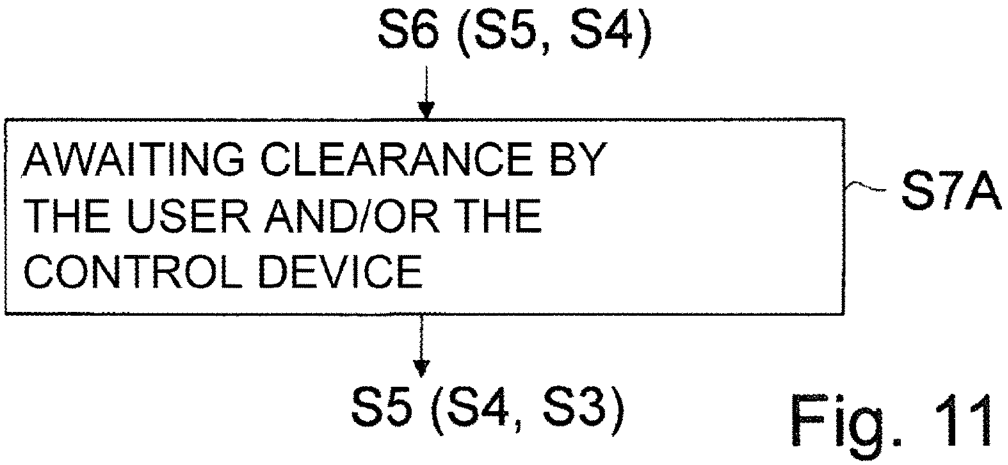
FIG. 11 shows a schematic illustration of a procedure of a fourth embodiment of a method according to the system described herein.

As explained above, an embodiment of the system described herein, in which the electron beam and/or the ion beam are/is initially guided along the fourth scan line $RL_4$, then along the third scan line $RL_3$, then along the second scan line $RL_2$, and then along the first scan line $RL_1$, can provide for a guiding of the electron beam and/or the ion beam from one scan line of the aforementioned scan lines $RL_1$ to $RL_4$ to a next scan line of the scan lines $RL_1$ to $RL_4$ to be provided only once clearance has been given by the user and/or by the control device 123. This is illustrated in FIG. 11, for example. In particular, provision is thus that the guiding of the electron beam and/or the ion beam along the fourth scan line $RL_4$ (method step S6) is provided until the clearance for the guiding of the electron beam and/or the ion beam along the third scan line $RL_3$ is given by the user and/or by the control device 123 (method step S7A). Only then are/is the electron beam and/or the ion beam guided along the third scan line $RL_3$ (method step S5). The same also applies to the further scan lines. The electron beam and/or the ion beam are/is guided along the third scan line $RL_3$ until the clearance for the guiding of the electron beam and/or the ion beam along the second scan line $RL_2$ is given by the user and/or the control device 123 (method step S7A). Only then are/is the electron beam and/or the ion beam guided along the second scan line $RL_2$ (method step S4). The electron beam and/or the ion beam are/is guided along the second scan line $RL_2$ (method step S4) until the clearance for the guiding of the electron beam and/or the ion beam along the first scan line $RL_1$ is given by the user and/or by the control device 123 (method step S7A). Only then are/is the electron beam and/or the ion beam guided along the first scan line $RL_1$ (method step S3).

Figure 12:
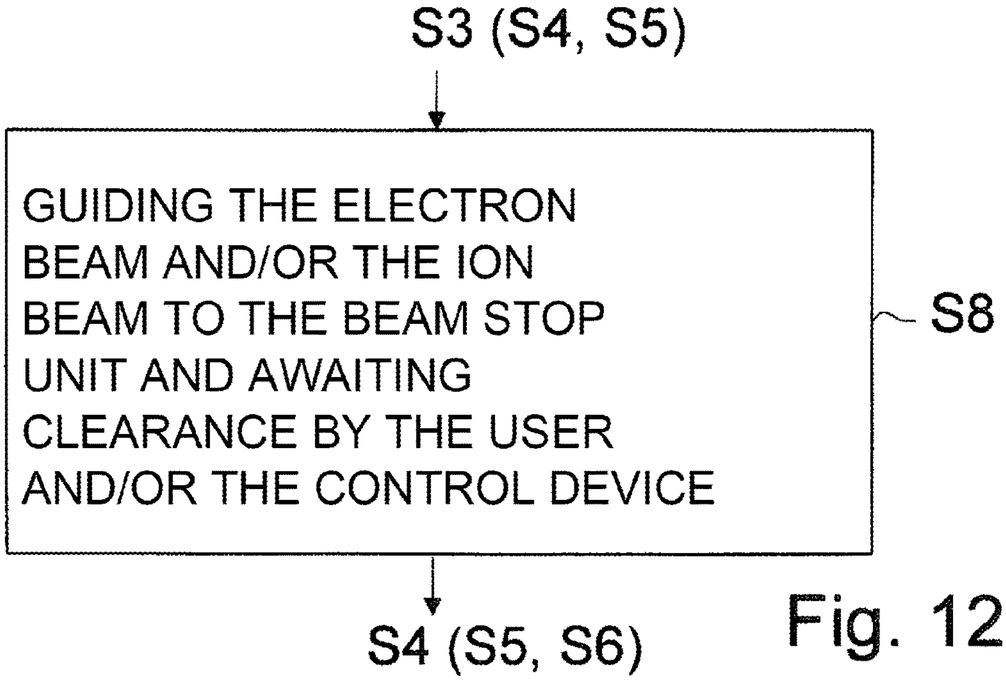
FIG. 12 shows a schematic illustration of a procedure of a fifth embodiment of a method according to the system described herein.
Figure 13:
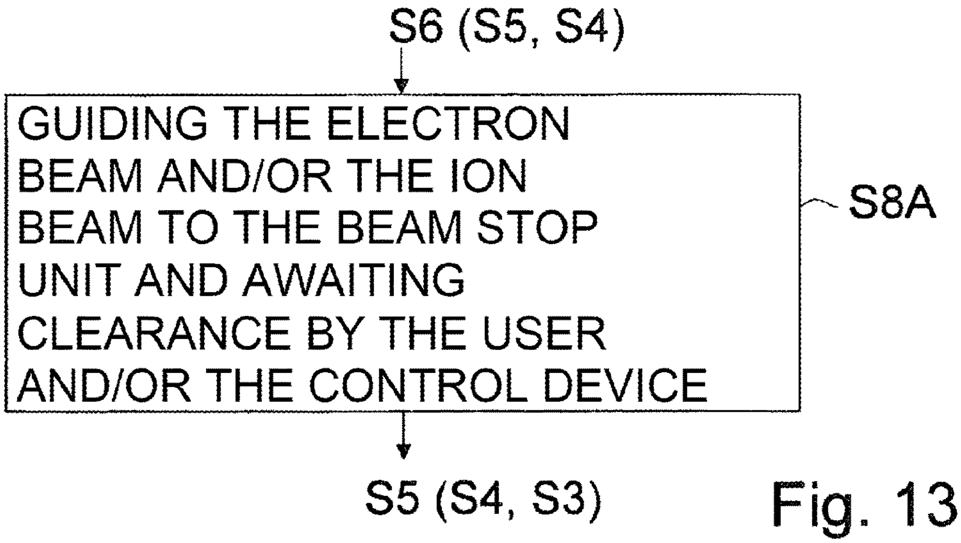
FIG. 13 shows a schematic illustration of a procedure of a sixth embodiment of a method according to the system described herein.

In an embodiment of the method, provision is additionally or alternatively made for the electron beam and/or the ion beam to be guided to the beam stop unit 505 until the user and/or the control device 123 gives the clearance for the guiding of the electron beam and/or the ion beam along the first scan line $RL_1$, along the second scan line $RL_2$, along the third scan line $RL_3$, and/or along the fourth scan line $RL_4$. This is illustrated in FIG. 12, for example. Thus, in particular, provision is made for the electron beam and/or the ion beam to be guided to the beam stop unit 505 after the guidance and/or during the guidance along the first scan line $RL_1$ (method step S3). Then, the clearance by the user and/or by the control device 123 for the guiding of the electron beam and/or the ion beam along the second scan line $RL_2$ is awaited (method step S8). Only then are/is the electron beam and/or the ion beam guided along the second scan line $RL_2$ (method step S4). The same also applies to the further scan lines. The electron beam and/or the ion beam are/is guided to the beam stop unit 505 after the guidance and/or during the guidance along the second scan line $RL_2$ (method step S4). Then, the clearance by the user and/or by the control device 123 for the guiding of the electron beam and/or the ion beam along the third scan line $RL_3$ is awaited (method step S8). Only then are/is the electron beam and/or the ion beam guided along the third scan line $RL_3$ (method step S5). Further, the electron beam and/or the ion beam are/is guided to the beam stop unit 505 after the guidance and/or during the guidance along the third scan line $RL_3$ (method step S5). Then, the clearance by the user and/or by the control device 123 for the guiding of the electron beam and/or the ion beam along the fourth scan line $RL_4$ is awaited (method step S8). Only then are/is the electron beam and/or the ion beam guided along the fourth scan line $RL_4$ (method step S6). FIG. 13 shows a further embodiment of the method. Thus, in particular, provision is made for the electron beam and/or the ion beam to be guided to the beam stop unit 505 after the guidance and/or during the guidance along the fourth scan line $RL_4$ (method step S6). Then, the clearance by the user and/or by the control device 123 for the guiding of the electron beam and/or the ion beam along the third scan line $RL_3$ is awaited (method step S8A). Only then are/is the electron beam and/or the ion beam guided along the third scan line $RL_3$ (method step S5). The same also applies to the further scan lines. The electron beam and/or the ion beam are/is guided to the beam stop unit 505 after the guidance along the third scan line $RL_3$ (method step S5). Then, the clearance by the user and/or by the control device 123 for the guiding of the electron beam and/or the ion beam along the second scan line $RL_2$ is awaited (method step S8A). Only then are/is the electron beam and/or the ion beam guided along the second scan line $RL_2$ (method step S4). Further, the electron beam and/or the ion beam are/is guided to the beam stop unit 505 after the guidance along the second scan line $RL_2$ (method step S4). Then, the clearance by the user and/or by the control device 123 for the guiding of the electron beam and/or the ion beam along the first scan line $RL_1$ is awaited (method step S8A). Only then are/is the electron beam and/or the ion beam guided along the first scan line $RL_1$ (method step S3).

Figure 14:
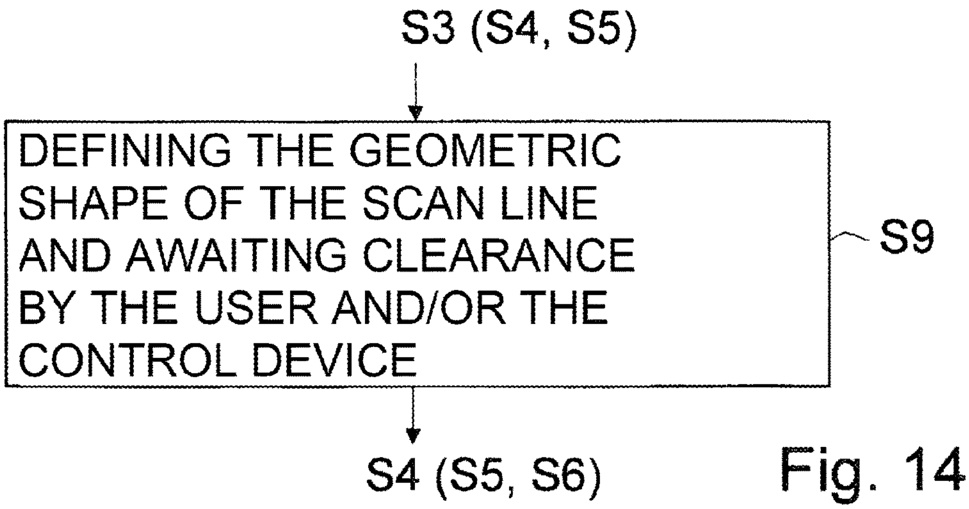
FIG. 14 shows a schematic illustration of a procedure of a seventh embodiment of a method according to the system described herein.
Figure 15:
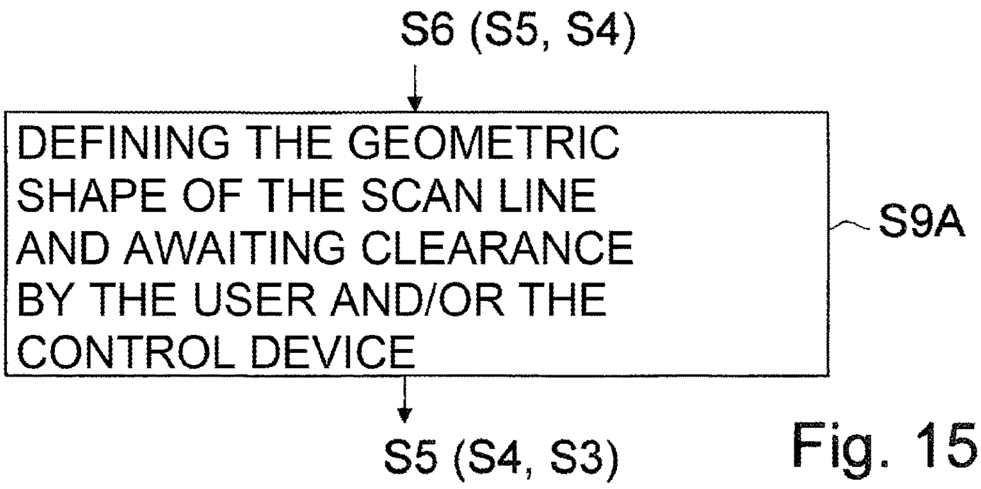
FIG. 15 shows a schematic illustration of a procedure of an eighth embodiment of a method according to the system described herein.

In an embodiment of the method, provision is additionally or alternatively made for the clearance by the user and/or by the control device 123 for the guiding of the electron beam and/or the ion beam along one of the scan lines $RL_1$ to $RL_4$ to be preceded by a definition of the geometric shape of the scan line. This is illustrated in FIG. 14, for example. Thus, in particular, provision is made for the geometric shape of the second scan lines $RL_2$ to be defined after the guidance and/or during the guidance of the electron beam and/or the ion beam along the first scan line $RL_1$ (method step S3). Then, the clearance by the user and/or by the control device 123 is awaited (method step S9). Only then are/is the electron beam and/or the ion beam guided along the second scan line $RL_2$ (method step S4). The same also applies to the further scan lines. The geometric shape of the third scan lines $RL_3$ is defined after the guidance and/or during the guidance of the electron beam and/or the ion beam along the second scan line $RL_2$ (method step S4). Then, the clearance by the user and/or by the control device 123 is awaited (method step S9). Only then are/is the electron beam and/or the ion beam guided along the third scan line $RL_3$ (method step S5). Further, the geometric shape of the fourth scan line $RL_4$ is defined after the guidance and/or during the guidance of the electron beam and/or the ion beam along the third scan line $RL_3$ (method step S5). Then, the clearance by the user and/or by the control device 123 is awaited (method step S9). Only then are/is the electron beam and/or the ion beam guided along the fourth scan line $RL_4$ (method step S6). FIG. 15 shows a further embodiment of the method. Thus, in particular, provision is made for the geometric shape of the third scan line $RL_3$ to be defined after the guidance and/or during the guidance of the electron beam and/or the ion beam along the fourth scan line $RL_4$ (method step S6). Then, the clearance by the user and/or by the control device 123 is awaited (method step S9A). Only after the clearance are/is the electron beam and/or the ion beam guided along the third scan line $RL_3$ (method step S5). The same also applies to the further scan lines. The geometric shape of the second scan line $RL_2$ is defined after the guidance and/or during the guidance of the electron beam and/or the ion beam along the third scan line $RL_3$ (method step S5). Then, the clearance by the user and/or by the control device 123 is awaited (method step S9A). Only after the clearance are/is the electron beam and/or the ion beam guided along the second scan line $RL_2$ (method step S4). Further, the geometric shape of the first scan line $RL_1$ is defined after the guidance and/or during the guidance of the electron beam and/or the ion beam along the second scan line $RL_2$ (method step S4). Then, the clearance by the user and/or by the control device 123 is awaited (method step S9A). Only after the clearance are/is the electron beam and/or the ion beam guided along the first scan line $RL_1$ (method step S3). For example, each of the aforementioned scan lines $RL_1$ to $RL_4$ can have a straight, curved, and/or bent form. In particular, each of the aforementioned scan lines $RL_1$ to $RL_4$ can be in the form of a circle or a polygon. However, the invention is not restricted to such a form of the aforementioned scan lines $RL_1$ to $RL_4$. Rather, any scan line $RL_1$ to $RL_4$ which is suitable for the invention can be used as scan line $RL_1$ to $RL_4$. In particular, provision is made, for at least one of the aforementioned scan lines $RL_1$ to $RL_4$, for the clearance by the user and/or by the control device 123 for the guiding of the electron beam and/or the ion beam along the scan line $RL_1$ to $RL_4$ to be preceded by a definition of the diameter of the geometric shape formed by the scan line $RL_1$ to $RL_4$. Further, provision is made in particular, for at least one of the aforementioned scan lines $RL_1$ to $RL_4$, for the clearance by the user and/or by the control device 123 for the guiding of the electron beam and/or the ion beam along the scan line $RL_1$ to $RL_4$ to be preceded by a definition of the internal spacing between two sides of the geometric shape of the scan line $RL_1$ to $RL_4$.

Figure 16:
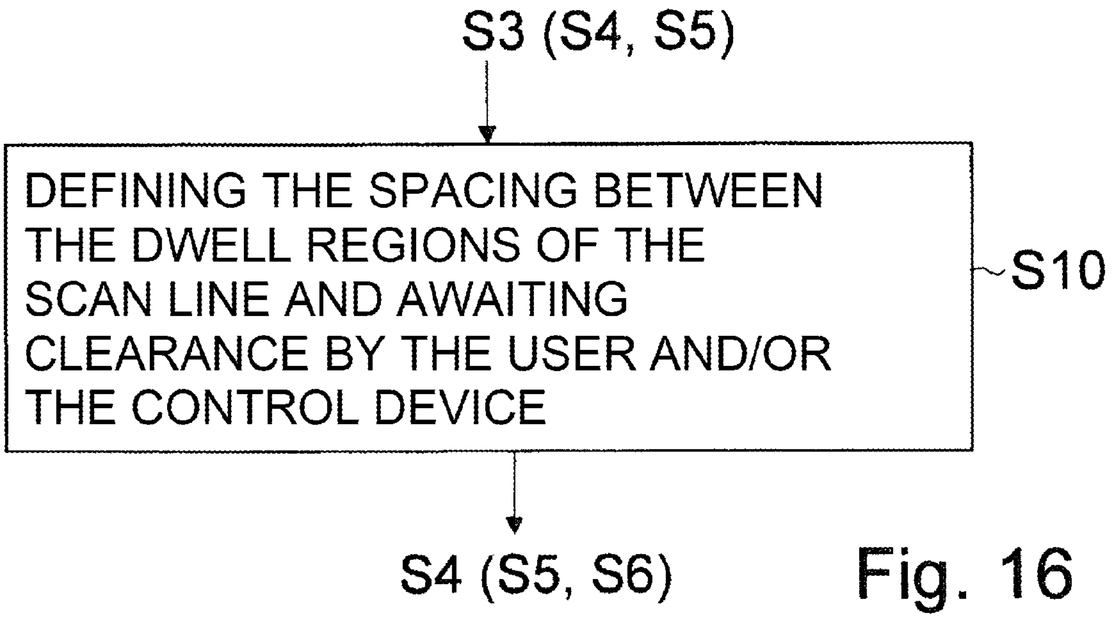
FIG. 16 shows a schematic illustration of a procedure of a ninth embodiment of a method according to the system described herein.
Figure 17:
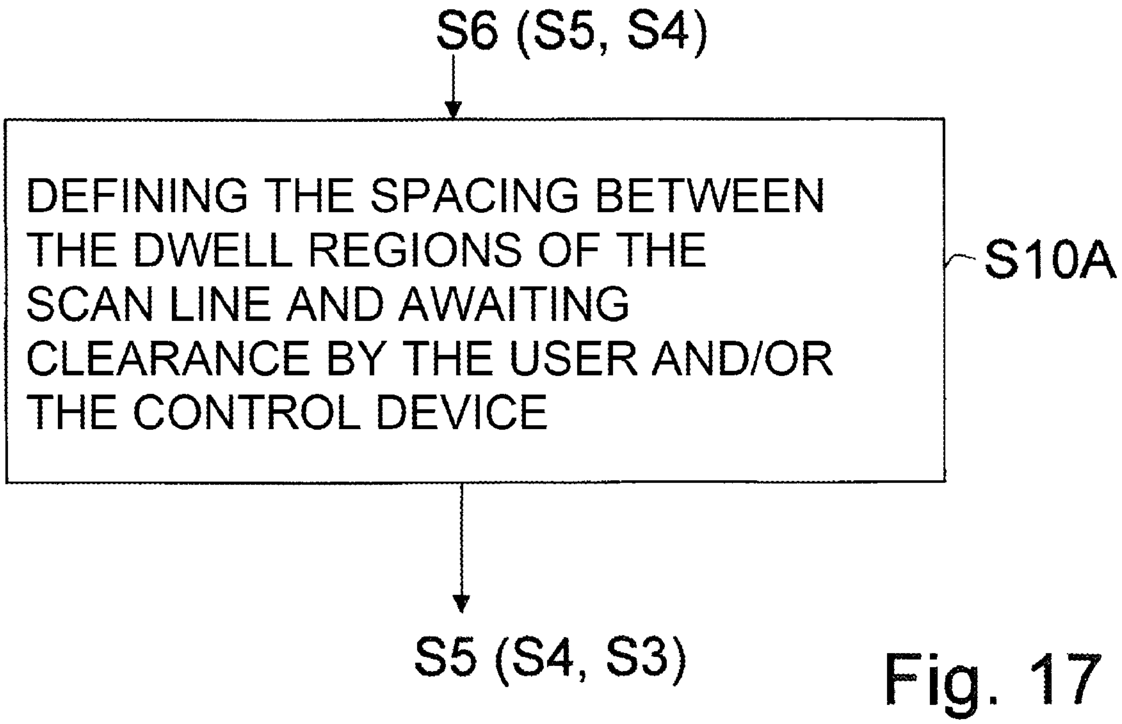
FIG. 17 shows a schematic illustration of a procedure of a tenth embodiment of a method according to the system described herein.

In an embodiment of the method, provision is additionally or alternatively made for the clearance by the user and/or by the control device 123 for the guiding of the electron beam and/or the ion beam along one of the scan lines $RL_1$ to $RL_4$ to be preceded by a definition of the spacing of regions of the dwell regions $VB_1$ to $VB_4$. In other words, the spacing of a first region of the associated dwell region $VB_1$ to $VB_4$ with respect to a closest arranged adjacent second region of the associated dwell region $VB_1$ to $VB_4$ is defined. This is illustrated in FIG. 16. Thus, in particular, provision is made for the second spacing of a first region of the second dwell regions $VB_2$ (for example the dwell region $VB_{21}$) with respect to a closest arranged adjacent second region of the second dwell regions $VB_2$ (for example the dwell region $VB_{22}$) to be defined after the guidance and/or during the guidance of the electron beam and/or the ion beam along the first scan line $RL_1$ (method step S3). Then, the clearance by the user and/or by the control device 123 is awaited (method step S10). Only after the clearance are/is the electron beam and/or the ion beam guided along the second scan line $RL_2$ (method step S4). The same also applies to the further scan lines. The third spacing of a first region of the third dwell regions $VB_3$ (for example the dwell region $VB_{31}$) with respect to a closest arranged adjacent second region of the third dwell regions $VB_3$ (for example the dwell region $VB_{32}$) is defined after the guidance and/or during the guidance of the electron beam and/or the ion beam along the second scan line $RL_2$ (method step S4). Then, the clearance by the user and/or by the control device 123 is awaited (method step S10). Only after the clearance are/is the electron beam and/or the ion beam guided along the third scan line $RL_3$ (method step S5). Further, the fourth spacing of a first region of the fourth dwell regions $VB_4$ (for example the dwell region $VB_{41}$) with respect to a closest arranged adjacent second region of the fourth dwell regions $VB_4$ (for example the dwell region $VB_{42}$) is defined after the guidance and/or during the guidance of the electron beam and/or the ion beam along the third scan line $RL_3$ (method step S5). Then, the clearance by the user and/or by the control device 123 is awaited (method step S10). Only after the clearance are/is the electron beam and/or the ion beam guided along the fourth scan line $RL_4$ (method step S6). Also, for example, provision is made for the first spacing of a first region of the first dwell regions $VB_1$ (for example the dwell region $VB_{11}$) with respect to a closest arranged adjacent second region of the first dwell regions $VB_1$ (for example the dwell region $VB_{12}$) to be defined before the guiding of the electron beam and/or the ion beam along the first scan line $RL_1$ is provided (method step S3). In particular, the clearance by the user and/or by the control device 123 is then awaited. Only after the clearance are/is the electron beam and/or the ion beam guided along the first scan line $RL_1$ (method step S3). FIG. 17 shows a further embodiment of the method. Thus, in particular, provision is made for the third spacing of a first region of the third dwell regions $VB_3$ (for example the dwell region $VB_{31}$) with respect to a closest arranged adjacent second region of the third dwell regions $VB_3$ (for example the dwell region $VB_{32}$) to be defined after the guidance and/or during the guidance of the electron beam and/or the ion beam along the fourth scan line $RL_4$ (method step S6). Then, the clearance by the user and/or by the control device 123 is awaited (method step S10A). Only after the clearance are/is the electron beam and/or the ion beam guided along the third scan line $RL_3$ (method step S5). The same also applies to the further scan lines. The second spacing of a first region of the second dwell regions $VB_2$ (for example the dwell region $VB_{21}$) with respect to a closest arranged adjacent second region of the second dwell regions $VB_2$ (for example the dwell region $VB_{22}$) is defined after the guidance and/or during the guidance of the electron beam and/or the ion beam along the third scan line $RL_3$ (method step S5). Then, the clearance by the user and/or by the control device 123 is awaited (method step S10A). Only after the clearance are/is the electron beam and/or the ion beam guided along the second scan line $RL_2$ (method step S4). Further, the first spacing of a first region of the first dwell regions $VB_1$ (for example the dwell region $VB_{11}$) with respect to a closest arranged adjacent second region of the first dwell regions $VB_1$ (for example the dwell region $VB_{12}$) is defined after the guidance and/or during the guidance of the electron beam and/or the ion beam along the second scan line $RL_2$ (method step S4). Then, the clearance by the user and/or by the control device 123 is awaited (method step S10A). Only after the clearance are/is the electron beam and/or the ion beam guided along the first scan line $RL_1$ (method step S3). Also, for example, provision is made for the first spacing of a first region of the fourth dwell regions $VB_4$ (for example the dwell region $VB_{41}$) with respect to a closest arranged adjacent second region of the fourth dwell regions $VB_4$ (for example the dwell region $VB_{42}$) to be defined before the guiding of the electron beam and/or the ion beam along the fourth scan line $RL_4$ is provided (method step S6). In particular, the clearance by the user and/or by the control device 123 is then awaited. Only after the clearance are/is the electron beam and/or the ion beam guided along the fourth scan line $RL_4$ (method step S6).

Again, explicit reference is made to the fact that the invention is not restricted to the described sequence of the method steps. Rather, the method steps of the invention can be carried out in any suitable sequence and/or also in parallel with one another.

The features of the invention that are disclosed in the present description, in the drawings and in the claims may be essential for the implementation of the invention in various embodiments of the invention both individually and in any desired combinations. The invention is not restricted to the described embodiments. The invention can be varied within the scope of the claims and taking into account the knowledge of those skilled in the relevant art.

The invention claimed is:

1. A method for operating a particle beam apparatus, comprising:

determining a region of interest of the object using a control device of the particle beam apparatus;

determining a scanned region of the object using the control device of the particle beam apparatus, the scanned region including the region of interest, the scanned region having at least one first scan line and at least one second scan line, the first scan line forming a first geometric shape, the second scan line forming a second geometric shape, the first scan line having first dwell regions for a particle beam of the particle beam apparatus, the second scan line having second dwell regions for the particle beam of the particle beam apparatus, and each of the second dwell regions of the second scan line being arranged closer to the region of interest than each of the first dwell regions of the first scan line;

guiding the particle beam along the first scan line and along the first dwell regions using the particle beam apparatus; and guiding the particle beam along the second scan line and along the second dwell regions using the particle beam apparatus, wherein the particle beam remains at a first dwell time at each of the first dwell regions when guiding the particle beam along the first dwell regions of the first scan line and the particle beam remains a second dwell time at each of the second dwell regions when guiding the particle beam along the second dwell regions of the second scan line, the first dwell time being chosen to be shorter than the second dwell time using the control device or wherein a first region of the first dwell regions, when guiding the particle beam along the first dwell regions of the first scan line, is chosen in such a way that the first region of the first dwell regions has a first spacing with respect to a closest arranged adjacent second region of the first dwell regions and a first region of the second dwell regions, when guiding the particle beam along the second dwell regions of the second scan line, is chosen in such a way that the first region of the second dwell regions has a second spacing with respect to a closest arranged adjacent second region of the second dwell regions, the second spacing being smaller than the first spacing.

2. The method as claimed in claim 1, further comprising:

the particle beam interacting with the material of the object when guiding the particle beam along the first scan line and along the first dwell regions using the particle beam apparatus, wherein first interaction particles and/or a first interaction radiation arise/arises, the first interaction particles and/or the first interaction radiation being detected using a detector;

the particle beam interacting with the material of the object when guiding the particle beam along the second scan line and along the second dwell regions using the particle beam apparatus, wherein second interaction particles and/or a second interaction radiation arise/arises, with the second interaction particles and/or the second interaction radiation being detected using the detector; and processing the object using the particle beam and/or imaging and/or analyzing the object using the first interaction particles, the first interaction radiation, the second interaction particles, and/or the second interaction radiation.

3. The method as claimed in claim 1, further comprising one of the following:

guiding the particle beam along the first scan line and then subsequently guiding the particle beam along the second scan line; and/or guiding the particle beam along the second scan line and then subsequently guiding the particle beam along the first scan line.

4. The method as claimed in claim 1, further comprising at least one of the following:

determining a center of the scanned region as the region of interest;

determining a midpoint of the scanned region as the region of interest; and/or determining a centroid of the scanned region as the region of interest.

5. The method as claimed in claim 1, wherein the region of interest of the object is determined by the particle beam apparatus using the control device and specified data about the object, and/or by using the control device and a specified model of the object, and/or by using the control device and a non-destructive examination, and/or by using the control device and an x-ray device, and/or by using the control device and an ultrasound device, and/or by using the control device and a lock-in thermography device.

6. The method as claimed claim 1, wherein the first scan line is formed as a first circle and/or wherein the second scan line is formed as a second circle and/or wherein the first scan line is formed as a first polygon and/or wherein the second scan line is formed as a second polygon and/or wherein dwell regions of the first dwell region are formed as one of: a point, a circle, or a polygon and/or wherein dwell regions of the second dwell region are formed as one of: a point, a circle, or a polygon.

7. The method as claimed in claim 1, wherein the first dwell regions include dwell regions having a first region spacing from the region of interest, wherein the second dwell regions include dwell regions having a second region spacing from the region of interest, and wherein the first region spacing is greater than the second region spacing.

8. The method as claimed in claim 7, wherein if the first scan line is formed as a circle, the first region spacing is chosen such that the first region spacing forms the radius of the circle; and/or wherein if the second scan line is formed as a circle, the second region spacing is chosen such that the second region spacing forms the radius of the circle.

9. The method as claimed in claim 1, wherein an analysis regarding the object and/or an image of the object is/are displayed on a display unit of the particle beam apparatus.

10. The method as claimed in claim 1, further comprising at least one of the following:

using as the first dwell time at each dwell region of the first dwell regions a dwell time, which lies in a range from 1 ns to 5 s;

using as the second dwell time at each dwell region of the second dwell regions a dwell time, which lies in a range from 1 ns to 5 s;

using as the second dwell time at each dwell region of the second dwell regions a dwell time to which the following applies:

$$t_2 = \frac{d_1}{d_2} \cdot t_1$$

where $t_1$ denotes the first dwell time at each dwell region of the first dwell regions, $t_2$ denotes the second dwell time at each dwell region of the second dwell regions, $d_1$ denotes a first diameter of the first geometric shape formed by the first scan line and $d_2$ denotes a second diameter of the second geometric shape formed by the second scan line;

using as the second dwell time at each dwell region of the second dwell regions a dwell time to which the following applies:

$$t_2 = \frac{IA_1}{IA_2} \cdot t_1$$

where $t_1$ denotes the first dwell time at each dwell region of the first dwell regions, $t_2$ denotes the second dwell time at each dwell region of the second dwell regions, $IA_1$ denotes a first internal spacing between two opposite sides of the first geometric shape formed by the first scan line and $IA_2$ denotes a second internal spacing between two opposite sides of the second geometric shape formed by the second scan line; and/or using as the second dwell time at each dwell region of the second dwell regions a dwell time to which the following applies:

$$t_2 = \frac{L_1}{L_2} \cdot t_1$$

where $t_1$ denotes the first dwell time at each dwell region of the first dwell regions, $t_2$ denotes the second dwell time at each dwell region of the second dwell regions, $L_1$ denotes a first length of the first geometric shape formed by the first scan line and $L_2$ denotes a second length of the second geometric shape formed by the second scan line.

11. The method as claimed in claim 1, further comprising at least one of the following:

using as the first spacing a spacing of less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm; and/or using as the second spacing a spacing of less than or equal to 10 μm, less than or equal to 1 μm, less than or equal to 500 nm, less than or equal to 200 nm, less than or equal to 100 nm, less than or equal to 50 nm, less than or equal to 20 nm, less than or equal to 10 nm, or less than or equal to 1 nm.

12. The method as claimed in claim 1, further comprising at least one of the following:

guiding the particle beam along the first scan line until clearance for guiding the particle beam along the second scan line is given by the user and/or by the control device;

guiding the particle beam along the second scan line until the clearance for guiding the particle beam along the first scan line is given by the user and/or by the control device;

guiding the particle beam to a beam stop unit until the clearance for guiding the particle beam along the second scan line is given by the user and/or by the control device;

guiding the particle beam to the beam stop unit until the clearance for guiding the particle beam along the first scan line is given by the user and/or by the control device;

defining the second scan line with respect to the second geometric shape formed by the second scan line before the clearance for guiding the particle beam along the second scan line is given by the user and/or by the control device;

defining the first scan line with respect to the first geometric shape formed by the first scan line before the clearance for guiding the particle beam along the first scan line is given by the user and/or by the control device;

defining the second scan line with respect to a diameter of the second geometric shape formed by the second scan line before the clearance for guiding the particle beam along the second scan line is given by the user and/or by the control device;

defining the first scan line with respect to a diameter of the first geometric shape formed by the first scan line before the clearance for guiding the particle beam along the first scan line is given by the user and/or by the control device;

defining the second scan line with respect to internal spacing between two sides of the second geometric shape formed by the second scan line before the clearance for guiding the particle beam along the second scan line is given by the user and/or by the control device;

defining the first scan line with respect to internal spacing between two sides of the first geometric shape formed by the first scan line before the clearance for guiding the particle beam along the first scan line is given by the user and/or by the control device;

defining the second scan line with respect to the second spacing before the clearance for guiding the particle beam along the second scan line is given by the user and/or by the control device; and/or defining the first scan line with respect to the first spacing before the clearance for guiding the particle beam along the first scan line is given by the user and/or by the control device.

13. The method as claimed in claim 1, wherein the particle beam apparatus is an ion beam apparatus and wherein an ion beam of the ion beam apparatus is used to ablate material from the object and/or to apply material to the object and/or to analyze the object and/or to image the object.

14. The method as claimed in claim 1, wherein the particle beam apparatus is an electron beam apparatus and wherein an electron beam of the electron beam apparatus is used to ablate the material from the object and/or to analyze the object and/or to image the object.

15. The method as claimed in claim 1, wherein guiding the particle beam along the first scan line and/or the second scan line is provided only after clearance has been given by a user and/or by the control device of the particle beam apparatus.

16. The method as claimed in claim 1, wherein at least some of the scan lines are circular or polygonal.

17. A method for operating a particle beam apparatus, comprising:

determining a region of interest of the object using a control device of the particle beam apparatus;

determining a scanned region of the object using the control device of the particle beam apparatus, the scanned region including the region of interest, the scanned region including at least one first scan line, at least one second scan line, and at least one third scan line, the first scan line forming a first geometric shape, the second scan line forming a second geometric shape, the third scan line forming a third geometric shape, the first scan line having first dwell regions for a particle beam of the particle beam apparatus, the second scan line having second dwell regions for the particle beam of the particle beam apparatus, the third scan line having third dwell regions for the particle beam of the particle beam apparatus, each of the third dwell regions of the third scan line being arranged closer to the region of interest than each of the second dwell regions of the second scan line, and each of the second dwell regions of the second scan line being arranged closer to the region of interest than each of the first dwell regions of the first scan line;

guiding the particle beam along the first scan line and along the first dwell regions using the particle beam apparatus;

guiding the particle beam along the second scan line and along the second dwell regions using the particle beam apparatus; and guiding the particle beam along the third scan line and along the third dwell regions using the particle beam apparatus, wherein initially the particle beam is guided along the first scan line and remains a first dwell time at each of the first dwell regions, subsequently the particle beam is guided along the second scan line and remains a second dwell time at each of the second dwell regions, subsequently the particle beam is guided along the third scan line and remains a third dwell time at each of the third dwell regions, the first dwell time, the second dwell time, and the third dwell time being chosen to be identical using the control device, guiding the particle beam along the second scan line being provided upon or after elapse of a first time interval that follows guiding the particle beam along the first scan line, the first time interval being specified by the control device, guiding the particle beam along the third scan line being provided upon or after elapse of a second time interval that follows guiding the particle beam along the second scan line, the second time interval being specified by the control device, and the first time interval being shorter than the second time interval or wherein initially the particle beam is guided along the third scan line and remains a third dwell time at each of the third dwell regions, subsequently the particle beam is guided along the second scan line and remains a second dwell time at each of the second dwell regions, subsequently the particle beam is guided along the first scan line and remains a first dwell time at each of the first dwell regions, the first dwell time, the second dwell time, and the third dwell time being chosen to be identical using the control device, guiding the particle beam along the second scan line being provided upon or after elapse of a first time interval that follows guiding the particle beam along the third scan line, the first time interval being specified by the control device, guiding the particle beam along the first scan line being provided upon or after elapse of a second time interval that follows guiding the particle beam along the second scan line, the second time interval being specified by the control device, and the first time interval being longer than the second time interval, or wherein initially the particle beam is guided along the first scan line, the particle beam subsequently being guided along the second scan line and then the particle beam being guided along the third scan line, a first region of the first dwell regions being chosen such that the first region of the first dwell regions has a first spacing with respect to a closest arranged adjacent second region of the first dwell regions, a first region of the second dwell regions being chosen such that the first region of the second dwell regions has a second spacing with respect to a closest arranged adjacent second region of the second dwell regions, a first region of the third dwell regions being chosen such that the first region of the third dwell regions has a third spacing with respect to a closest arranged adjacent second region of the third dwell regions, the first spacing, the second spacing, and the third spacing being chosen to be identical using the control device, guiding the particle beam along the second scan line being provided upon or after elapse of a first time interval that follows guiding the particle beam along the first scan line, the first time interval being specified by the control device, guiding the particle beam along the third scan line being provided upon or after elapse of a second time interval that follows guiding the particle beam along the second scan line, the second time interval being specified by the control device, and the first time interval being shorter than the second time interval or wherein initially the particle beam is guided along the third scan line the particle beam subsequently being guided along the second scan line and then being guided along the first scan line, a first region of the first dwell regions being chosen such that the first region of the first dwell regions has a first spacing with respect to a closest arranged adjacent second region of the first dwell regions, a first region of the second dwell regions being chosen such that the first region of the second dwell regions has a second spacing with respect to a closest arranged adjacent second region of the second dwell regions, a first region of the third dwell regions being chosen such that the first region of the third dwell regions has a third spacing with respect to a closest arranged adjacent second region of the third dwell regions, the first spacing, the second spacing, and the third spacing being chosen to be identical using the control device, guiding the particle beam along the second scan line being provided upon or after elapse of a first time interval that follows guiding the particle beam along the third scan line, the first time interval being specified by the control device, guiding the particle beam along the first scan line being provided upon or after elapse of a second time interval that follows guiding the particle beam along the second scan line, the second time interval being specified by the control device, and the first time interval being longer than the second time interval.

18. The method as claimed in claim 17, further comprising:

the particle beam interacting with the material of the object when guiding the particle beam along the first scan line and along the first dwell regions using the particle beam apparatus, wherein first interaction particles and/or a first interaction radiation arise/arises, the first interaction particles and/or the first interaction radiation being detected using a detector;

the particle beam interacting with the material of the object when guiding the particle beam along the second scan line and along the second dwell regions using the particle beam apparatus, wherein second interaction particles and/or a second interaction radiation arise/arises, the second interaction particles and/or the second interaction radiation being detected using the detector;

the particle beam interacting with the material of the object when guiding the particle beam along the third scan line and along the third dwell regions using the particle beam apparatus, wherein third interaction particles and/or a third interaction radiation arise/arises, the third interaction particles and/or the third interaction radiation being detected using the detector; and processing the object using the particle beam and/or imaging and/or analyzing the object using the first interaction particles, the first interaction radiation, the second interaction particles, the second interaction radiation, the third interaction particles, and/or the third interaction radiation.

19. The method as claimed in claim 17, wherein guiding the particle beam along the first scan line, the second scan line, and/or the third scan line is provided only after clearance has been given by a user and/or by the control device of the particle beam apparatus.

20. The method as claimed in claim 17, wherein the third scan line is formed as a third circle and/or wherein the third scan line is formed as a third polygon and/or wherein dwell regions of the third dwell region are formed as one of: a point, a circle, or a polygon.

21. A non-transitory computer readable medium that includes program code which is loadable into a processor and which, when executed, controls a particle beam apparatus to perform the following:

determining a region of interest of the object using a control device of the particle beam apparatus;

determining a scanned region of the object using the control device of the particle beam apparatus, the scanned region including the region of interest, the scanned region having at least one first scan line and at least one second scan line, the first scan line forming a first geometric shape, the second scan line forming a second geometric shape, the first scan line having first dwell regions for a particle beam of the particle beam apparatus, the second scan line having second dwell regions for the particle beam of the particle beam apparatus, and each of the second dwell regions of the second scan line being arranged closer to the region of interest than each of the first dwell regions of the first scan line;

guiding the particle beam along the first scan line and along the first dwell regions using the particle beam apparatus; and guiding the particle beam along the second scan line and along the second dwell regions using the particle beam apparatus, wherein the particle beam remains at a first dwell time at each of the first dwell regions when guiding the particle beam along the first dwell regions of the first scan line and the particle beam remains a second dwell time at each of the second dwell regions when guiding the particle beam along the second dwell regions of the second scan line, the first dwell time being chosen to be shorter than the second dwell time using the control device or wherein a first region of the first dwell regions, when guiding the particle beam along the first dwell regions of the first scan line, is chosen in such a way that the first region of the first dwell regions has a first spacing with respect to a closest arranged adjacent second region of the first dwell regions and a first region of the second dwell regions, when guiding the particle beam along the second dwell regions of the second scan line, is chosen in such a way that the first region of the second dwell regions has a second spacing with respect to a closest arranged adjacent second region of the second dwell regions, the second spacing being smaller than the first spacing.

22. A particle beam apparatus, comprising:

at least one control device that determines a region of interest of an object;

at least one first beam generator that generates a first particle beam that includes first charged particles;

at least one first objective lens that focuses the particle beam on the object;

at least one scanning device that scans the first particle beam over the object; and at least one processor coupled to a non-transitory computer readable medium that includes computer program code which, when executed by the processor, performs the following:

determining a region of interest of the object using a control device of the particle beam apparatus;

determining a scanned region of the object using the control device of the particle beam apparatus, the scanned region including the region of interest, the scanned region having at least one first scan line and at least one second scan line, the first scan line forming a first geometric shape, the second scan line forming a second geometric shape, the first scan line having first dwell regions for the first particle beam of the particle beam apparatus, the second scan line having second dwell regions for the first particle beam of the particle beam apparatus, and each of the second dwell regions of the second scan line being arranged closer to the region of interest than each of the first dwell regions of the first scan line;

guiding the first particle beam along the first scan line and along the first dwell regions using the particle beam apparatus; and guiding the first particle beam along the second scan line and along the second dwell regions using the particle beam apparatus, wherein the first particle beam remains at a first dwell time at each of the first dwell regions when guiding the first particle beam along the first dwell regions of the first scan line and the first particle beam remains a second dwell time at each of the second dwell regions when guiding the first particle beam along the second dwell regions of the second scan line, the first dwell time being chosen to be shorter than the second dwell time using the control device or wherein a first region of the first dwell regions, when guiding the first particle beam along the first dwell regions of the first scan line, is chosen in such a way that the first region of the first dwell regions has a first spacing with respect to a closest arranged adjacent second region of the first dwell regions and a first region of the second dwell regions, when guiding the first particle beam along the second dwell regions of the second scan line, is chosen in such a way that the first region of the second dwell regions has a second spacing with respect to a closest arranged adjacent second region of the second dwell regions, the second spacing being smaller than the first spacing.

23. The particle beam apparatus as claimed in claim 22, further comprising:

at least one detector that detects interaction particles and/or an interaction radiation resulting from an interaction of the first particle beam with the object; and at least one display device that displays an image and/or an analysis of the object.

24. The particle beam apparatus as claimed in claim 22, further comprising:

at least one second beam generator that generates a second particle beam that includes second charged particles; and at least one second objective lens that focuses the second particle beam on the object.

25. The particle beam apparatus as claimed in claim 22, wherein the particle beam apparatus is an electron beam apparatus and/or an ion beam apparatus.

* * * * *